United States Patent [19]

Itakura et al.

[11] Patent Number: 5,471,171
[45] Date of Patent: Nov. 28, 1995

[54] AMPLIFIER DEVICE CAPABLE OF REALIZING HIGH SLEW RATE WITH LOW POWER CONSUMPTION

[75] Inventors: Tetsuro Itakura, Fujisawa; Hiroshi Tanimoto, Kawasaki, both of Japan

[73] Assignee: Kabushiki Kaisha Toshiba, Kawasaki, Japan

[21] Appl. No.: 45,537

[22] Filed: Apr. 9, 1993

Related U.S. Application Data

[63] Continuation-in-part of Ser. No. 774,184, Oct. 9, 1991, abandoned.

[30] Foreign Application Priority Data

| Oct. 9, 1990 | [JP] | Japan | 2-271392 |
| Jul. 25, 1991 | [JP] | Japan | 3-208564 |
| Aug. 7, 1992 | [JP] | Japan | 4-211088 |

[51] Int. Cl.$^6$ .................................................. H03F 3/45
[52] U.S. Cl. .............................................. 330/253; 330/261
[58] Field of Search .................................... 330/253, 257, 330/261, 296

[56] References Cited

U.S. PATENT DOCUMENTS

| 4,383,223 | 5/1983 | Ulmer | 330/253 |
| 4,471,321 | 9/1984 | Bowers | 330/261 |
| 4,730,168 | 3/1988 | Senderowicz | 330/253 |
| 4,881,045 | 11/1989 | Dillman | 330/253 |

OTHER PUBLICATIONS

"Analog MOS Integrated Circuits For Signal Processing", Roubik Gregorian et al., John Wiley & Sons 1986, pp. 257 (final paragraph) to 259.

*Primary Examiner*—Steven Mottola
*Assistant Examiner*—Tiep H. Nguyen
*Attorney, Agent, or Firm*—Foley & Lardner

[57] ABSTRACT

An amplifier device capable of performing an efficient amplifying operation with a low power consumption includes an amplifier circuit at least having an input amplifier stage which amplifies a level change of an input signal to output an amplified current, and an output stage which outputs the amplified current as a driving output to a capacitive load; a primary bias circuit for ordinarily supplying a constant and main bias current to the amplifier circuit; a determination element for determining a change condition of the level change of the input signal, which is supplied from the input amplifier stage, so as to generate a control signal corresponding to said change condition; and a driving capability increase element as a secondary bias circuit for increasing a bias current in order to increase the driving output supplied to the capacitive load when the control signal is input.

14 Claims, 43 Drawing Sheets

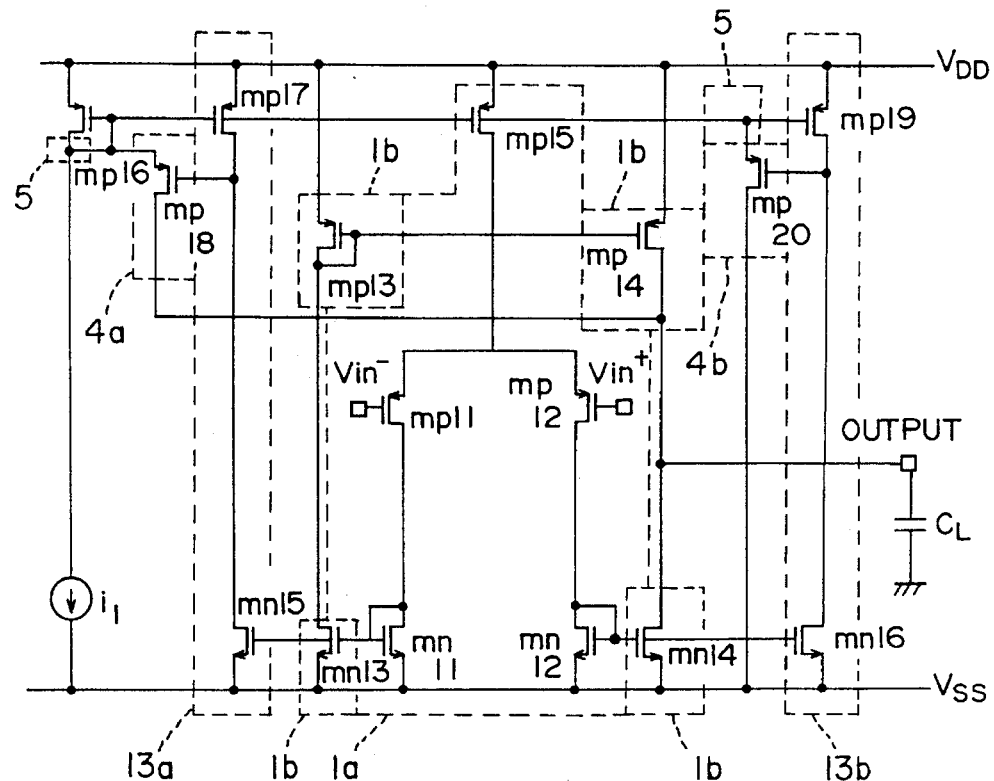
F I G. 61
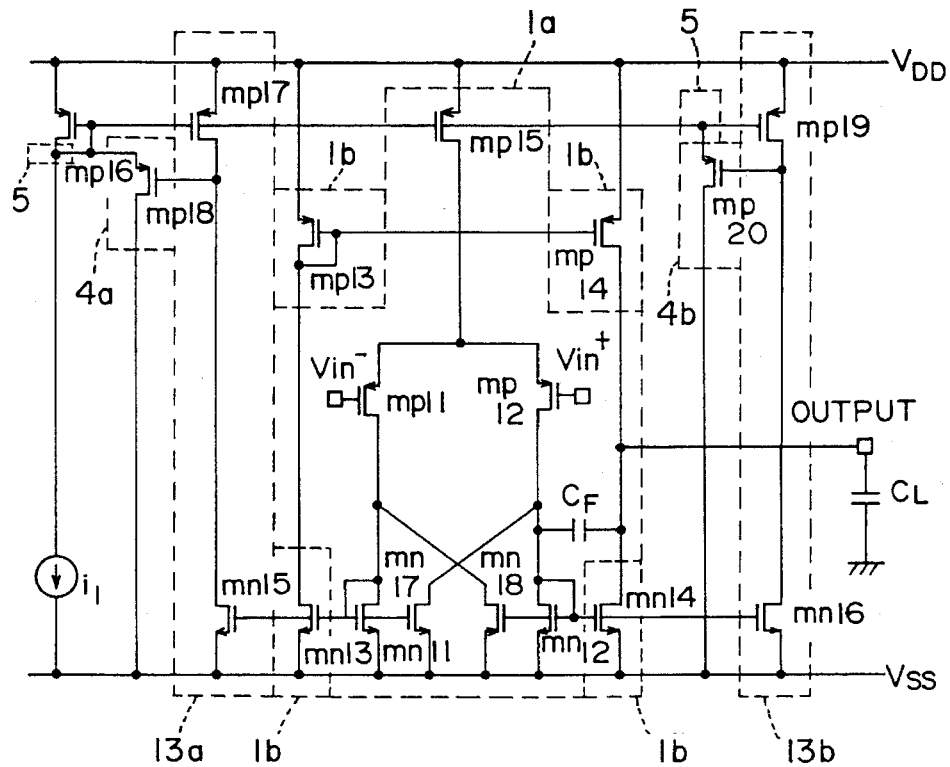
F I G. 62

AMPLIFIER DEVICE CAPABLE OF REALIZING HIGH SLEW RATE WITH LOW POWER CONSUMPTION

The present application is a continuation in part (CIP) application of U.S. Ser. No. 07/774,184 (filed on Oct. 9, 1991) and now abandoned.

BACKGROUND OF THE INVENTION

The present invention relates to an amplifier device capable of performing an efficient amplifying operation even by a low power consumption, and more particularly to an amplifier device for driving capacitive load such as an image display using a liquid crystal panel.

For an amplifier, the slew rate is one of significant factors determining the performance of the circuit. Namely, it is very important to provide a high slew rate for an amplifier. While the slew rate can be improved by increasing a bias current delivered to the amplifier stage, the power consumption increases accordingly if a bias current is caused to be increased. Thus, various attempts have been conventionally made in order to solve this problem.

For the amplifier for driving a capacitive load etc., there are two kinds of amplifiers: one is directed to a signal sampled in time and subject to level changes every a fixed period in a switched capacitor network etc.; the other is directed to a signal completely non-periodically subject to level changes.

For the prior art related to the amplifier of the former type, on pp. 257 (final paragraph) to 259 of 'Analog MOS Integrated circuits for Signal Processing', Rubik Gregorian, et al., John Wiley & Sons 1986, the operation of an operational amplifier having clock controlled bias means is described and the circuit diagrams thereof are shown in FIG. 4.129 and FIG. 4.130.

In these conventional circuits, an approach is employed to control the bias current so that the output current driving capability is high at the beginning of the clock period and the operating current is equal to zero at the end of the clock period to increase the output current driving capability only when high response is required because there occurs in the signal level, and to allow the operating current to be equal to zero there is no change in the signal level, thus to advantageously provide the high slew rate and low power consumption.

However, the fact that the operating current is equal to zero when there is no change in the signal level implies that the output is in a high impedance state. Therefore, such conventional circuits are disadvantageously apt to undergo the influence of disturbance on the load side when the output level is in a high impedance state.

To avoid this drawback, there is proposed in U.S. Pat. No. 4,502,019 a system in which a constant current source is added to allow a small quantity of current to flow even when there is no change in the level of an input signal, thus preventing the output level from being brought into a high impedance state.

Further, as an example of the conventional amplifiers similar to the above-mentioned prior art, there is known an amplifier shown in FIG. 1. This amplifier is provided for delivering a drive power to a liquid crystal panel 20 as a capacitive load, and includes a buffer section of the voltage follower type sing first and second amplifier circuits 21 and 22. The liquid crystal panel 20 comprises a liquid crystal cell LC as a capacitive load, a MOS type transistor TFT, and a capacitor C100 of a signal line having a value of 40–200 pF. Further, the amplifier comprises two switches SWc and SWd turned ON and OFF by an INH signal, and a capacitance. In addition, the above-mentioned amplifier circuit 22 is comprised of a very small current source IO and a MOS type transistor M220.

The operation of the amplifier shown in FIG. 1 will now be described. Immediately before an input signal shown in FIG. 2(c) varies, the switches SWa and SWb are closed by an INH signal (see FIG. 2(b)). As a result, The input terminal voltage and the output terminal voltage are once reset to $V_{DD}$ (FIG. 2(d)). Then, the switches SWa and SWb are opened by the INH signal in correspondence with the timing at which the input signal varies. Thus, the buffer section (amplifier circuit 21 and 22) is normally caused to be operative.

As described above, when the input and output terminal voltages are both once reset to $V_{DD}$, the output voltage is dropped from $V_{DD}$ to a voltage following the input voltage, and is stabilized thereat. The slew rate at this time is determined by the phase compensation capacitance C101 and the output current of the first amplifier circuit 21. The reason therefor is that a sink current of the output transistor M220 of the second amplifier circuit 22 is determined by the gate voltage of the transistor M220. Accordingly, settling time required until the output voltage is brought into a stable state following the input can be shortened.

If the output voltage is not reset to $V_{DD}$, the change in falling of the output voltage is the same as stated above, but the change in rising of the output voltage becomes in dependence upon any slow of the slew rate determined by the phase compensation capacitance C101 and the output current of the first amplifier circuit and the slew rate determined by the current source IO of the second amplifier circuit 22 and the capacitance of a load connected to the output side of the current source IO. In order to allow the slew rate determined by the current source IO and the load capacitance to be high, it is required to set in advance the current of the current source IO. However, once the output is stabilized, all the currents from the current source IO flow into the output transistor M220, and is uselessly consumed.

However, in accordance with the amplifier of FIG. 1, an instantaneous current flowing on the $V_{DD}$ line when the switches SWa and SWb are closed by the INH signal becomes extremely large. In IC for driving a liquid display panel including a large number of buffer sections constructed as above, the power supply voltage undergoes the influence such as voltage drop, etc. based on the resistance component of the $V_{DD}$ line by that large instantaneous current, resulting in bad influence on the circuit of the amplifier. This is not preferable in view of insurance of reliability.

Even if a circuit device is made as in the device disclosed above, in uses where many amplifiers are mounted on one chip to provide outputs at the same timing, e.g., as in a drive IC of a liquid crystal display, there results an impulse like noise by the voltage drop of the power supply line inside and outside IC, etc. because of a large instantaneous current at the beginning of the clock period, resulting in an erroneous operation or deterioration in reliability due to migration on the power supply line, etc. inside IC. This is disadvantageous to implementation of IC.

For the buffer circuit directed to a signal completely non-periodically subject to level changes, there have been conventionally proposed, with a view to reducing a current consumption, a circuit (a second prior art) shown in FIG. 3 of 'Class AB CMOS Operational Amplifier with Very High Efficiency', L, Callewaert, Katholieke Univesiteit Leuven, Elec. Eng. Dept. Annual Report-1188, a circuit (a third prior art) shown in FIG. 1 of 'Low-Power High-Drive CMOS Operational AMPLIFIER', V. R., Saari, IE3 ISSC vol. SC-18, No. 1, Feb., 1983, a circuit (a fourth prior art) shown in FIG. 3 of 'Adaptive Biasing CMOS Amplifiers', Degrauweel IZE 3 JSSC vol. SC-17, No. 3 June 1982, and the like.

FIG. 3 shows a circuit according to the fourth prior art described above.

The circuit additionally comprises current differential circuits (shown by M11–M22 in the figure) which detect a current difference between differential current outputs (I1, I2) of an input differential amplifier circuit, and multiply the current difference by a constant (shown by "A:1" in the figure), thereby increasing a bias current of the input differential amplifier circuit. When the circuits M11–M22 input only a differential input signal, they improve a drive capability of an output current. However, since the current differential circuit M11–M22 detect the current difference between the differential current outputs, the circuits have the problem that many elements are necessary to construct the circuits. Further, it is necessary to increase a ratio of the constant of "A:1" of the current difference for becoming higher of the slew rate of the amplifier and for shortening a warming-up time of the output. However, since such a necessity makes an area of transistors larger, it results the problem that an area shared in the circuit per unit area becomes larger.

Next, FIG. 4 shows a fifth prior art corresponding to a circuit shown in FIG. 5 of 'Class AB CMOS Operational Amplifier with Very High Efficiency', L. Callewaert et al., IEEE JSSC. vol. -25, June 1990.

The circuit comprises a first input differential amplifier circuit (shown by #1 in the figure) for increasing an operational current when a plus side (shown by in+ in the figure) of the differential input signal is high, and a second input differential amplifier circuit (shown by #2 in the figure) for increasing an operational current when a minus side (shown by in– in the figure) of the differential input signal is high. By this circuit, a drive capability of the amplifier is caused to be high only when the differential input signal is supplied, thereby reducing a power consumption when the differential input signal is not supplied. However, since both the circuits #1 and #2 are necessary to reduce the power consumption, the circuit shown in FIG. 4 has the problem that a circuit scale of the entire amplifier becomes large.

These conventional circuits are adapted to control the operating current in the circuit by the magnitude of the differential input amplitude or the magnitude of the differential input amplitude in the amplifier. Namely, when the differential input amplitude is large, the output current driving capability is caused to be increased, while when the differential input is small, the driving capability us caused to be decreased. Then, the power consumption is reduced.

However, in the case of the first, third and fourth prior arts, the number of elements is considerably increased, resulting in large circuit scale. This is also disadvantageous to implementation of IC. Further, in the second prior art, because the number of capacitors is large, a large area is required when the circuit is constructed as IC. This is also disadvantageous to implementation of IC.

As stated above, while the conventional amplifier can provide a high slew rate at a low power consumption, they have the circuit configuration disadvantageous to implementation of IC.

SUMMARY OF THE INVENTION

This invention has been made in view of the above-mentioned problems with the prior arts and its principle object is to provide an amplifier device capable of providing a high slew rate by low power consumption without increasing circuit elements in comparison with the conventional amplifier.

In order to achieve the above-mentioned object, an amplifier device according to the present invention comprises amplifier circuit means including an input amplifier stage and an output stage, amplification means for amplifying an output from the input amplify means of the amplifier circuit means to output a voltage, voltage-current conversion means for converting the voltage output from the amplification means into a current, bias means for outputting a bias current having a fixed value, and current addition means for adding the current output from the current conversion means with the bias current and for supplying an additional result to the amplifier circuit means; and has characteristics that an output current value from the amplifier circuit means is controlled by a current value which is supplied from the current addition means to the amplifier circuit means.

Further, an amplifier according to the present invention and having an input amplifying stage and an output stage, comprises amplification means for amplifying a signal output from the input amplifier stage when a signal is supplied to the input amplifier stage, current output means for outputting a current corresponding to an output of the amplification means, bias means for outputting a bias current having a fixed value, and addition means for adding an output from current output means and the bias current output from the bias means; and has characteristics that, when the signal is supplied to the input amplifying stage, an increase of the output current from the addition means causes a drive capability of the output current from the output stage to be higher.

In the above-constructed amplifier according to the present invention, when the signal is supplied to the amplifier circuit means, the output of the input amplifying stage is amplified by the amplification means so as to detect level changes of the input signal. When the level changes are detected, the voltage-current conversion means converts the input signal into the current output. Since the bias means supplies the bias current to the amplifier circuit means, the addition means adds, with the bias current, the current which is output from the amplification means and the voltage-current conversion means when the signal is inputted, thereby changing a supplied bias.

As described above, the amplifier according to the present invention can improve the current drive capability by changing the bias supplied to the amplifier circuit means only when the signal is inputted. If the signal is not supplied and the level does not change, because the output of the class C amplifying means is zero, a bias supply amount to the amplifier circuit means becomes small, thereby reducing the power consumption. Further, since the class C amplifying means and the voltage-current conversion means can be constructed by a simple circuitry, thereby providing an amplifier with a low power consumption and a high slew rate without increases of a large number of the elements and a circuit scale.

As above-mentioned in detail, the present invention can provide an amplifier having a high slew rate and a low power consumption without increasing a number of the elements and enlarging a circuit scale.

BRIEF DESCRIPTION OF THE DRAWINGS

In the accompanying drawings:

FIG. 61 is a circuit diagram showing a second example of the amplifier device according to the eleventh embodiment of this invention as shown in FIG. 59;

FIG. 62 is a circuit diagram showing a third example of the amplifier device according to the eleventh embodiment of this invention as shown in FIG. 59;

DETAILED DESCRIPTION OF THE PREFERRED EMBODIMENTS

Preferred embodiments of this invention will now be described with reference to the attached drawings.

Figure 1:
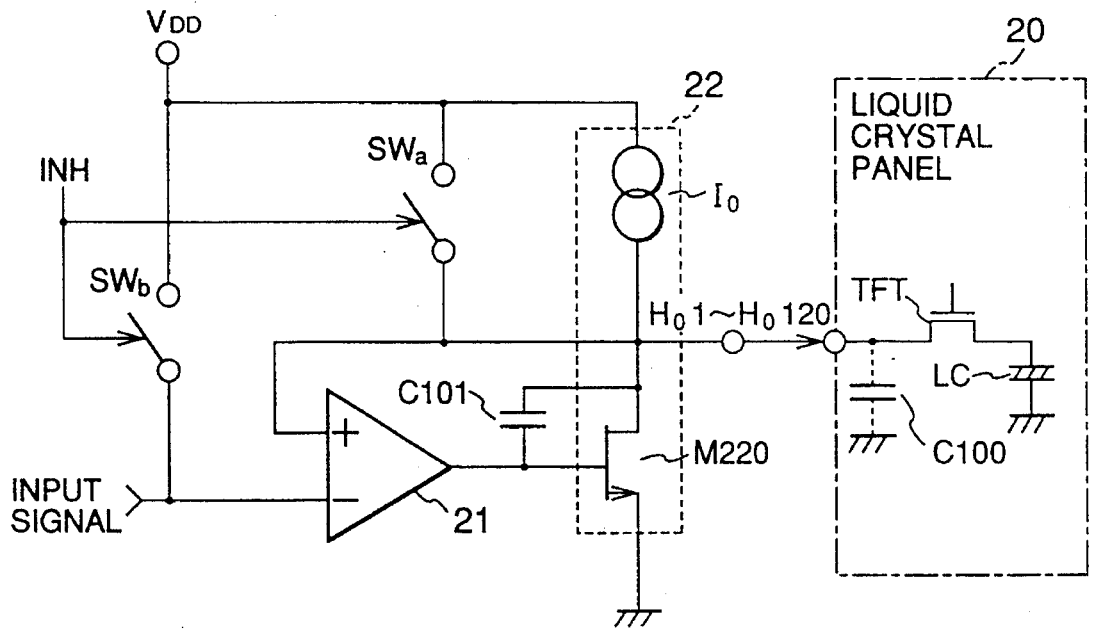
FIG. 1 is a circuit diagram showing a first example of a conventional amplifier applied to a liquid crystal display device.
Figure 2:
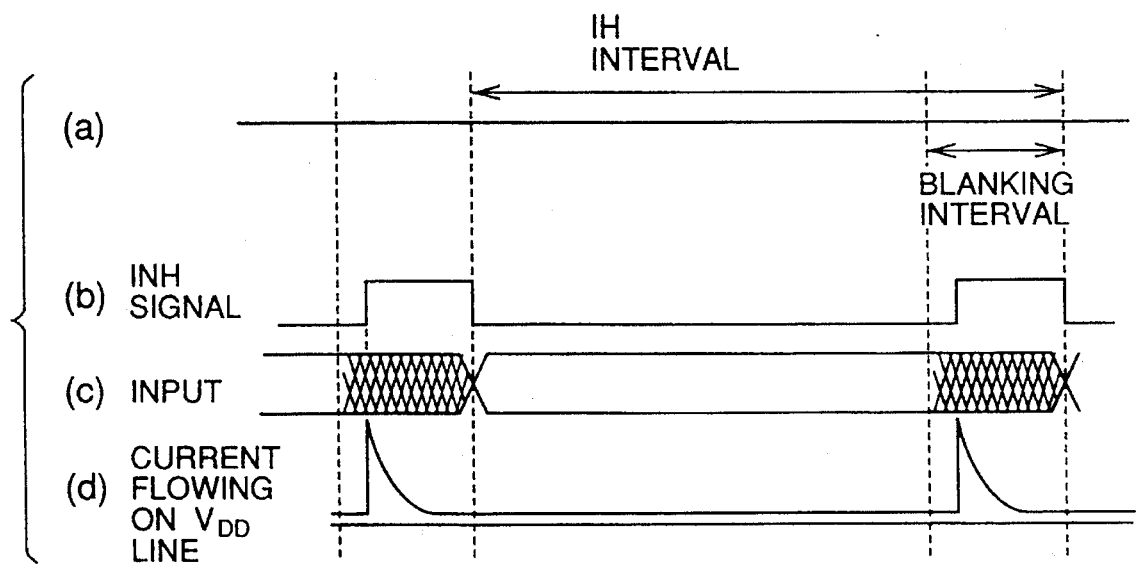
FIG. 2 is a characteristic diagram for explaining the operation of the amplifier shown in FIG. 1.
Figure 3:
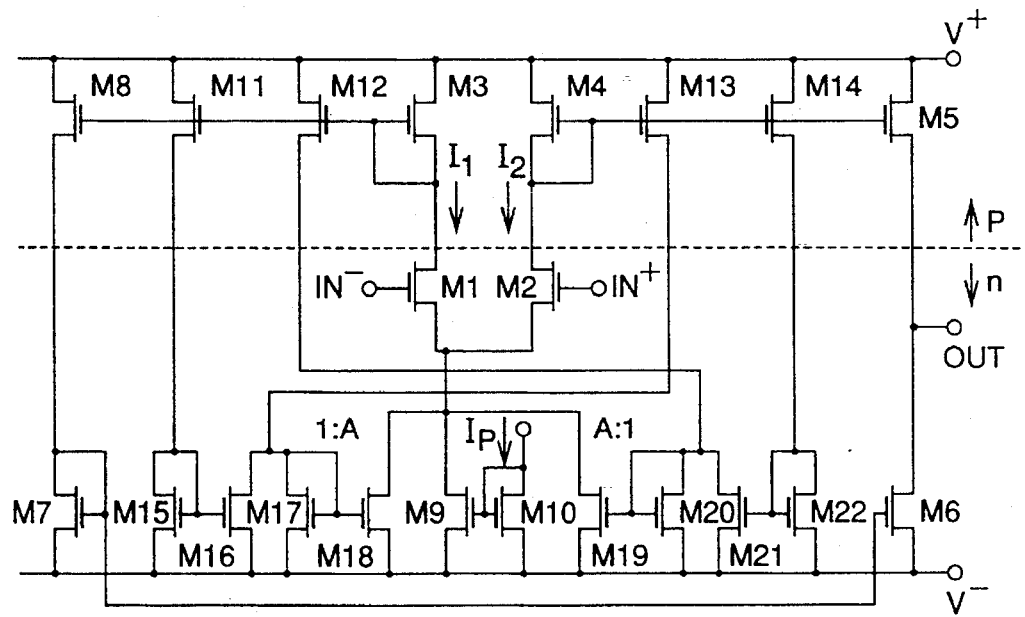
FIG. 3 is a circuit diagram showing a fourth example of a conventional amplifier.
Figure 4:
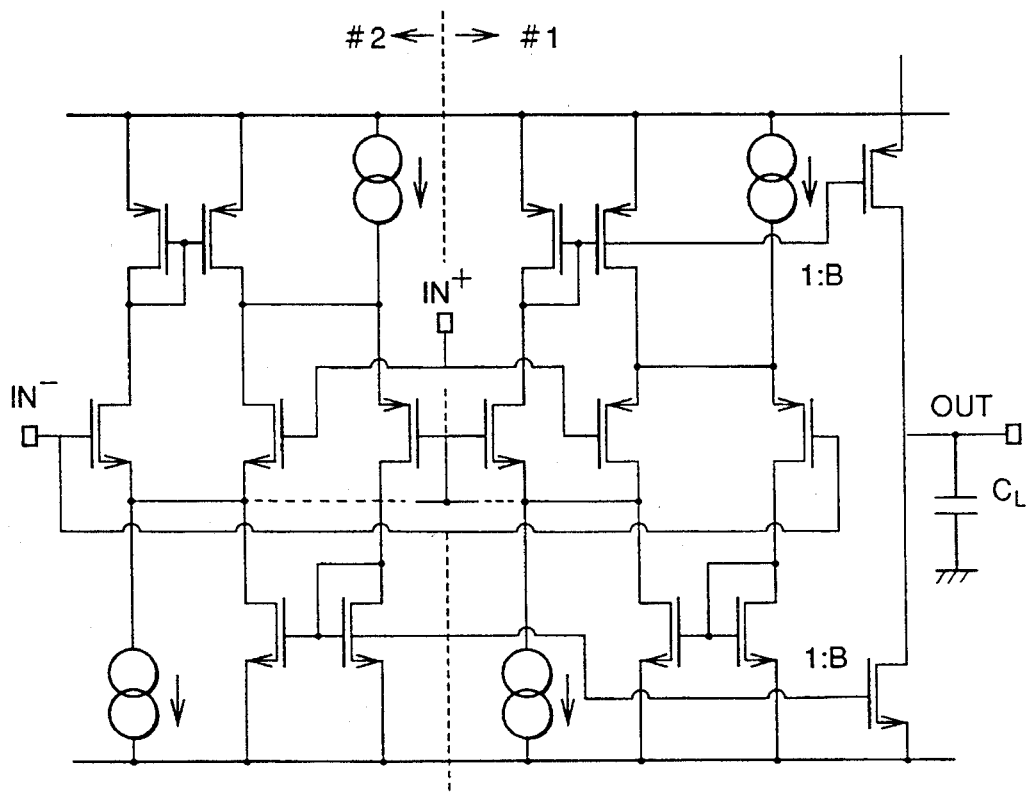
FIG. 4 is a circuit diagram showing a fifth example of a conventional amplifier.
Figure 5:
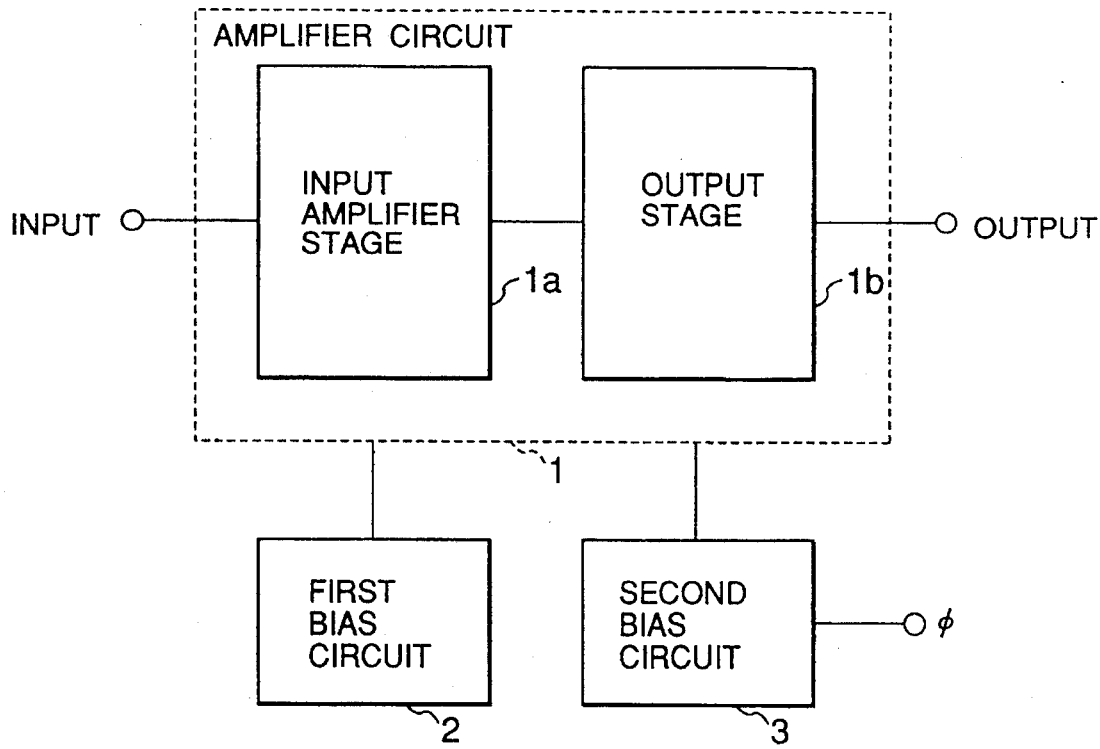
FIG. 5 is a block diagram showing a conceptional construction of an amplifier device according to a first embodiment of the present invention.

FIG. 5 is a block diagram of an amplifier adapted to control the output current driving capability by the bias control according to this invention.

The amplifier shown in FIG. 5 is directed to a circuit in which a signal of which level periodically changes is used as an input signal, and comprises an amplifier circuit 1, a first bias circuit 2, and a second bias circuit 3.

The amplifier circuit 1 is capable of controlling the output current driving capability by the bias condition such as a bias current, and is composed of an input amplifier stage 1a and an output stage 1b. The first bias circuit 2 delivers a constant current at all times to the amplifier circuit 1. The second bias circuit 3 is provided in parallel to the first bias circuit 2, and serves to deliver a constant current in an ON/OFF manner to the amplifier circuit 1 wherein $\phi$ is a control signal for carrying the ON/OFF control. This control signal $\phi$ has the same period as the level change period of the input signal, and allows the second bias circuit 3 to be in an ON state only for a fixed period shorter than the time period during which the level of the input signal is maintained, and to allow it to be in an OFF state for the other period in accordance with the input signal, thus to deliver a bias current to the amplifier circuit 1. Thus, the output driving capability of the amplifier circuit 1 is enhanced, resulting in an improved slew rate.

In accordance with the first embodiment, even if the second bias circuit 3 does not contribute to the operation of the amplifier circuit 1, the amplifier circuit 1 is placed in an operating state at all times by the first bias circuit, so the output is not placed in a high impedance state. For this reason, the output voltage is stabilized without undergoes disturbance. It is to be noted that when the value of a current delivered from the first bias circuit 2 is selected so as to reduce power consumption of the amplifier circuit 1 determined by the bias delivered from the first bias circuit 2, it is possible to prevent the power consumption from being increased to much degree.

Hitherto, an approach was employed in the prior art such that the bias current supplied by the second bias circuit becomes small with lapse of time to allow the driving capability at the beginning of the amplifier circuit to be maximum, thus to improve the slew rate. On the contrary, in accordance with the first embodiment, control of the driving capability of the amplifier circuit 1 is carried out in dependence upon whether or not a limited current is delivered by the ON/OFF control of the second bias circuit 3. For this reason, the bias current can be smaller than the initial value in the above-mentioned prior system. Thus, the instantaneous current can become small, resulting in improved reliability of the operation.

Figure 6:
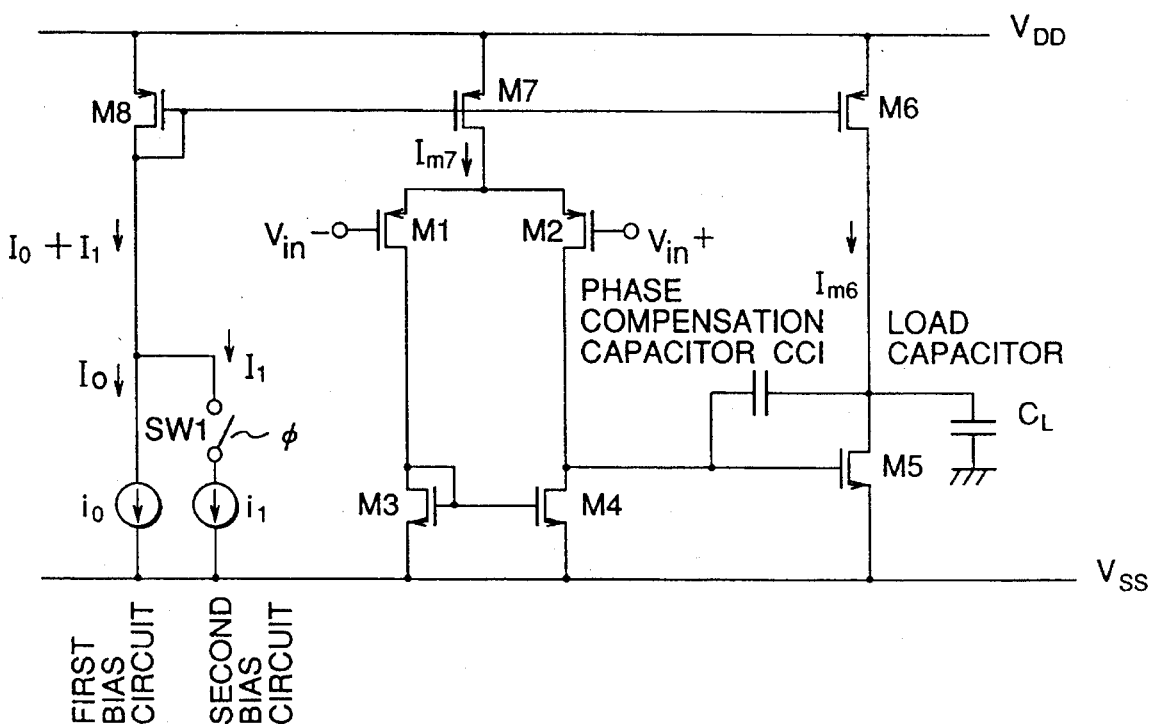
FIG. 6 is a circuit diagram showing a first example of the amplifier device according to the first embodiment of the present invention as shown in FIG. 5.

FIG. 6 shows a first actual example of the amplifier circuit of the first embodiment shown in FIG. 5.

In FIG. 6, transistors M1 to M8 and a capacitor CC1 constitute a two-stage operational amplifier, which corresponds to the amplifier circuit 1.

The transistors M1 and M2 are comprised of a P-channel FET, and transistors M3 and M4 are comprised of an N-channel FET. The transistors M1 and M2 constitute a differential input, and the transistors M3 and M4 constitute an active load using a current mirror. By these transistors M1 to M4, a first amplifier stage (input amplifier stage 1a) is constituted.

The transistor M5 is comprised of an N-channel, and its gate is connected to the drain of the transistor M4 to constitute a second amplifier stage (output stage 1b).

Further, transistors M6 and M7 are comprised of a P-channel FET. These transistors M6 and M7 deliver bias currents to the first and second amplifier stages, respectively.

Here, when the potential Vin− of an input signal to the transistor M1 and the potential Vin+ of an input signal to the transistor M2 have the relationship expressed as "Vin+= Vin−", there results the state balanced as follows. Namely, the transistors M1 to M4 constituting the first amplifier stage are all turned ON, so one half of a bias current Im7 from the transistor M7 flows into the M1 and the other half thereof flows into the transistor At this time, the transistor is in an ON state. As a result, a current Im6 from the transistor M6 flows into the transistor M5, but does not flow into the capacitive load connected to the drain thereof.

Then, when there results where the relationship expressed as "Vin+>Vin−" holds, the transistor M1 is turned ON and the transistor M2 is turned OFF. As a result, a bias current Im7 from the transistor M7 all flows into transistors M1 and M3, but does not flow into the transistor M2.

Since the current mirror circuit is constituted by the transistors M3 and M4, a current continues to flow into the transistor M4 until the potential on the drain thereof becomes equal to zero.

Thus, the transistor M5 is turned OFF. As a result, a current from the transistor M6 flows into the capacitive load CL, so the potential thereon rises.

Then, when there results the state where the relationship expressed as "Vin+<Vin−" holds, the transistor m2 is turned ON and the transistor M1 is turned OFF. As a result, a bias current from the transistor M7 all flows into the transistor M2, but does not flow into the transistors M1, M3 and M4.

Thus, the potential on the gate of the transistor M5 rises, so the transistor M5 is turned ON. Accordingly, a current larger than the current Im6 from the transistor M6 flows into the transistor M5, thus promoting the capacitive load top be discharged. As a result, the potential thereon falls.

The constant current source circuit i0 corresponds to the first bias circuit 2, and the series circuit including constant current source circuit i1 and the switch corresponds to the second bias circuit 3, and is connected in parallel with the constant current source circuit i0.

A transistor M8 is comprised of a P-channel FET. This transistor M8 serves as a reference current input terminal and the above-mentioned transistors M6 and M7 serve as the output terminal thus to constitute a current mirror circuit. A bias current from the constant current source i0 and i1 is delivered to the transistor M8, and currents corresponding to a ratio of W/L with respect to the transistor M8 flow into the transistors M6 and M7, respectively.

Thus, when the switch SW1 is in an OFF state, a current determined by the current IO from the constant current source circuit i0 flows into the transistors M6 and M7. In contrast, when the switch SW1 is in an ON state, a current determined by a synthetic current of the current IO from the constant current source circuit i0 and the current I1 from the constant current source circuit i1 flows into the transistors M6 and M7.

Accordingly, in accordance with the first embodiment, by the ON/OFF control of the switch SW1, a bias current in the case where the switch SW1 is in an ON state is increased by a value corresponding to the current I1 as compared to the case where the switch is in an OFF state. As a result, the output current driving capability is enhanced, and the slew rate is improved. On the other hand, in the case where the switch SW1 is in an OFF state, while the current I1 is decreased, it does not become equal to zero because of existence of the current IO, resulting in no possibility that the output is placed in a high impedance state.

In addition, since the value of a current flowing when the switch SW1 is turned ON is suppressed by the constant current source i1, there is no possibility that the instantaneous current becomes excessive. Thus, high reliability can be provided under the state where power of the transistor greater than that in the prior art is not so required. This is advantageous to implementation of IC.

Figure 7:
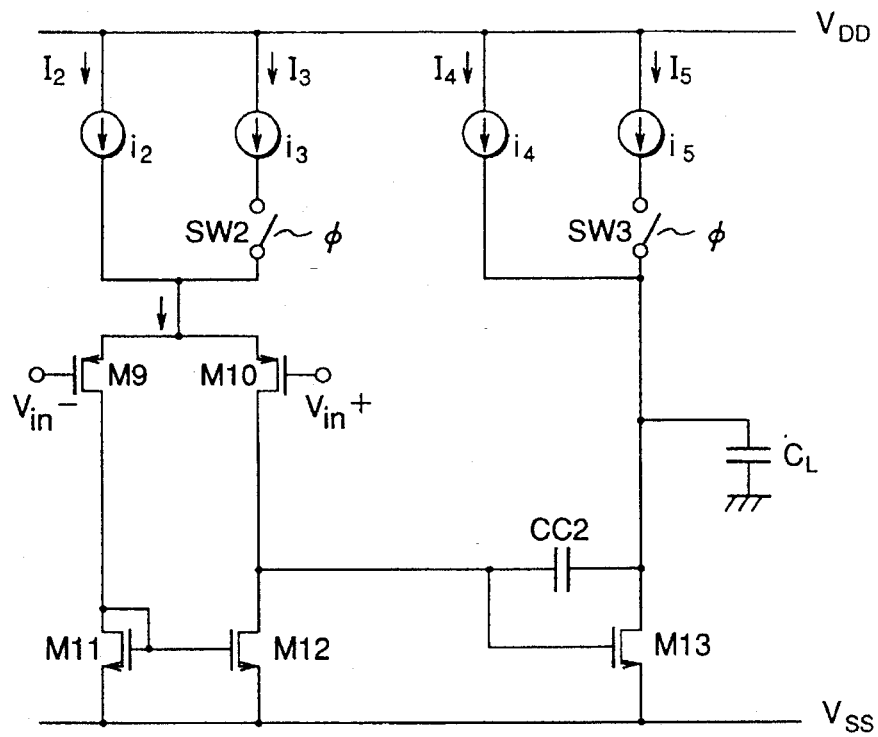
FIG. 7 is a circuit diagram showing a second example of the amplifier device according to the first embodiment of the present invention as shown in FIG. 5.

FIG. 7 shows a second actual example of the first embodiment shown in FIG. 5.

In FIG. 7, transistors M9 to M13 and a capacitor CC2 constitute a two-stage operational amplifier, and this amplifier corresponds to the amplifier circuit 1.

The transistors M9 and M10 are comprised of a P-channel FET, and the transistors M11 and M12 are comprised of an N-channel FET. The transistors M9 and M10 constitute the differential input and the transistors M11 and M12 constitute an active load using a current mirror circuit. In addition, the transistors M9 to M12 constitute the first amplifier stage (the input amplifier stage 1a).

The transistor M13 is comprised of an N-channel FET. The gate of the transistors M13 is connected to the drain of the transistor M12 to constitute a second amplifier stage (the output stage 1b).

Constant current source circuits i2 and i4 correspond to the first bias circuit 2. The series circuit of a constant current source circuit i3 and a switch SW2 and the series circuit of a constant current source circuit i5 and a switch SW3 correspond to the second bias circuit 3. The former is provided in parallel to the constant current source circuit i2 and the latter is connected in parallel to the constant current source circuit 14. Each current from the constant current source circuit i2 and i4 biases the first amplifier stage, and each current from the constant current source circuit 13 and i5 biases the second amplifier stage.

Namely, in accordance with the circuit according to the second actual example of the first embodiment, first and second bias circuits are provided in the first amplifier stage (the input amplifier stage 1a) and the second amplifier stage (the output stage 1b) of the operational amplifier, respectively. The switches SW2 and SW3 are synchronously subjected to ON/OFF control.

The circuit thus constructed operates in the same manner that as in the circuit of the first actual example shown in FIG. 6 except that the section of the operational amplifier is directly supplied with a bias current from the current source circuit.

Thus, when the switches SW2 and SW3 are in an OFF state, a synthetic current of a current I2 from the constant current source circuit i2 and a current I3 from the constant current source circuit i3 is delivered to the first amplifier stage (input amplifier stage 1a), and a synthetic current of a current I4 from the constant current source circuit i4 and a current I5 from the constant current source circuit i5 is delivered to the second amplifier stage (input amplifier stage 1a).

Thus, in accordance with this first embodiment, by the

ON/OFF control of the switches SW2 and SW3, bias currents when the switches SW2 and SW3 are in an ON state are increased by the currents I# and I % as compared to those when they are in an OFF state, respectively. As a result, the output driving capability is enhanced. On the other hand, when the switches SW2 and SW3 are in an OFF state, the current I3 and I5 is decreased, but does not equal to zero because of existence of the current I2 or I4, resulting in no possibility that the output is placed in a high impedance state. Further, since the values of currents flowing when the switches SW2 or SW3 is turned On are suppressed by the constant current sources i3 and i5, there is no possibility that the instantaneous current becomes excessive.

Namely, the same effects similar to those of the first actual example shown in FIG. 6 can be provided by the second actual example as well.

Furthermore, in accordance with the first embodiment, since first and second bias circuits are provided in the first amplifier stage (input amplifier stage 1a) and the second amplifier stage(output stage 1b), respectively, a set value of the current at the pair of the constant current circuit i2 and i3 and that at the pair of the constant current source circuits i4 and i5 can be independently adjusted. Thus, the degree in setting the operating current is improved.

Figure 8:
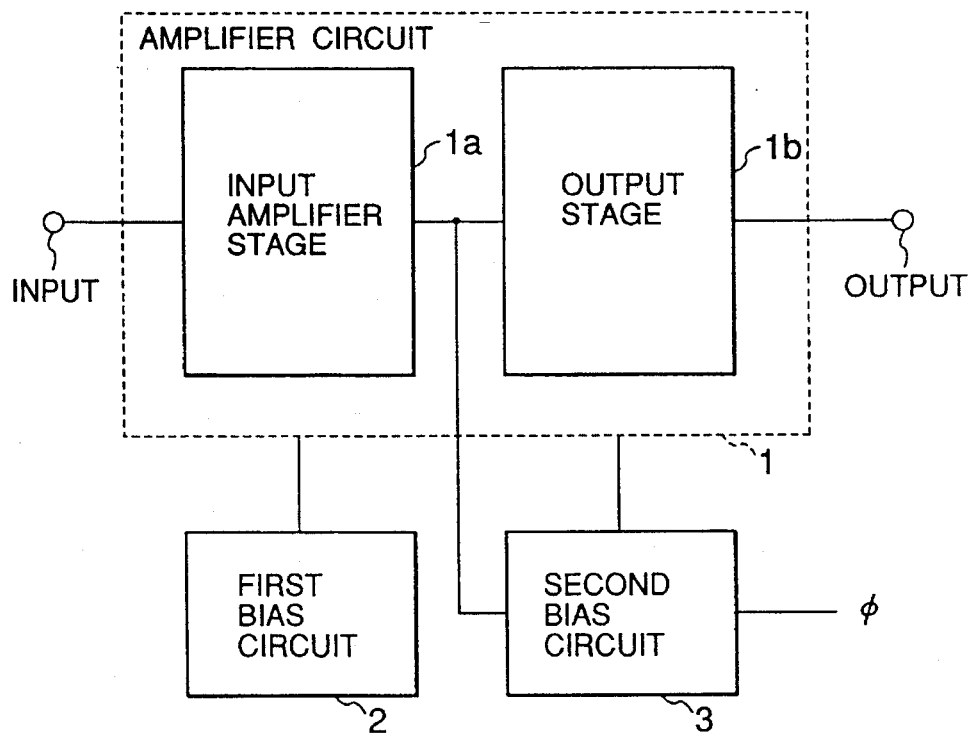
FIG. 8 is a block diagram showing a conceptional construction of an amplifier device according to a second embodiment of the present invention.

FIG. 8 is a block diagram of an amplifier circuit according to a second embodiment to control the output current driving capability by the bias control.

The amplifier circuit shown in the figure, is directed to an amplifier in which a signal periodically changing is used as an input signal, and is composed of an amplifier circuit 1, a first bias circuit 2, and a second bias circuit 3 adapted so that the bias current is determined by the input amplifier stage 1a in the amplifier circuit 1 and the connection to the amplifier circuit 1 is controlled in an ON/OFF manner by a control signal from the external.

In FIG. 5, since the control signal is given, e.g., at the timing where an input signal periodically changing varies by a periodical pulse synchronized with the input signal, even when the potential change of the input signal is small and there is therefore no necessity of enhancing the output driving capability, the output driving capability was unnecessarily enhanced.

In the circuit shown in FIG. 8, since the bias current of the second bias circuit 3 is determined in dependence upon the output potential of the input amplifier stage 1a or the change rate of the output current, even in the case where the potential change is small and there is therefore no necessity of enhancing the output current driving capability over the entire period of the control signal given from the external, the bias current becomes small. Thus, a lower power consumption is realized without unnecessarily enhancing the output current driving capability.

Figure 9:
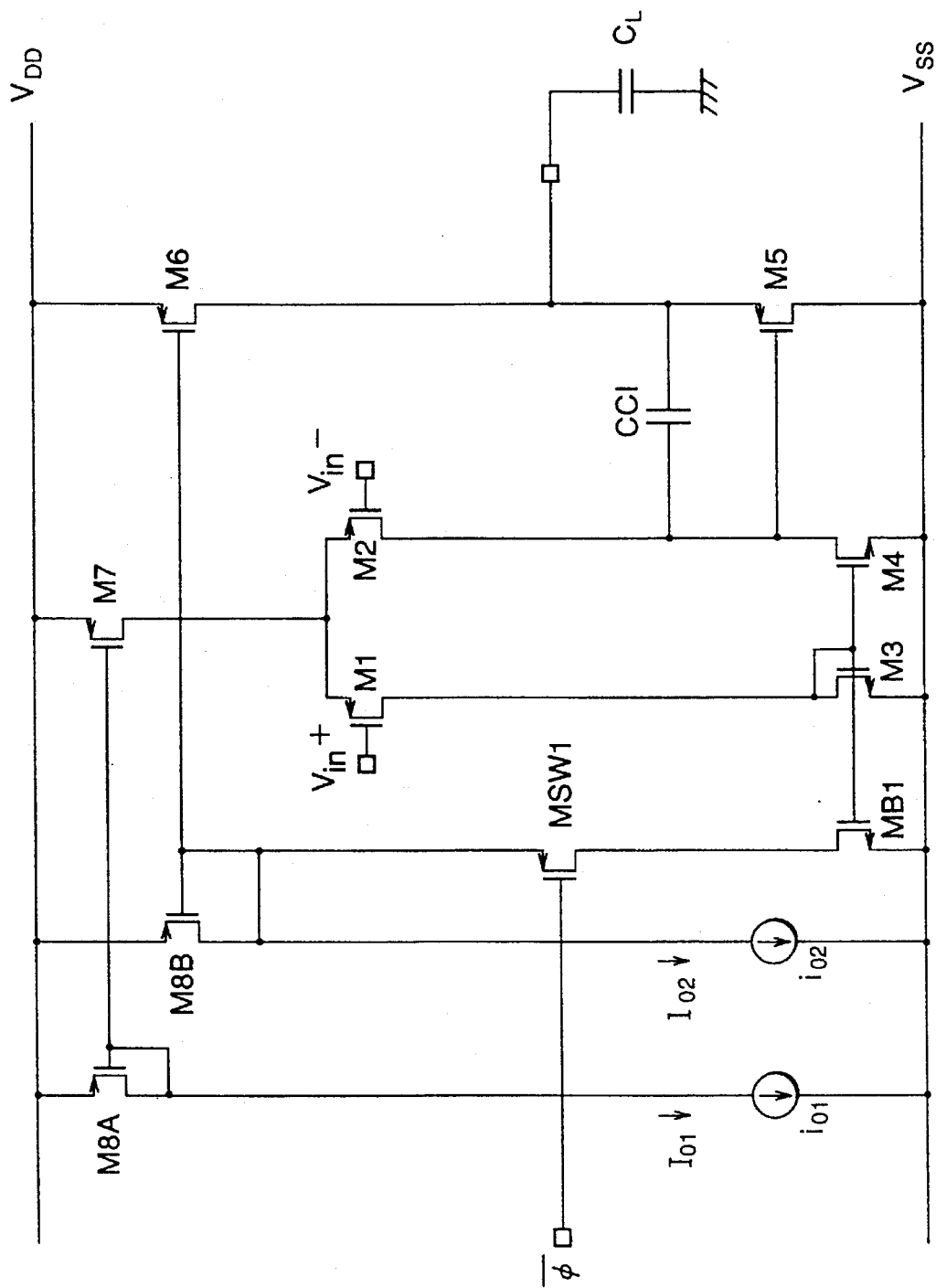
FIG. 9 is a circuit diagram showing an example of the amplifier device according to the second embodiment of the present invention as shown in FIG. 8.

FIG. 9 shows an actual example of the circuit shown in FIG. 8.

The circuit shown in this figure is featured below. Namely, by dividing the transistor M8 in the circuit shown in FIG. 6 into transistors M8A and M8B, the path for delivering a bias current to the input amplifier stage 1a and the path for delivering a bias current to the output stage 1b are separately provided. Further, the bias current delivered to the input amplifier stage 1a is caused to be only a bias current delivered from the first bias circuit, and the rate determined by the bias current and the phase compensation capacitor CC1 is set so that it is high at all times. In addition, the bias current delivered from the second bias circuit flowing into the output stage 1b, which is considered to be most closely related to power consumption, is only controlled. In such a modified example, the bias current delivered from the second bias circuit is determined in dependence upon the output of the input amplifier stage 1a.

The switch SW1 in FIG. 6 is comprised of a transistor MSW1, and the ON/OFF operation thereof is controlled by a control signal φ. The current source section of the second bias circuit is comprised of a transistor MB1. The bias current value is determined as follows; Namely, by using, as a potential on the gate of the transistor MB1, an output on the drain terminal side of the transistor M3 of the input amplifier stage 1a comprised of transistors M1 to M4, the bias current is determined so that when Vin+ is higher than Vin− in potential, the bias current increases, and when Vin+ is lower than Vin+, the bias current decreases. As stated above, since the output current of the output stage is determined in dependence upon the amplitude of the input differential signal without uniformly enhancing the output current driving capability over the entire period of the control signal φ, a lower power consumption can be realized.

While the circuits in the first and second embodiments which have been described are both comprised of MOSFET, a buffer circuit which can provide the function similar to the above may be constituted by using bipolar transistor.

Figure 10:
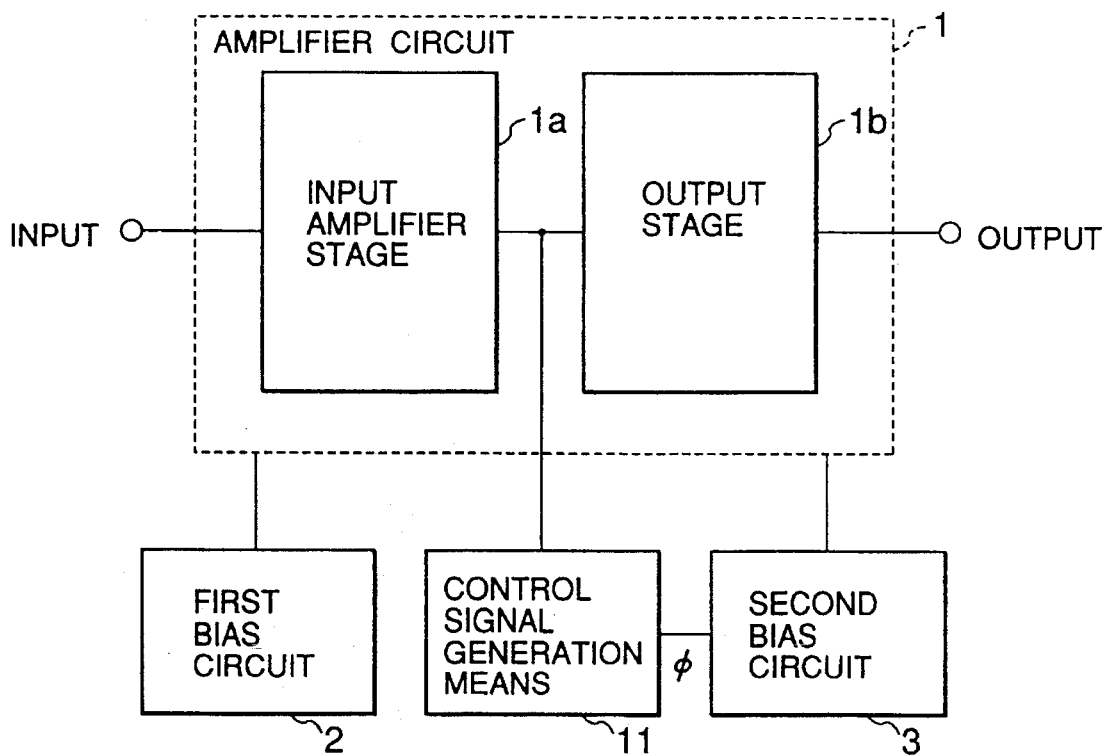
FIG. 10 is a block diagram showing a conceptional construction of an amplifier device according to a third embodiment of the present invention.

FIG. 10 is a block diagram of an amplifier circuit according to a third embodiment adapted to control the output current driving capability by a control signal generated by using an output from the input amplifier stage 1a. This circuit corresponds to the circuit in which control signal generation means 11 using an output from the input amplifier stage 1a is added in the block diagram of the first embodiment shown in FIG. 5.

In FIG. 5, since the control signal is given, e.g., at the timing where an input signal periodically changing varies by a periodical pulse synchronized with the input signal, even in the case where the potential change is small and there is therefore no necessity of enhancing the output current driving capability, the output driving capability was enhanced only for a fixed period controlled by the control signal.

On the contrary, in the amplifier circuit according to a third embodiment shown in FIG. 10, a control signal is generated only when the potential change or the current change of the output of the input amplifier stage 1a is large. Namely, in the case where the potential change of the input signal is small and there is therefore no necessity of enhancing the output current driving capability, the potential change or the current change of the output of the input amplifier stage 1a is small. Accordingly, this amplifier circuit does not produce a control signal in such a case. Thus, a lower power consumption is realized without unnecessarily enhancing the output current driving capability.

Figure 11:
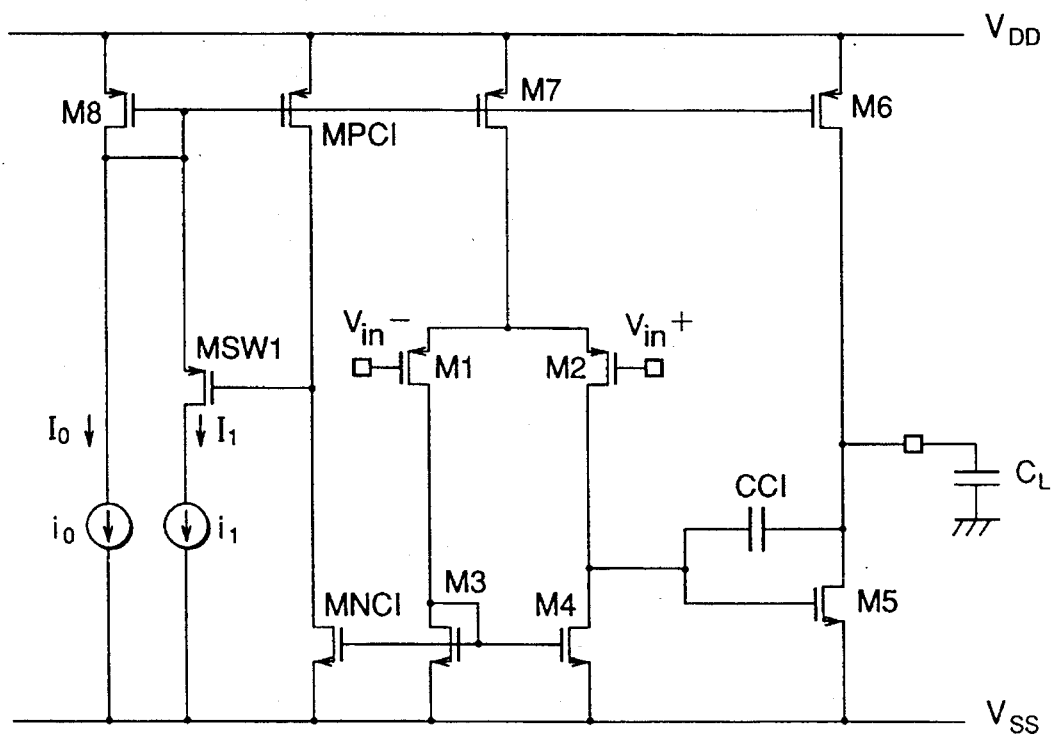
FIG. 11 is a circuit diagram showing a first example of the amplifier device according to the third embodiment of the present invention as shown in FIG. 10.

FIG. 11 shows a first actual example of the amplifier circuit of the third embodiment shown in FIG. 10, and the circuit shown in this figure corresponds to the circuit in which the control signal generation means 11 is added to the circuit shown in FIG. 6.

As previously described, the transistors M1 to M8 constitute a two-stage operational amplifier, and correspond to the amplifier circuit 1. The transistors M1 to M4 of these transistors constitute the input amplifier stage 1a and the transistor thereof constitutes the output stage. Further, the transistors M6 and M7 deliver bias currents to the input amplifier stage 1a and the output stage 1b, respectively. In addition, the switch SW1 is realized with the transistor MSW1.

In the amplifier circuit of such a structure, the slew rate at the rising time is in correspondence with a lower one of rate determined by the bias current delivered to the input amplifier stage 1a and the capacitance of the phase compensation capacitor CC1 and a rate determined by the current delivered from the transistor M6 and the capacitance of the capacitive load CL of the output. Further, the slew rate at the falling time is determined by the bias current delivered to the input amplifier stage 1a and the phase compensation capacitor CC1. Accordingly, when Vin+ is lower than Vin− in potential, there results such an operation to sink a current by the transistor M5 to lower the output potential. Accordingly, since if the current delivered by the transistor M6 is increased, it is all sunk by the transistor M5, there is no necessity of enhancing the output current driving capability. By drawing attention to this point, the control signal generation means 11 is formed as described later.

Namely, this control signal generation means 11 is comprised of transistors MPC1 and MNC1. When the relationship expressed as $(W/L)_{MPC1}/(W/L)_{M7} > [(W/L)_{MNC1}/(W/L)_{M4}]/2$, i.e., Vin− and Vin+ are equal to each other in potential, a setting is made such that a current delivered from the drain of the transistor MPC1 is larger than a current sunk into the drain of the transistor MNC1. Thus, the control signal generation means 11 performs an operation such that only when Vin+ is larger than Vin—to some extent in potential, the drain current flowing in the transistor MNC1 becomes larger than the drain current flowing in the transistor MNC1 to lower the gate potential of the transistor MSW1 to allow it to be turned ON, thus to enhance the output current driving capability of the transistor M6.

As stated above, since the control signal generation means performs an operation such that only when Vin+ is larger than Vin− to some extent in potential, the transistor MSW1 is turned ON, thus making it possible to enhance the output current driving capability of the transistor M6.

Figure 12:
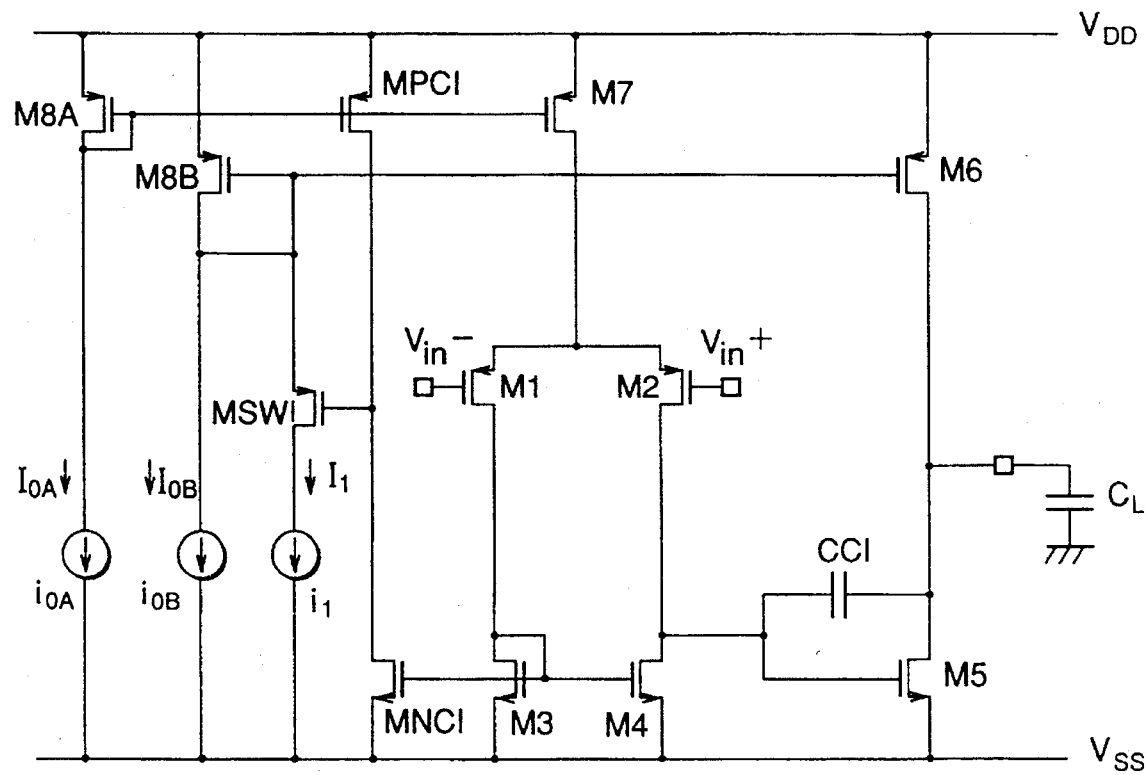
FIG. 12 is a circuit diagram showing a second example of the amplifier device according to the third embodiment of the present invention as shown in FIG. 10.

FIG. 12 shows a second actual example of the amplifier circuit of the third embodiment shown in FIG. 10.

The circuit shown in FIG. 12 is featured below; Namely, by driving the transistor m8 in the circuit shown in FIG. 6 into transistors M8A and M8B, the path for delivering a bias current to the input amplifier stage 1a and the path for delivering a bias current to the output stage 1b are separately provided. Further, the bias current delivered to the input amplifier stage 1a is set so that the rate determined by the bias current and the phase compensation capacitor CC1 is high at all times. In addition, the bias current flowing into the output stage 1b, which is considered to be most closely related to power consumption, is only controlled. In accordance with such a modified example the obtained, effects and/or advantages similar to those in the circuit shown in FIG. 11 can be provided.

Figure 13:
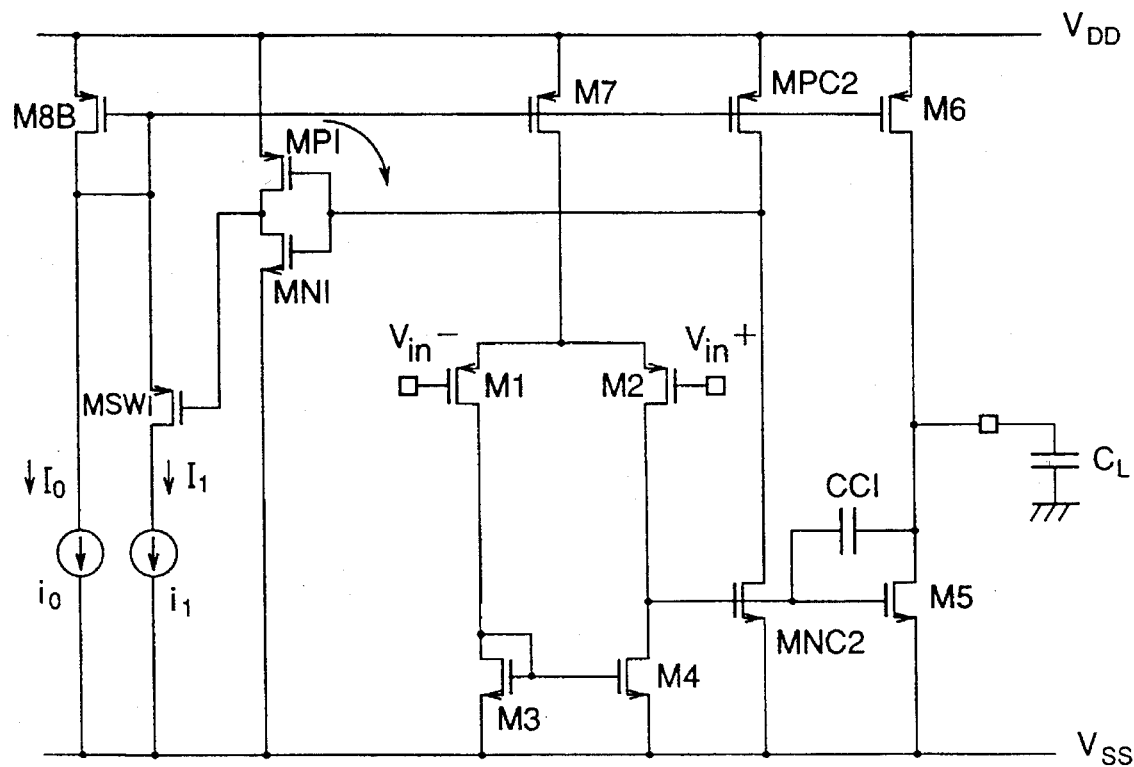
FIG. 13 is a circuit diagram showing a third example of the amplifier device according to the third embodiment of the present invention as shown in FIG. 10.

FIG. 13 shows a third actual example of the amplifier circuit according to the third embodiment shown in FIG. 10.

The circuit shown in this figure corresponds to a modified example of the configuration of the control signal generation means in the first example circuit shown in FIG. 11. While, in the circuit shown in FIG. 11, the drain potential of the transistor M3 is used as an output from the input amplifier stage 1a serving as an input to the control signal generation means, the drain potential of the transistor M3 is used for this purpose in the circuit shown in FIG. 13. The control signal generation means is composed of inverting circuits comprised of transistors MC2 and MNC2 and transistors MP1 and MN1. When the relationship expressed as $(W/L)_{MPC2}/(W/L)_{M7} > [(W/L)_{MNC2}/(W/L)_{M4}]/2$, i.e., Vin− and Vin+ are equal to each other in potential, a setting is made such that a current sunk into the transistor MNC2 is larger than a current delivered from the transistor MPC2. Thus, the control signal generation means performs an operation such that only when Vin+ becomes equal to a potential higher than Vin− to some extent, the drain current flowing in the transistor MPC2 becomes larger than the drain current flowing in the transistor MNC2 to lower the output potential of the inverting circuit comprised of the transistor MSW1 to be turned ON, thus to enhance the output current driving capability of the transistor M5. As a result, effects and/or advantages similar to the above can be provided.

Figure 14:
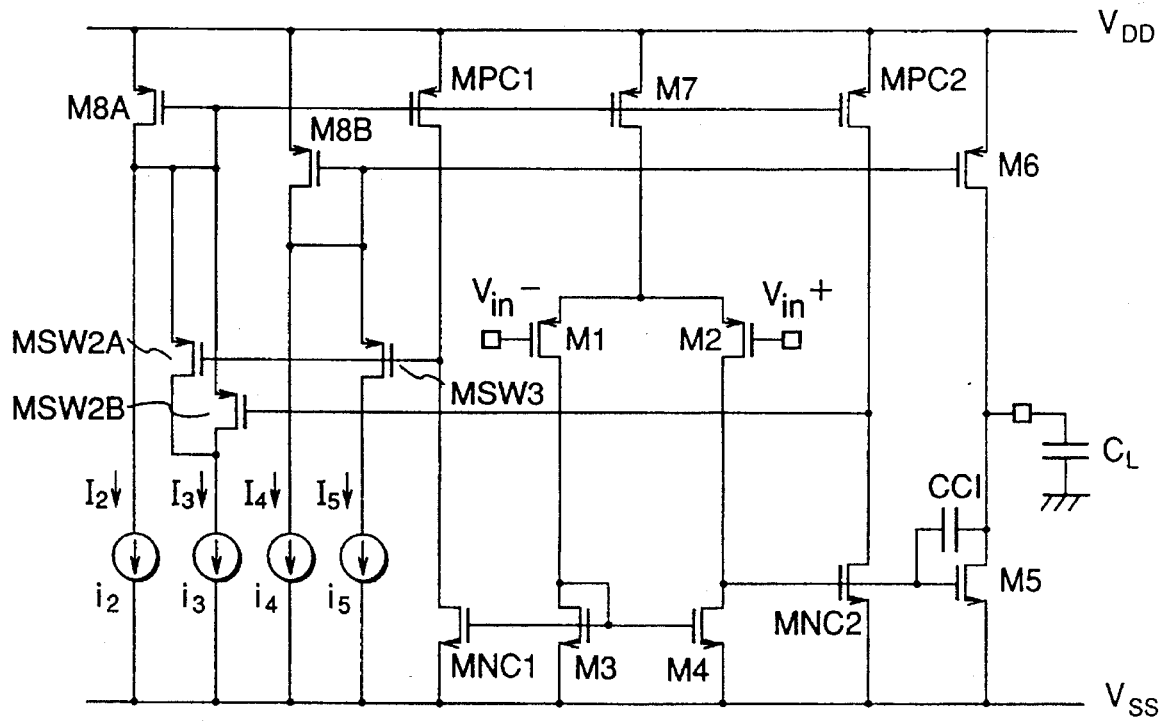
FIG. 14 is a circuit diagram showing a fourth example of the amplifier device according to the third embodiment of the present invention as shown in FIG. 10.

FIG. 14 shows a fourth actual example of the amplifier circuit according to the third embodiment shown in FIG. 10.

The circuit shown in this figure is directed to the modified example where the bias current of the input amplifier stage 1a is also controlled by a control signal generated by the control signal generation means in the circuit of the second actual example of the third embodiment shown in FIG. 12. The control signal generation means is comprised of transistors MPC1, MPC2 and PNC2, and the control of the bias current to the output stage 1b is conducted in the manner as described in the second actual example of FIG. 10. Since the bias current to the input amplifier stage 1a is one of factors for determining the slew rate, this control is carried out so that when Vin+ becomes equal to a potential higher than Vin− in potential to some extent, and when Vin− becomes equal to a potential higher than Vin+ to some extent, the bias current of the input amplifier stage 1a becomes large. For this reason, a control is conducted such that when Vin+ becomes equal to a potential higher than Vin− to some extent by the transistors MPC1 and MNC1, the transistor is caused to be turned ON to add a current I3 from the constant current source i3, and when Vin− becomes equal to a potential higher than Vin+ to some extent by the transistors MPC2 and MNC2, the transistor MSW2B is caused to be turned ON to add a current I3 from the constant current source i3. Thus, a current is prevented from being unnecessarily consumed at the input amplifier stage 1a although its value is small. Here, "(W/L)" of the transistors MPC2 and MNC2 is set so that the relationship expressed as $(W/M)_{MPC2}/(W/L)_{M7} > [(W/M)_{MNC2}/(W/L)_{M4}]/2$. This relationship is different from that in the case of the circuit shown in FIG. 13.

Figure 15:
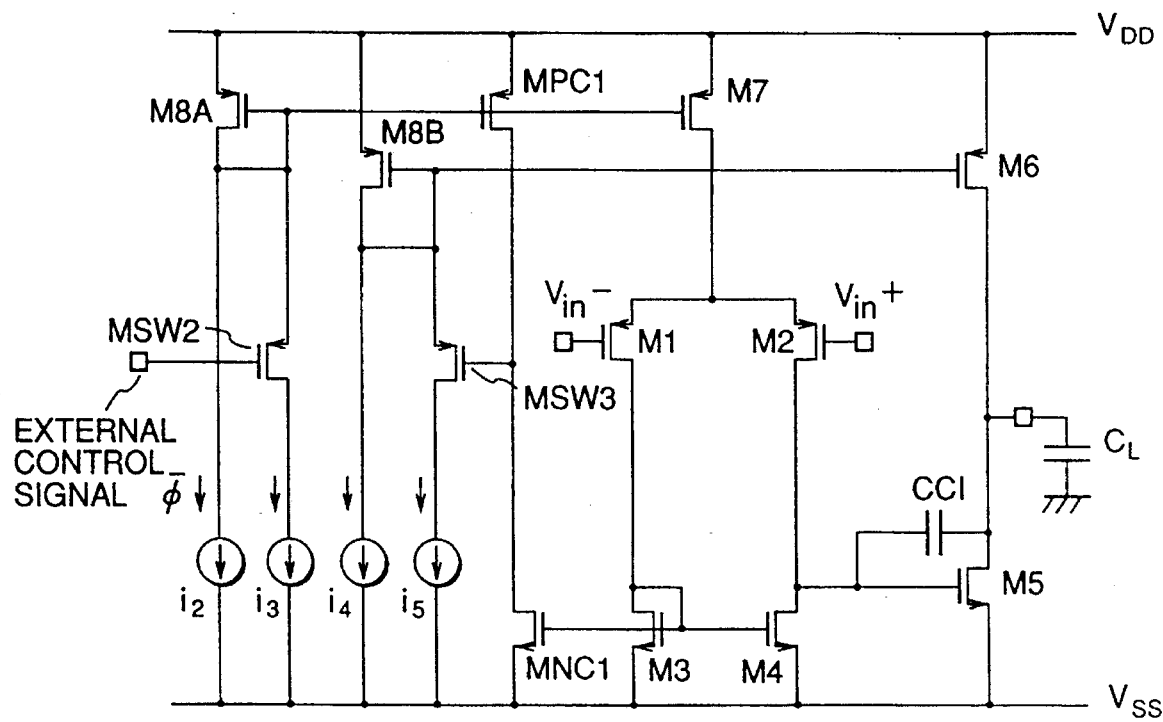
FIG. 15 is a circuit diagram showing a fifth example of the amplifier device according to the third embodiment of the present invention as shown in FIG. 10.

FIG. 15 shows a fifth actual example of the amplifier circuit of the third embodiment shown in FIG. 10.

The circuit shown in this figure is characterized in that the bias current control of the input amplifier stage 1a is carried out by a periodical pulse φ synchronized with an input signal periodically changing as shown in FIG. 7 in the circuit of the fourth actual example shown in FIG. 14. Effects or advantages similar to those in the case of the circuit shown in FIG. 14 can be provided.

Figure 16:
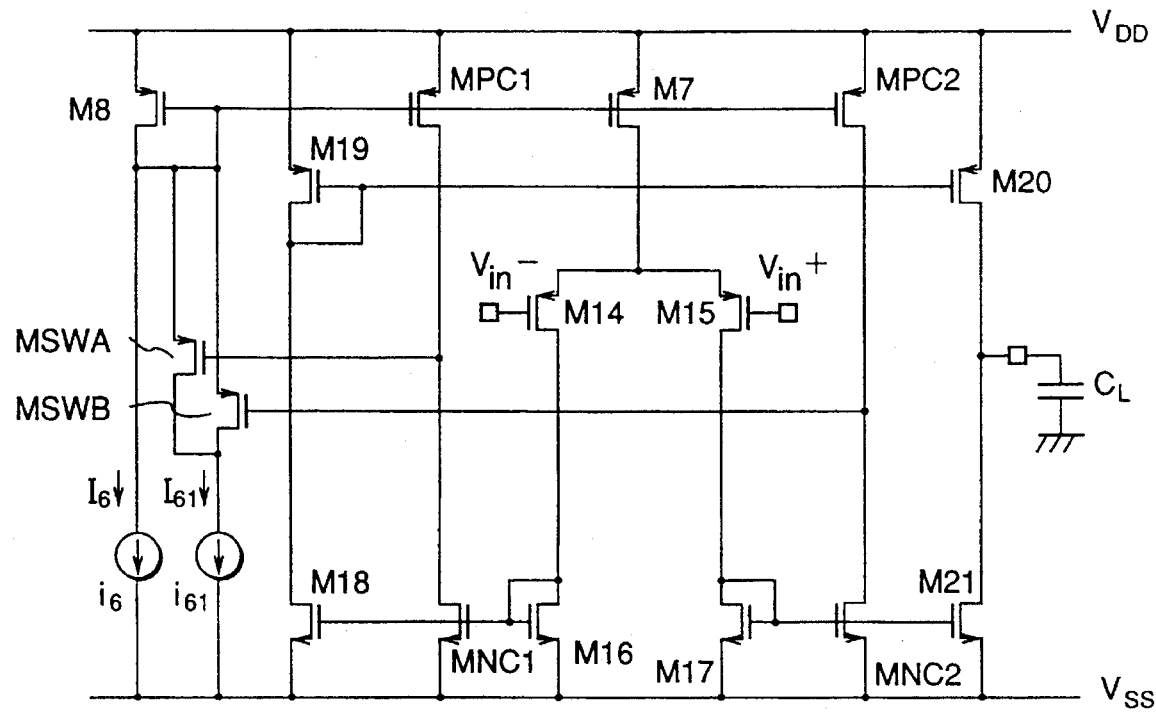
FIG. 16 is a circuit diagram showing a sixth example of the amplifier device according to the third embodiment of the present invention as shown in FIG. 10.

FIG. 16 shows a sixth actual example of the amplifier circuit of the third embodiment shown in FIG. 10.

The circuit shown in this figure is directed to the example where control signal generation means is added in the amplifier circuit comprised of transistors. The transistors M1–M4 and M7 constitute the input amplifier stage, the transistors M5 and M6 constitute the output stage, and control signal generation means is composed of transistors MPC1, MNC1, MPC2 and MNC2. The relationship of respective (W/L) factors of the transistors MPC1, MNC1<MPC2 and MNC2 is as described with reference to FIG. 14. Namely, by allowing respective (W/L) to have a predetermined relationship, such a control is conducted to allow the transistor MSWB to be turned ON when Vin+ becomes equal to a potential higher than Vin− to some extent. Thus, when Vin+ becomes equal to a potential higher than Vin− to some extent, and when Vin− becomes equal to a potential higher than Vin+ to some extent, the control signal generation means allows the transistors MSWA or MSWB to be turned ON to increase a bias current delivered to the amplifier circuit from I6 to "I6+I61", thus to improve the slew rate.

Figure 17:
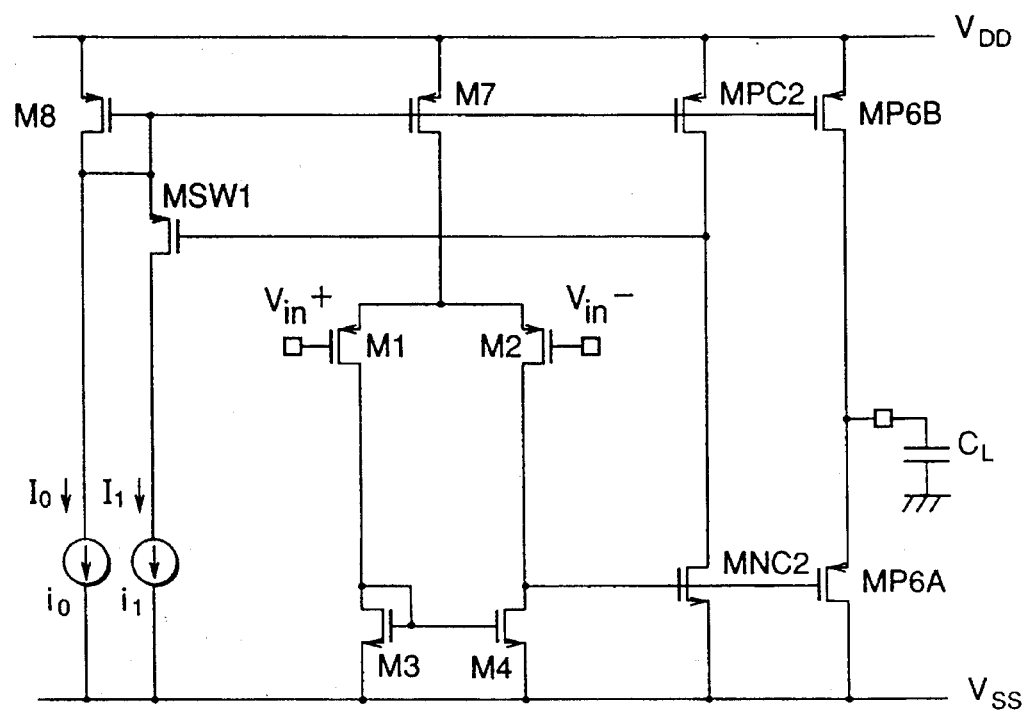
FIG. 17 is a circuit diagram showing a seventh example of the amplifier device according to the third embodiment of the present invention as shown in FIG. 10.

FIG. 17 shows an actual example of the amplifier circuit of the third embodiment shown in FIG. 10.

In FIG. 17, transistors M1 to M4 constitute the input amplifier stage 1a, and transistor M7 delivers a bias current to the input amplifier stage 1a. In the amplifier circuit constituted by source-follower comprised of transistors MP6A and MP6B, the slew rate at the rising time is substantially determined by a current delivered by the transistor MP6B, and the slew rate at the falling time is dependent upon (W/L) of the transistor MP6B.

The control signal generation means is comprised of transistors MPC2 and MNC2, and (W/L) factors of respective transistors have the relationship expressed as $(W/L)_{mpc2}/(W/L)_{M7}>[(W/L)_{MNC2}/(W/L)_{M4}]/2$. Namely, a setting is made such that when Vin+ becomes equal to a potential higher than Vin− to some content, the transistor MSW1 is caused to be turned ON to add a current I1 of the current source i1 to a current I0 to add a current source i0. Thus, only when Vin+ becomes equal to a potential higher than Vin− to some extent, a current delivered from the transistor MP6B is increased, thus to enhance the output current driving capability.

Figure 18:
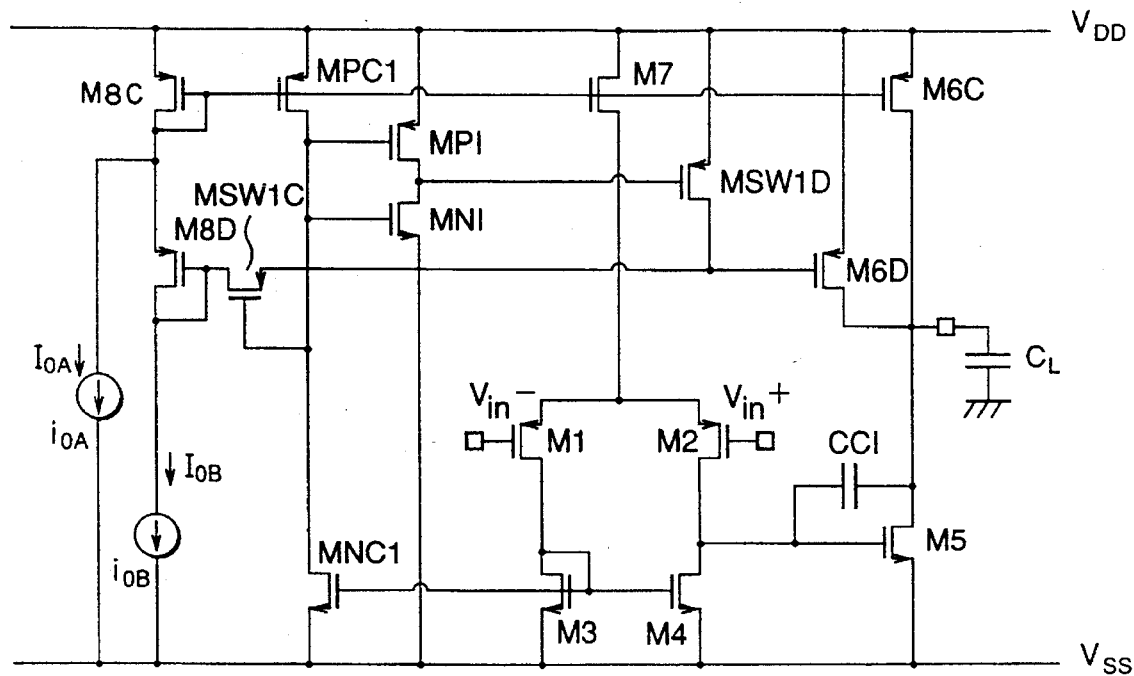
FIG. 18 is a circuit diagram showing a eighth example of the amplifier device according to the third embodiment of the present invention as shown in FIG. 10.

FIG. 18 shows an eighth actual example of the amplifier circuit of the third embodiment shown in FIG. 10.

The circuit shown in FIG. 18 is directed to the modified example where the actual example of the bias circuit shown in FIG. 11. As previously described, the transistors M1 to M4 constitute the input amplifier stage 1a and the transistor M5 constitutes the output stage 1b. Further, the transistor delivers a bias current to the input amplifier stage 1a and the transistors M6C and control signal generation means is comprised of transistor MPC1 and the relationship of (W/L) is the same as that in the description of the circuit shown in FIG. 11. In addition, the transistors MP1 and M1 constitute the inverting circuit to generate an inverted signal of the control signal.

In this configuration, by a control signal generated when Vin+ becomes equal to a potential higher than Vin− to some extent, the transistor MSW1D is turned OFF, and the transistor MSW1C is turned ON to apply the gate potential of the transistor MSD to the gate of the transistor M6D to thereby enhance the output current driving capability. At this time, since sum of the gate-source voltage of the transistor M8D and the gate-source voltage of M8C is supplied to the gate of the transistor M6D, (W/L) of the transistor M6D for delivering a current necessary for enhancing the output current driving capability can be reduced, i.e., the area there can be reduced.

Figure 19:
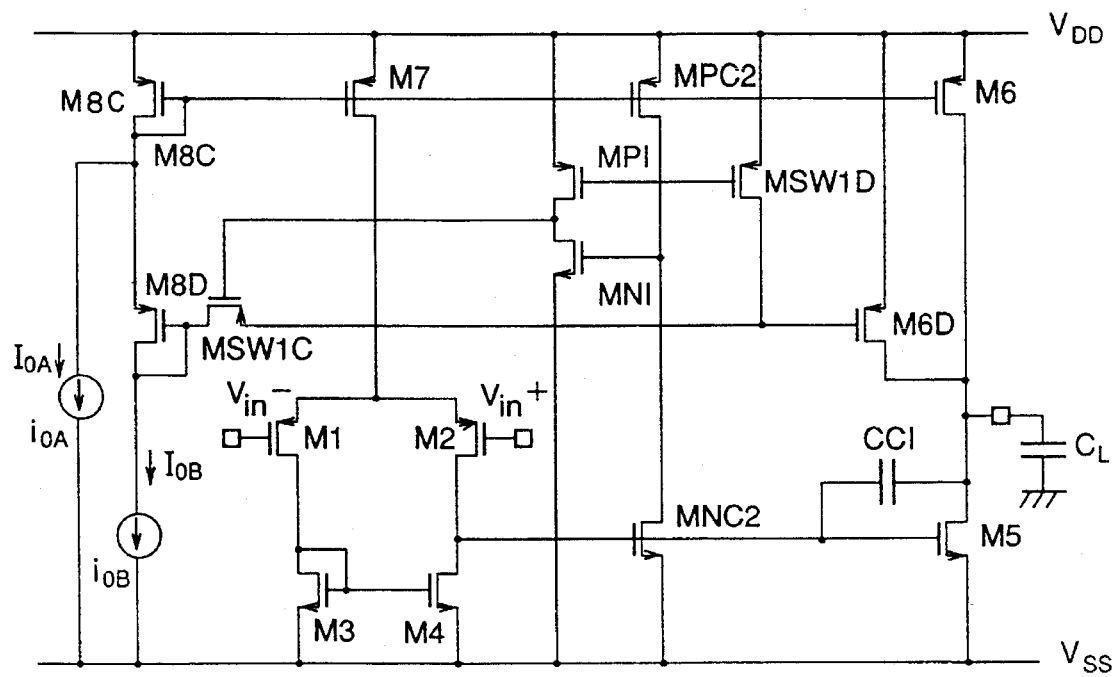
FIG. 19 is a circuit diagram showing a ninth example of the amplifier device according to the third embodiment of the present invention as shown in FIG. 10.

FIG. 19 shows a ninth actual example of the amplifier circuit of the third embodiment shown in FIG. 18 wherein the other output of the input amplifier stage 1a is used in the same manner as in the case of the circuit shown in FIG. 13. The relationship of respective (W/L) factors of the transistors MPC2 and MNC2 constituting the control signal generation means is the same as that in the description of the circuit shown in FIG. 13.

Figure 20:
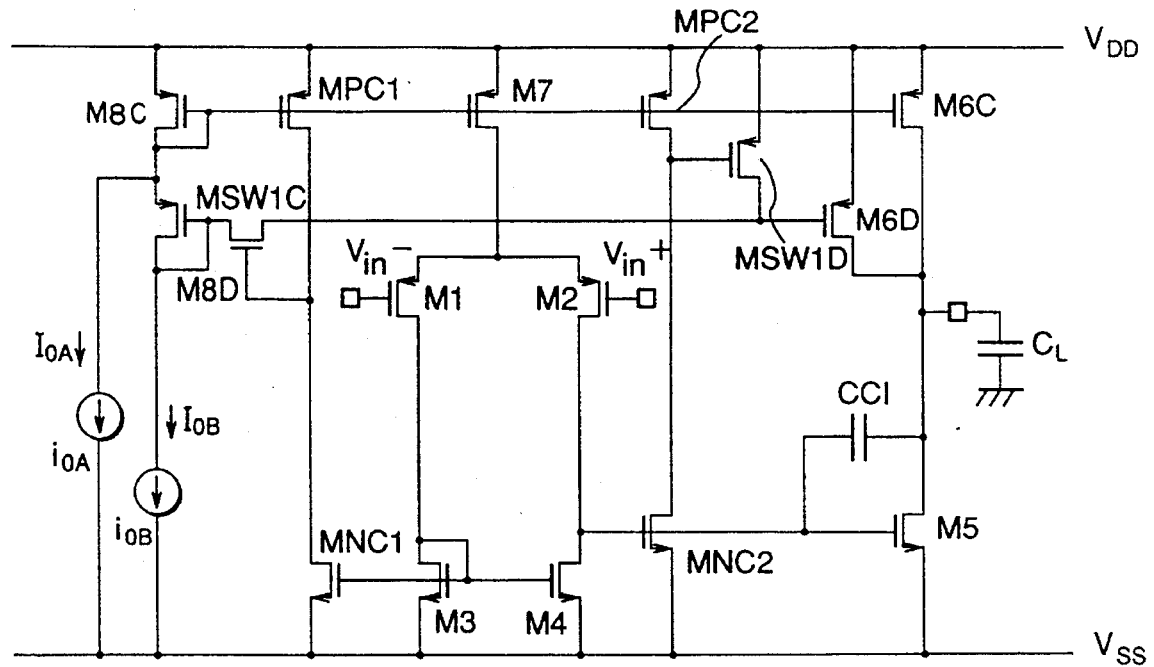
FIG. 20 is a circuit diagram showing a tenth example of the amplifier device according to the third embodiment of the present invention as shown in FIG. 10.

FIG. 20 is a circuit diagram showing a tenth actual example of the amplifier circuit according to the third embodiment shown in FIG. 10.

The circuit shown in this figure is directed to the other modified example of the control signal generation means in the circuit shown in FIG. 18 wherein, in place of the inverting circuit for the control circuit, the control signal generation means is comprised of transistors MPC1, MNC1, MPC2 and MNC2, and positive and negative outputs from the input amplifier means 1a are used. The relationship of respective (W/L) of the transistors MPC1, MNC1, MPC2 and MNC2 is the same as that in the circuit shown in FIG. 11 and 13.

Figure 21:
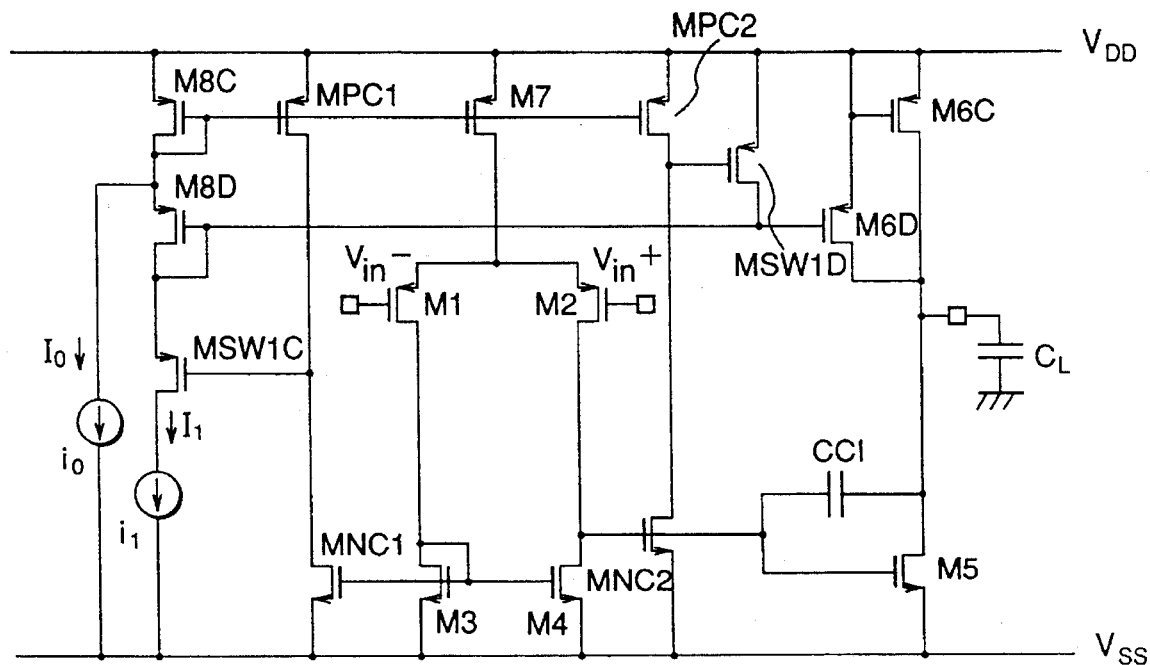
FIG. 21 is a circuit diagram showing a eleventh example of the amplifier device according to the third embodiment of the present invention as shown in FIG. 10.

FIG. 21 shows an eleventh actual example of the amplifier circuit of the third embodiment shown in FIG. 10.

The circuit shown in this figure is directed to the modified example of the circuit shown in FIG. 10 wherein connection of the transistor MSW1C used as a switch is altered, i.e., connection of its gate is the same as above, but the source/drain are connected in series with the drain of the transistor M8D. Effects and/or advantages similar to those in the circuit shown in FIG. 20 can be provided.

An amplifier device according to a fourth embodiment and several actual examples will be described in detail with reference to FIGS. 22 to 30.

Figure 22:
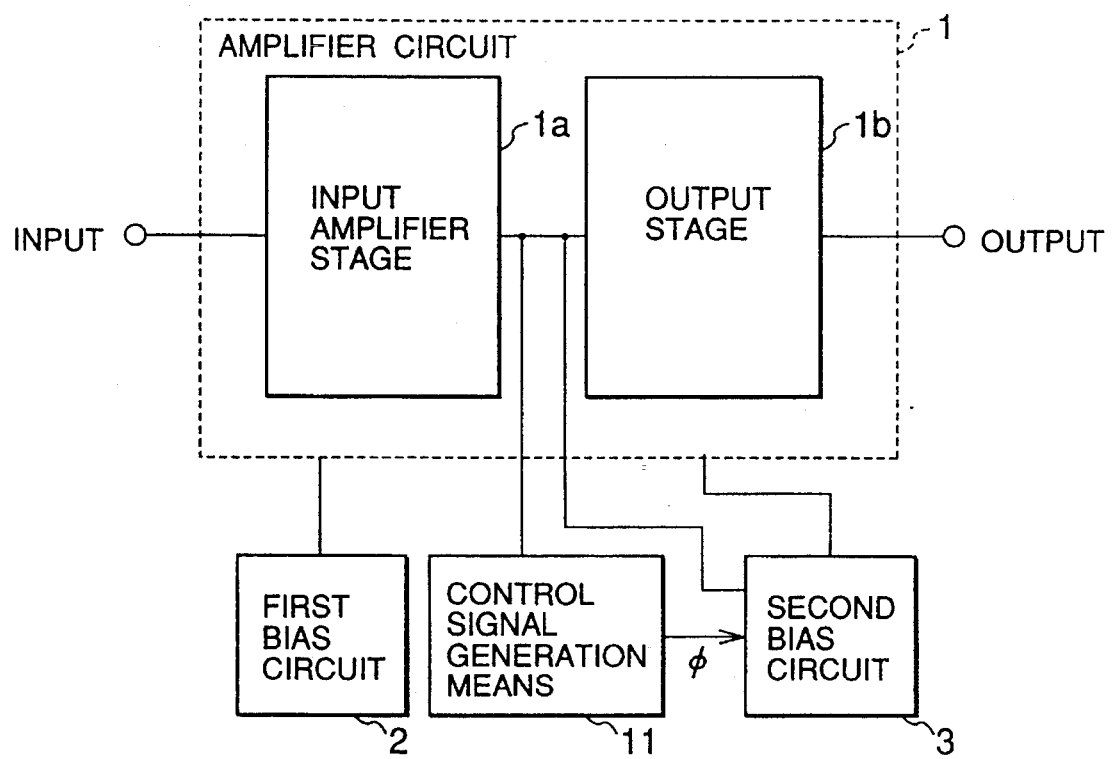
FIG. 22 is a block diagram showing a conceptional construction of an amplifier device according to a fourth embodiment of the present invention.

FIG. 22 shows a block diagram of a circuit of the fourth embodiment in which the second bias circuit 3 is constructed to determine a bias current by an output from the input amplifier stage 1a in a manner as shown in the second embodiment shown in FIG. 8 and the third embodiment shown in FIG. 10.

Since the circuit shown in this figure commonly has the elements of the circuit of the third embodiment shown in FIG. 10 and the elements of the circuit of the second embodiment shown in FIG. 8, a lower power consumption can be realized.

Figure 23:
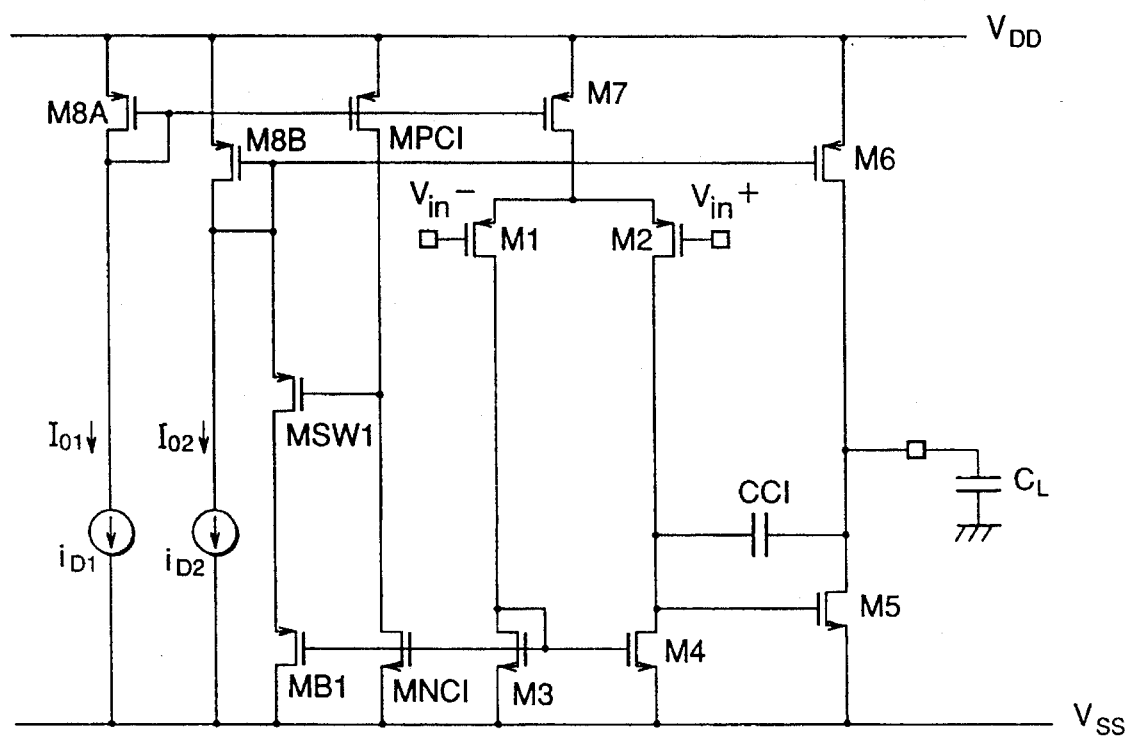
FIG. 23 is a circuit diagram showing a first example of the amplifier device according to the fourth embodiment of the present invention as shown in FIG. 22.

FIG. 23 shows a first actual example of the amplifier circuit according to the fifth embodiment shown in FIG. 22.

The circuit shown in this figure is characterized in that a current source of which current value is determined by an output from the input amplifier stage 1a composed of transistors M1 to M4 is used in place of the constant current source i1 of the second bias circuit in the circuit shown in FIG. 12 disclosed as the second actual example of the circuit of the third embodiment shown in FIG. 10. The current source of this second bias circuit is comprised of a transistor MB1, and an output potential on the drain terminal side of the transistor M3 of the input amplifier stage 1a is applied to the gate of the transistor MB1 to thereby determine a current value in accordance with an output from the input amplifier stage 1a. Thus, since this circuit commonly has the element of the circuit of the second actual example of the third embodiment shown in FIG. 12 and the element of circuit of the actual example of the second embodiment shown in FIG. 9, a lower consumption can be realized.

Figure 24:
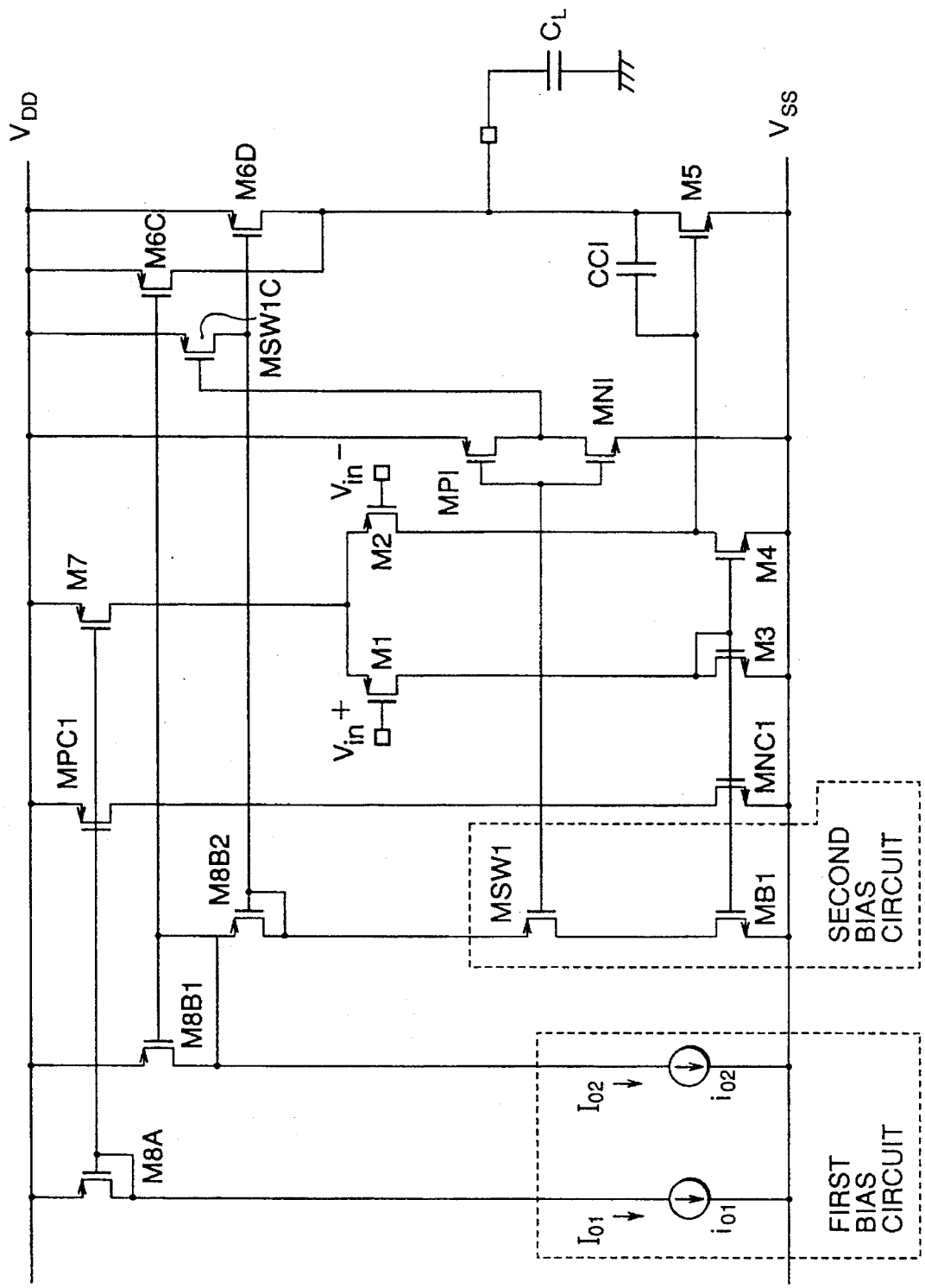
FIG. 24 is a circuit diagram showing a second example of the amplifier device according to the fourth embodiment of the present invention as shown in FIG. 22.

FIG. 24 shows a second actual example of circuit of fourth embodiment shown in FIG. 22.

The circuit shown in this figure is directed to the actual example featured below. In the circuit of the first actual example of the fourth embodiment shown in FIG. 23, the transistor M5 constituting the output stage 1b is divided into two transistor M6C and M6D. Further, the transistor M8B1 and M8B2 connected in series. In addition, a gate potential of the transistor M8B2 is applied to the gate of the transistor M6D. By this configuration (W/L) of the transistor M6D for delivering a current necessary for enhancing the output current driving capability can be reduced, i.e., the area thereof can be reduced.

In addition, an approach may be employed to connect the source of the transistor MSW1C to the gate of the transistor M8B1 in place of VDD thus to make a setting such that the transistor M6D is not completely turned OFF even when the output current driving capability is not enhanced.

Figure 25:
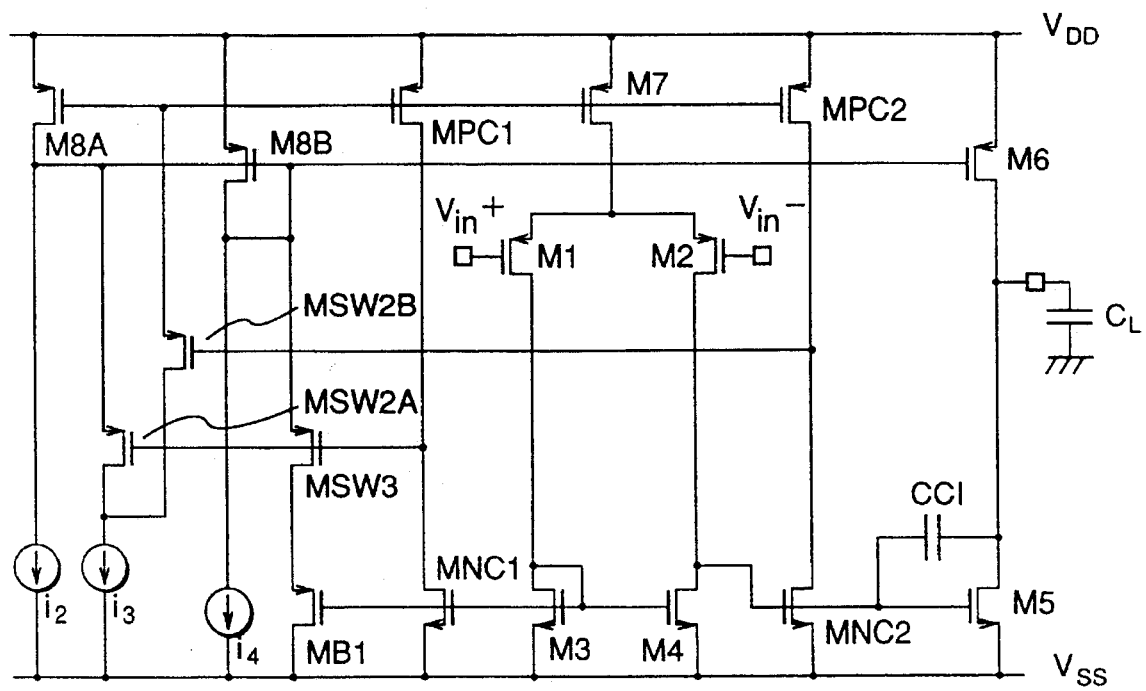
FIG. 25 is a circuit diagram showing a third example of the amplifier device according to the fourth embodiment of the present invention as shown in FIG. 22.

FIG. 25 shows a third actual example of the circuit of the fourth embodiment shown in FIG. 22.

The circuit shown in this figure is directed to the actual example feature below. In the circuit shown in FIG. 14 taken as the fourth actual example of the circuit of the third embodiment shown in FIG. 10, there is used a current source of which current value is determined by an output from input amplifier stage 1a comprised of transistors M1 to M4 in place of the constant current source i5 of the second bias circuit. The current source of the second bias circuit is comprised of a transistor MB1, and an output potential on the drain terminal side of the transistor M3 of the input amplifier stage 1a is applied to the gate of the transistor MB1 to thereby determine a current value in accordance with an output from the input amplifier stage 1a. Thus, since this circuit commonly has the elements of the circuit shown in FIG. 14 and the elements of the circuit shown in FIG. 9, a lower power consumption can be realized.

Figure 26:
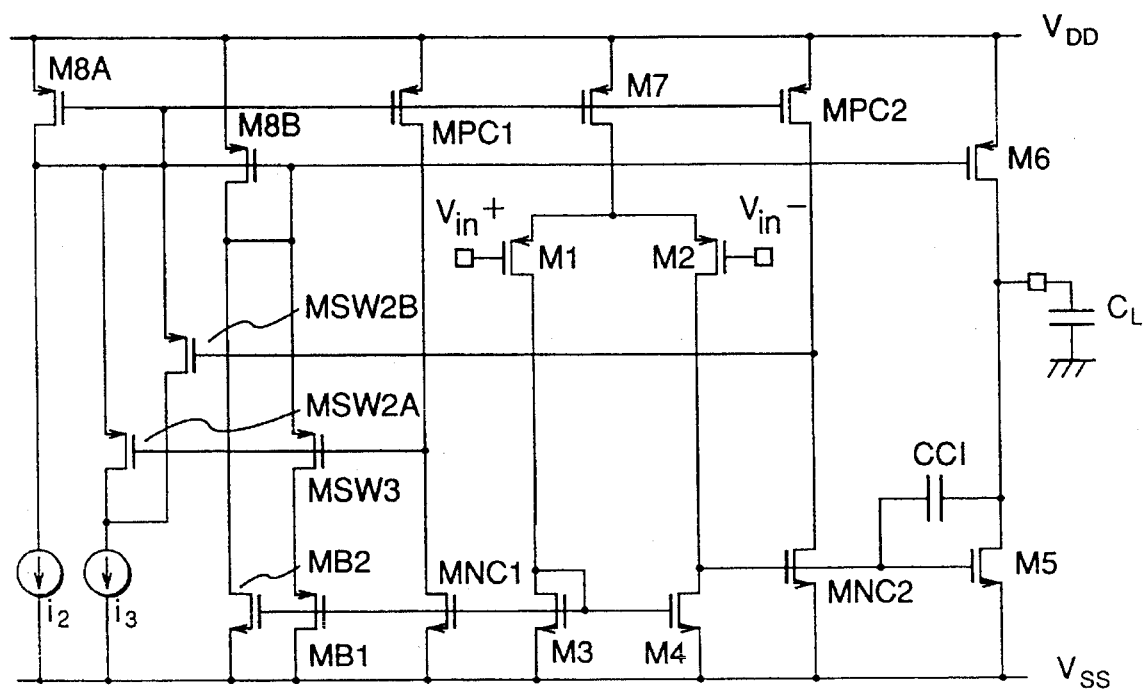
FIG. 26 is a circuit diagram showing a fourth example of the amplifier device according to the fourth embodiment of the present invention as shown in FIG. 22.

FIG. 26 shows a fourth actual example of the circuit of the fourth embodiment shown in FIG. 22.

The circuit shown in this figure is characterized in that the circuit value of the current source i4 for biasing the output stage of the first bias circuit in the circuit of the third actual example of the circuit of the fourth embodiment shown in FIG. 25 is determined by an output from the input amplifier stage 1a in the same manner as in the current source of the second bias circuit. In this circuit, current source i4 is comprised of a transistor MB2. Thus, since the output current is controlled in dependence upon a difference between input potentials Vin+ and Vin− even when the output current driving capability is not enhanced because potentials Vin+ and Vin− are substantially equal to each other, a lower power consumption can be realized.

Figure 27:
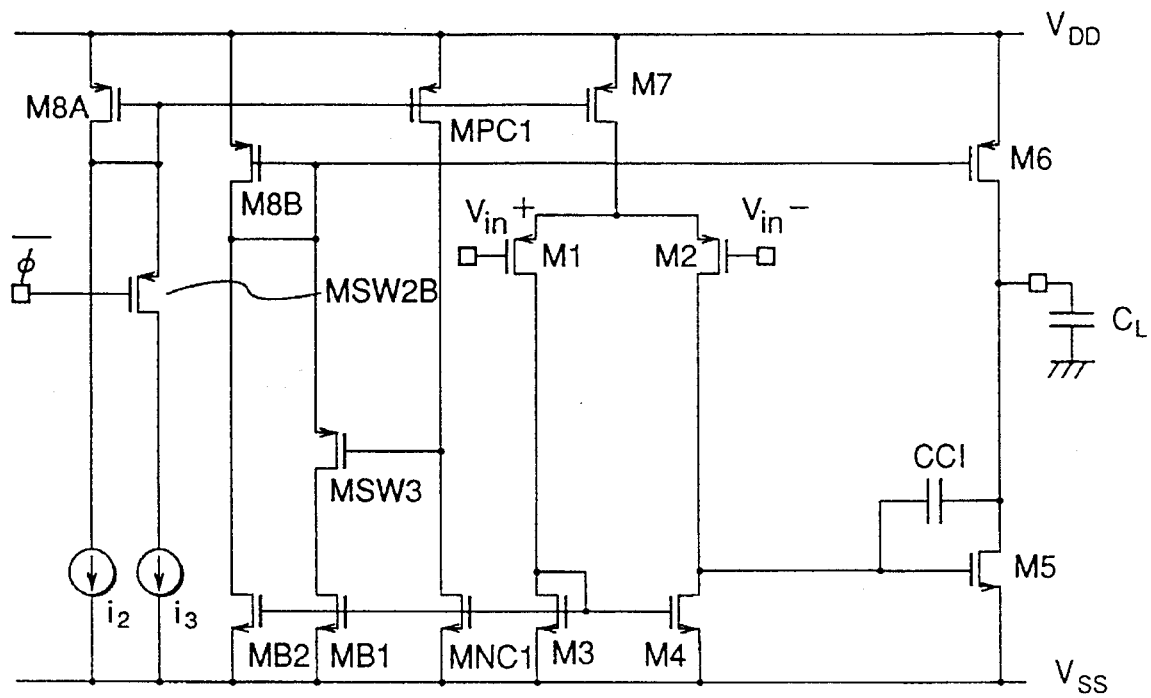
FIG. 27 is a circuit diagram showing a fifth example of the amplifier device according to the fourth embodiment of the present invention as shown in FIG. 22.

FIG. 27 shows a fifth actual example of the circuit of the fourth embodiment shown in FIG. 22.

The circuit shown in FIG. 27 is directed to the example where a constant current source of which current value is determined by an output from the input amplifier stage 1a comprised of transistors M1 to M4 is used in place of the constant current source i5 of the second bias circuit in the circuit shown in FIG. 15 taken as the fifth actual example of the third embodiment shown in FIG. 10 the current source of the second bias circuit is comprised of a transistor MB1, and an output potential on the drain terminal side of the transistor M3 of the input amplifier stage 1a is applied to the gate of the transistor MB1 to thereby determine a current value in dependence upon an output from the input amplifier stage 1a. Thus, since this circuit commonly has the elements of the circuit of the fifth actual example of the third embodiment shown in FIG. 15 and the elements of the circuit of the actual example of the second embodiment can be realized.

Figure 28:
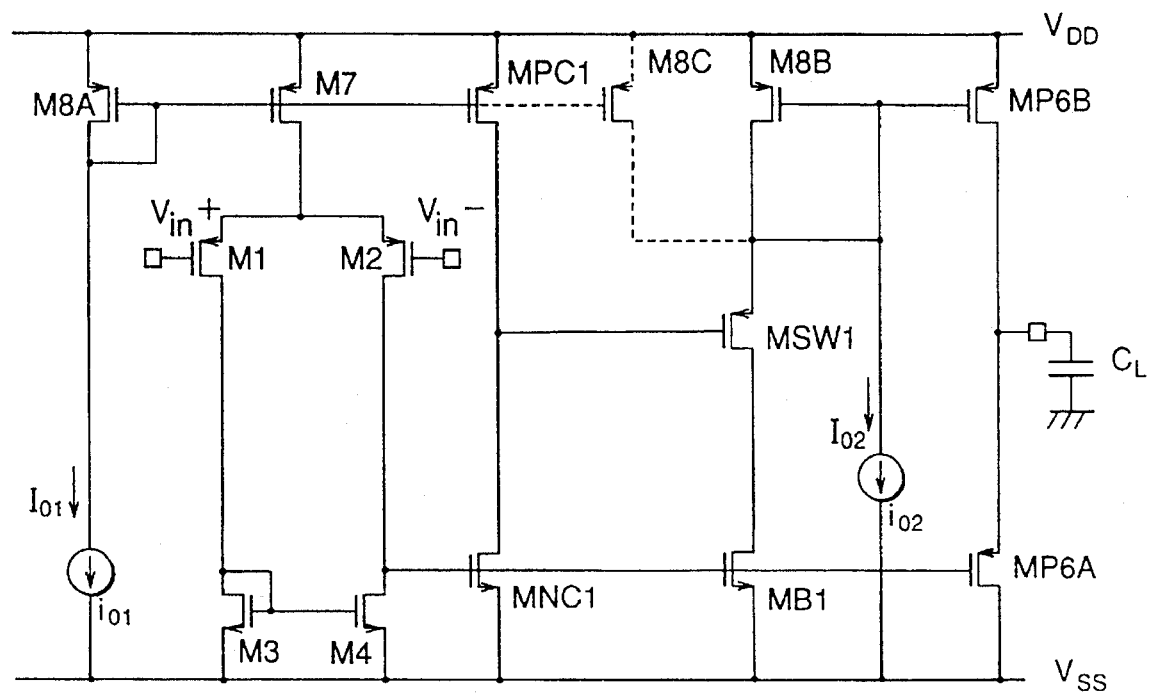
FIG. 28 is a circuit diagram showing a sixth example of the amplifier device according to the fourth embodiment of the present invention as shown in FIG. 22.

FIG. 28 shows a sixth actual example of the circuit of the fourth embodiment shown in FIG. 22.

The circuit shown in FIG. 28 is directed to the actual example featured below. In the circuit shown in FIG. 17 taken as the seventh actual example of the third embodiment shown in FIG. 10, by dividing the transistor M8 into transistors M8A and M8B, the path for delivering the bias current to the input amplifier stage 1a and the output stage 1b comprised of source follower is divided to allow the bias current delivered to the input amplifier stage 1a to be only the bias current IO1 delivered from the first bias circuit, and to determine, in accordance with an output from the input amplifier stage 1a, a bias current delivered from the second bias circuit to the output stage 1b which is most closely related to the slew rate and power consumption. The current source of the second bias circuit is comprised of a transistor MB1, and its gate is connected to the output terminal of the input amplifier stage 1a. The bias current delivered from the transistor MB1 is determined by output level of the input amplifier stage 1a. The bias current delivered from the transistor MB1 is determined by output level of the input amplifier stage 1a. Namely, when Vin+ becomes equal to a potential higher than Vin− to some extent, the transistor MSW1 is turned ON as described with reference to FIG. 17. As a result, a bias current corresponding to a difference between Vin+ and Vin− to the output stage to increase a current delivered from the transistor MP6B constituting the current source of the source follower thus to enhance the output current driving capability.

Further, as indicated by the wiring of dotted lines in FIG. 28, an approach may be employed to sink a current flowing in the transistor MB1 by the transistor M8c when potentials of Vin+ and Vin− are equal to each other to reduce changes in the bias current of the source follower of the output stage 1b when the operating state shifts from the state where the output current driving capability is not enhanced to thereby reduce changes in the gate-source voltage of the transistor MP6A, thus making it possible to shorten the following time of the gate-source voltage change of the transistor MP6A.

Figure 29:
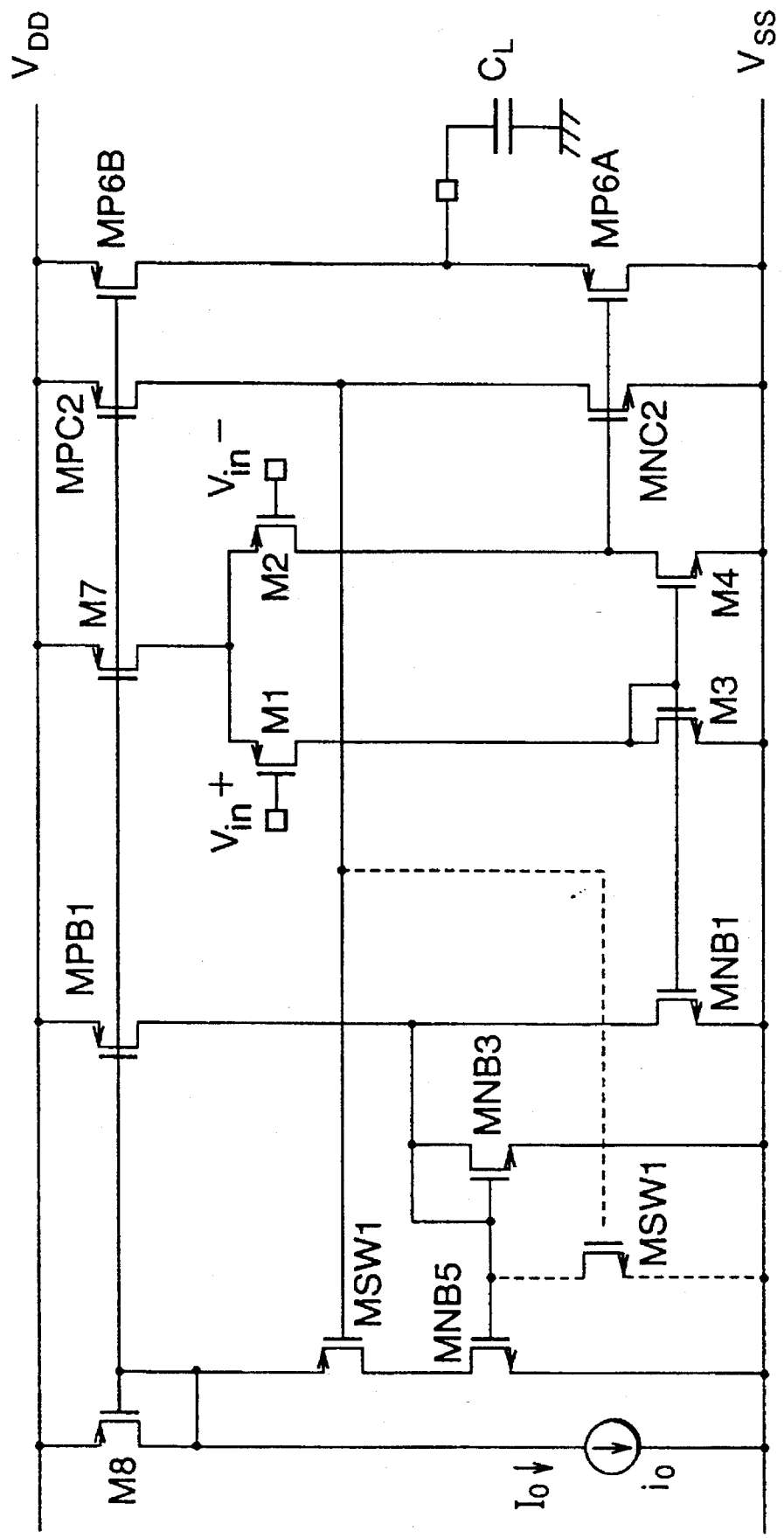
FIG. 29 is a circuit diagram showing a seventh example of the amplifier device according to the fourth embodiment of the present invention as shown in FIG. 22.

FIG. 29 shows a seventh actual example of the circuit of the fourth embodiment shown in FIG. 22.

The circuit shown in this figure is directed to the example where the current value of the current source i1 of the second bias circuit is determined by using an output from the input amplifier stage 1a in the circuit shown in FIG. 17 taken as the seventh actual example of the third embodiment shown in FIG. 10. In this example, the current source of the second bias circuit is comprised of transistors MNB1, MNB3, MNB5 and MPB1 and the intermittent switch for bias current from the current source of the second bias circuit is comprised of a transistor MSW1. As described with reference FIG. 17, when the potential vin+ is not higher than potential Vin− to some extent, the transistor MSW1 is turned OFF by a control signal generated from the control signal generation means comprised of transistors MPC2 and MNC2. As a result, the bias current of the second bias circuit is cut off. In contrast, when the potential Vin+ is higher than the potential Vin− to some extent, the transistor MSW1 is turned ON by a control signal generated from the control signal generation means to add a bias current of the second bias circuit to a bias current IO of the first bias circuit. The circuit of the seventh actual example operates as follows. When the potential Vin+ is higher than potential Vin−, a current flowing in the transistor M3 is smaller than that when the potentials Vin+ and vin− are equal to each other, the drain potential of the transistor M3 is lowered, and a current flowing in the transistor MNB1 is decreased. Since a current flowing in the transistor MNB8 is a difference between a current flowing in the transistor MNB1, it is increased. Thus, the bias current flowing in the transistor MNB5 is increased. As stated above the magnitude of the current flowing in the transistor MNB5 is determined by the drain potential of the transistor M3 serving as an output from the input amplifier stage 1a.

In order to reduce changes in the bias current of the source follower of the output stage 1b when the operating state shifts from the state where the output current driving capability is enhanced to the state where the output current driving capability is not enhanced to reduce changes in the gate-source voltage of the transistor MP6A thus to shorten the following time of changes in the gate-source voltage of the transistor MP6A, it is sufficient to allow a current flowing in the transistor MNB1, e.g., when the potentials Vin+ and Vin− are equal to each other to be equal a current delivered from the transistor MPB1.

Further, the ON/OFF operation of the bias current of the second bias circuit may be connected by using a transistor of the NMOS type as indicated by dotted lines in FIG. 29.

Figure 30:
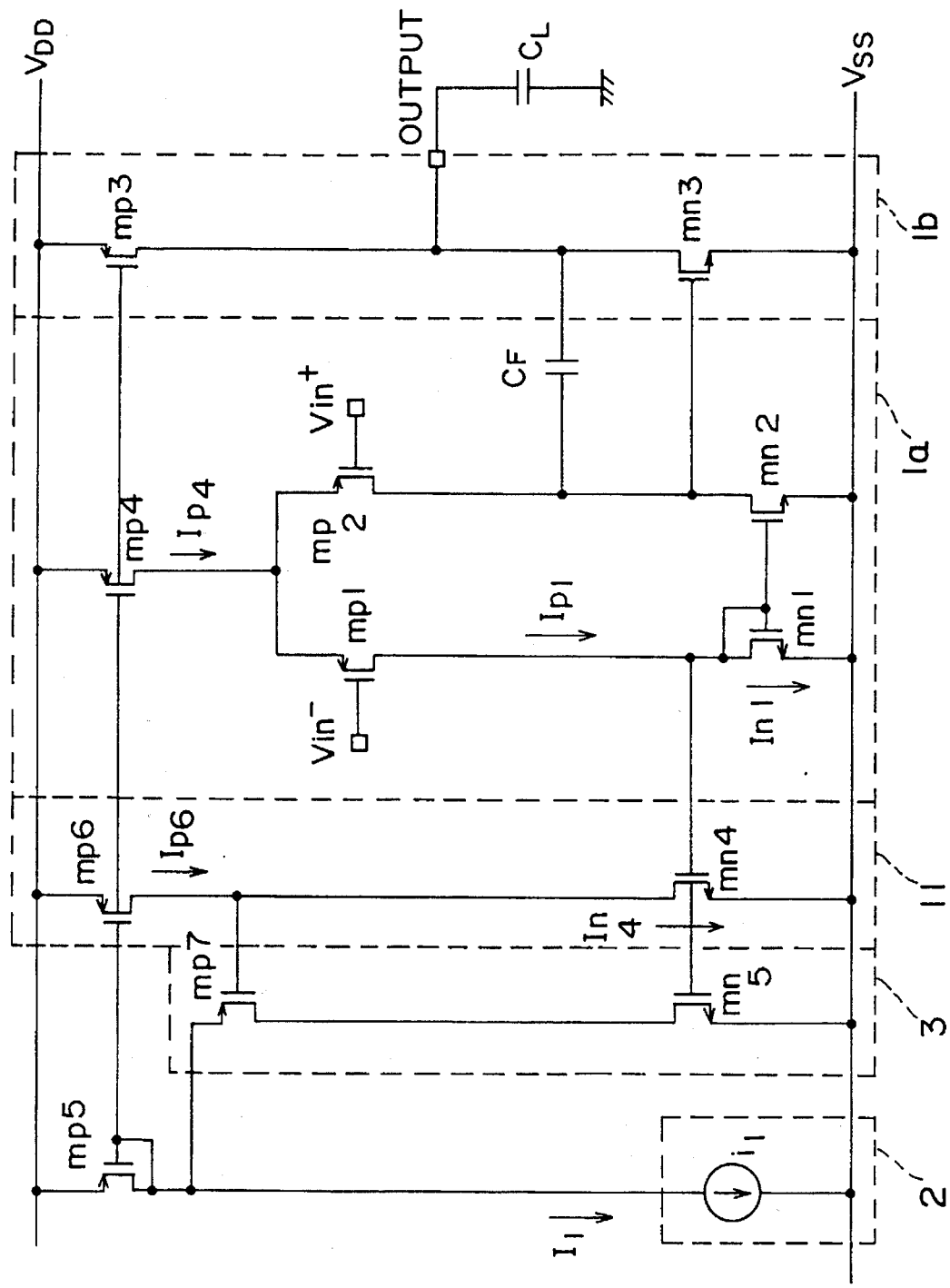
FIG. 30 is a circuit diagram showing a eighth example of the amplifier device according to the fourth embodiment of this invention as shown in FIG. 22.

In the fourth embodiment, it may be possible to constitute an amplifier circuit of an eighth example shown in FIG. 30. In FIG. 30, the FET mn5 is provided to the drain side of the FET mp7 by the cascade connection, and the gate electrode of the FET mn5 is commonly connected to the gate electrode of the FET mn4. In this eighth example, the current source i1 corresponds to the first bias circuit 2, the FETS mp7 and mn5 correspond to the second bias circuit, and the FETS mp6 and mn4 correspond to the control signal generation means 11.

Next, an amplifier device according to a fifth embodiment and its actual examples will be described in detail with reference to FIGS. 31 to 35.

Figure 31:
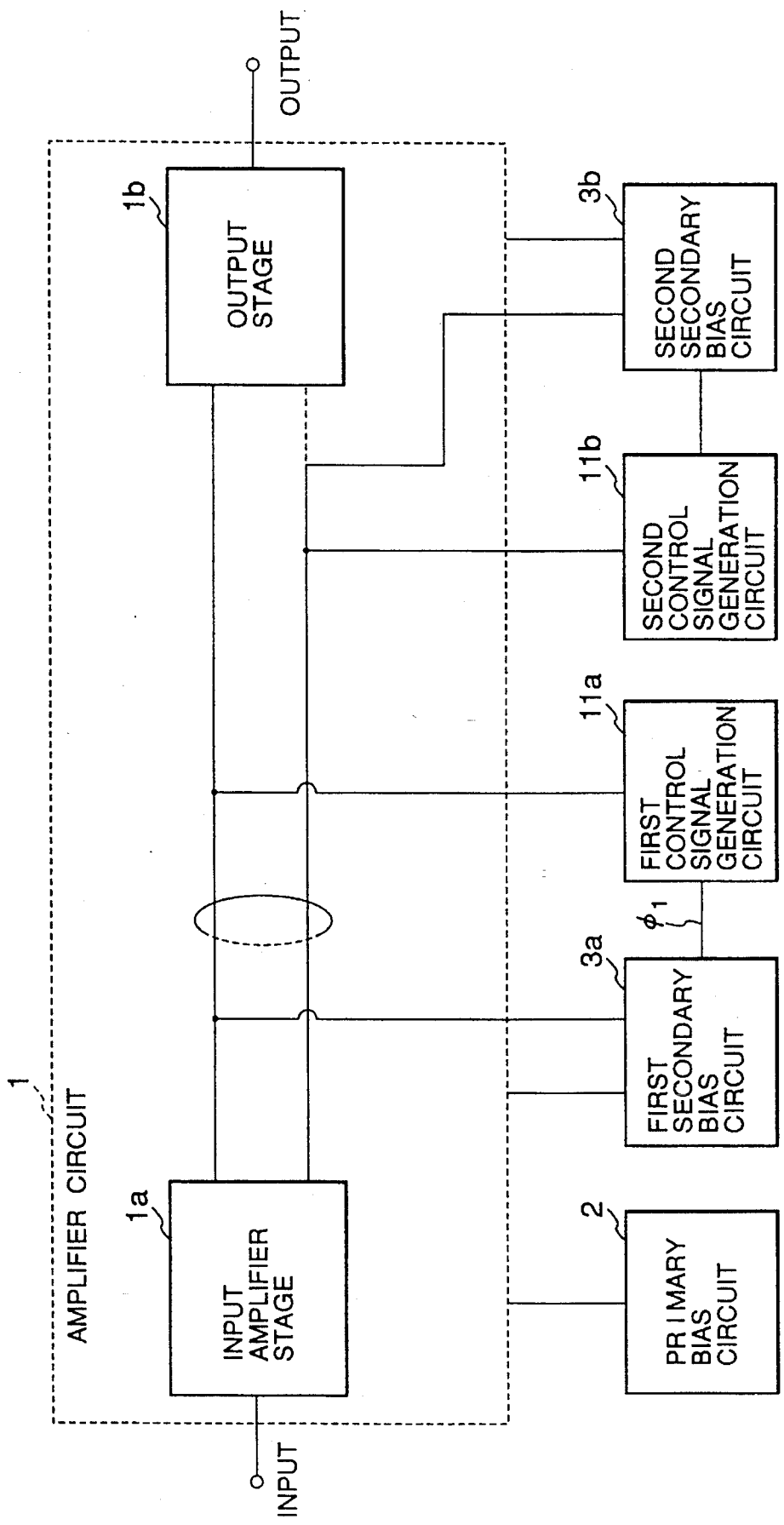
FIG. 31 is a block diagram showing a conceptional construction of amplifier device according to a fifth embodiment of the present invention.

FIG. 31 is a block diagram showing a conceptional construction of an amplifier device according to a fifth embodiment of the present invention. In the figure, the amplifier device comprises an amplifier circuit means 1 including an input amplifier stage 1a and an output stage 1b, a primary bias circuit 2 for supplying a bias current, and two pairs of a secondary bias circuit and a control signal generation means. One is a first secondary bias circuit 3a and a first control signal generation circuit 11a, and another is a second secondary circuit 3b and a second control signal generation circuit 11b. These two stage configuration functions switch means for switching a current drive capability of the amplifier circuit means 1.

FIGS. 32–35 are circuit diagrams showing a first to a fourth actual examples, respectively, each of which shows the fifth embodiment shown in FIG. 31.

Figure 32:
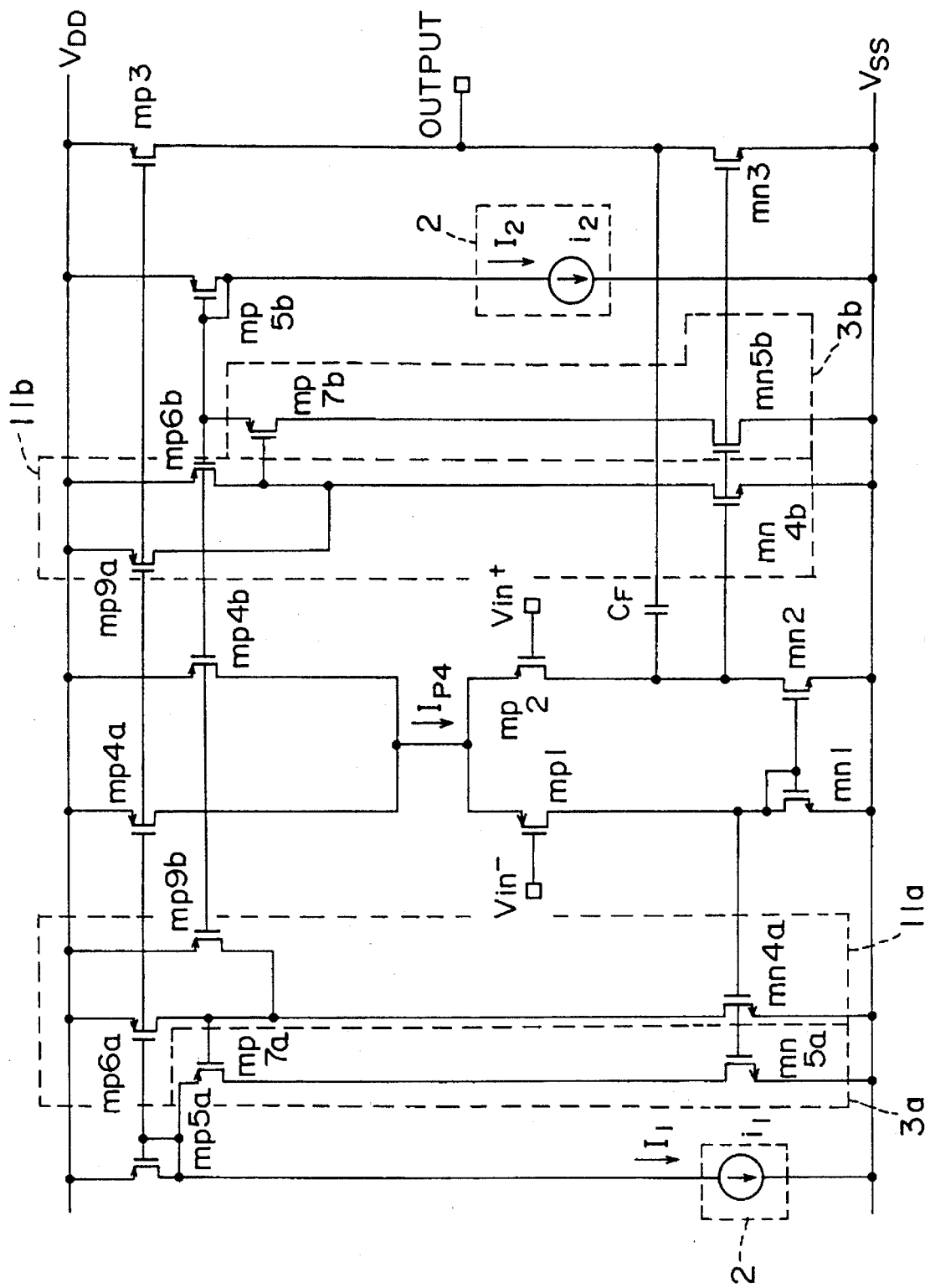
FIG. 32 is a circuit diagram showing a first example of the amplifier device according to the fifth embodiment of the present invention as shown in FIG. 31.

In FIG. 32, field effect transistors (FETS) mn5a and mn5b are connected to FETS mp7a and mp7b by a cascade connection, and gate electrodes of the FETS mn5a and mn5b are commonly connected to gate electrodes FETS mn4a and mn4b, respectively. In this example, FETS mn5a and mn5b have a function as voltage-current conversion means and FETS mp7a and mp7b as switch means.

Figure 33:
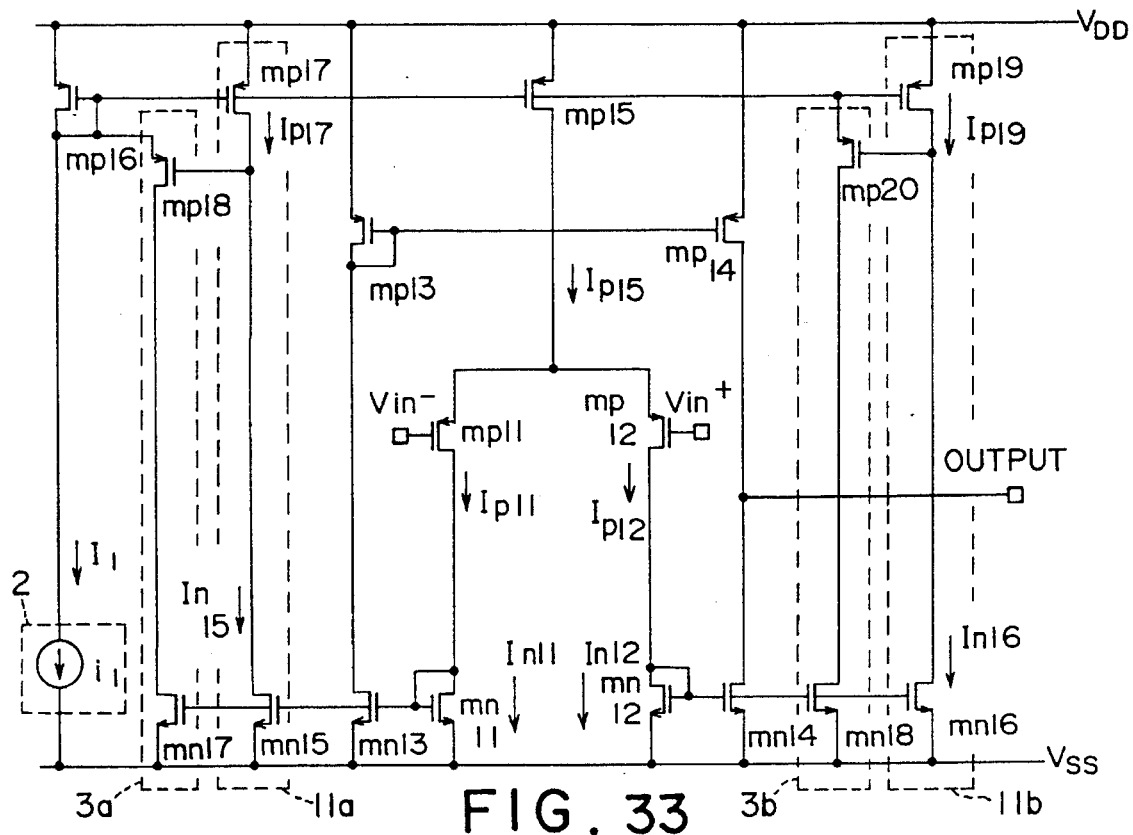
FIG. 33 is a circuit diagram showing a second example of the amplifier device according to the fifth embodiment of the present invention as shown in FIG. 31.

In FIG. 33, FETS mn17 and mn18 are connected to FETS mp18 and mp20 by a cascade connection, and gate electrodes of the FETS mn17 and mn18 are commonly connected to gate electrodes FETS mn15 and mn16 (or mn14), respectively. In this example, the FETS mn17 and mn18 function as the voltage-current conversion means, and the FETS mp18 and mp20 as the switching means for supplying a converted current to current addition means.

Figure 34:
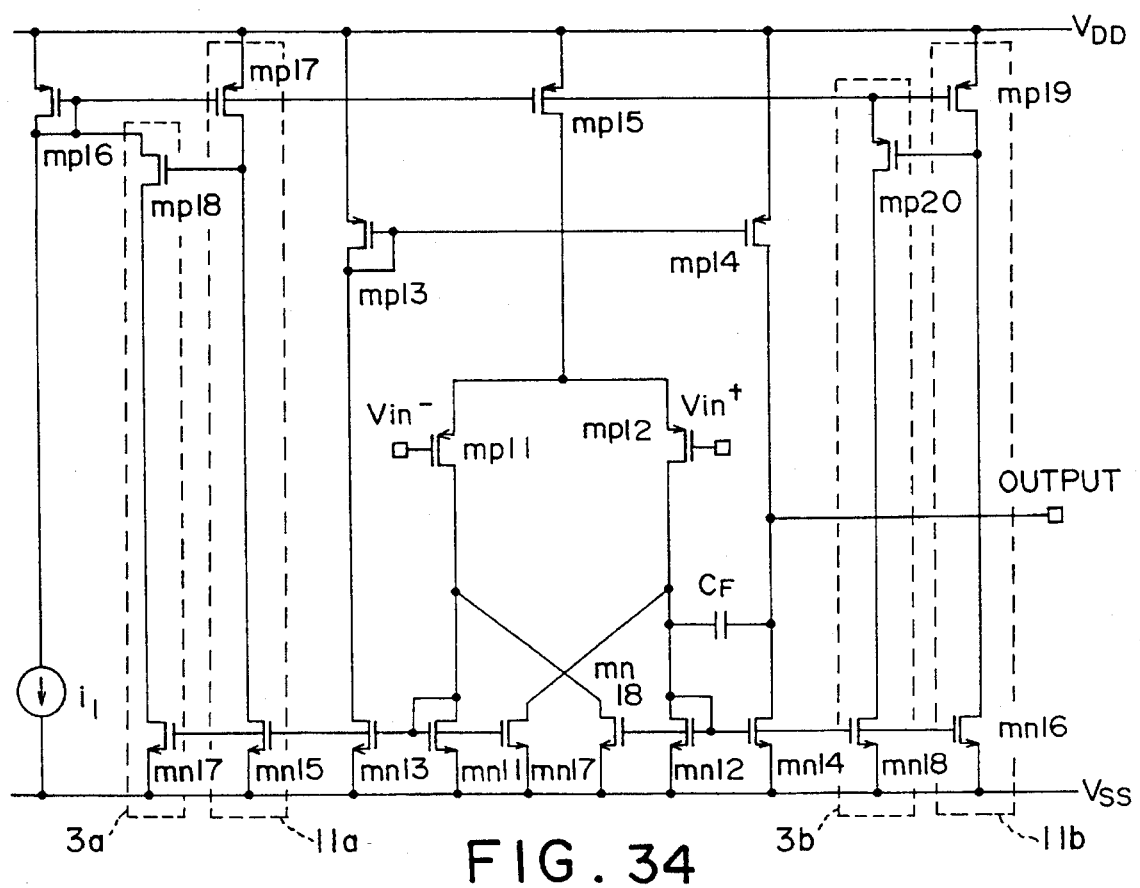
FIG. 34 is a circuit diagram showing a third example of the amplifier device according to the fifth embodiment of the present invention as shown in FIG. 31.

In FIG. 34, the FETS mn17 and mn18 are connected to the FETS mp18 and mp20 by a cascade connection, and gate electrodes of the FETS mn17 and mn18 are commonly connected to the gate electrodes the FETS mn15 and mn16 (or mn14), respectively. In this example, the FETS mn17 and mn18 function as means for generating a current for increasing a current drive capability, and the FETS mp18 and mp20 are used as the switching means for supplying the current which is generated in the FETS mp18 and mp20.

Figure 35:
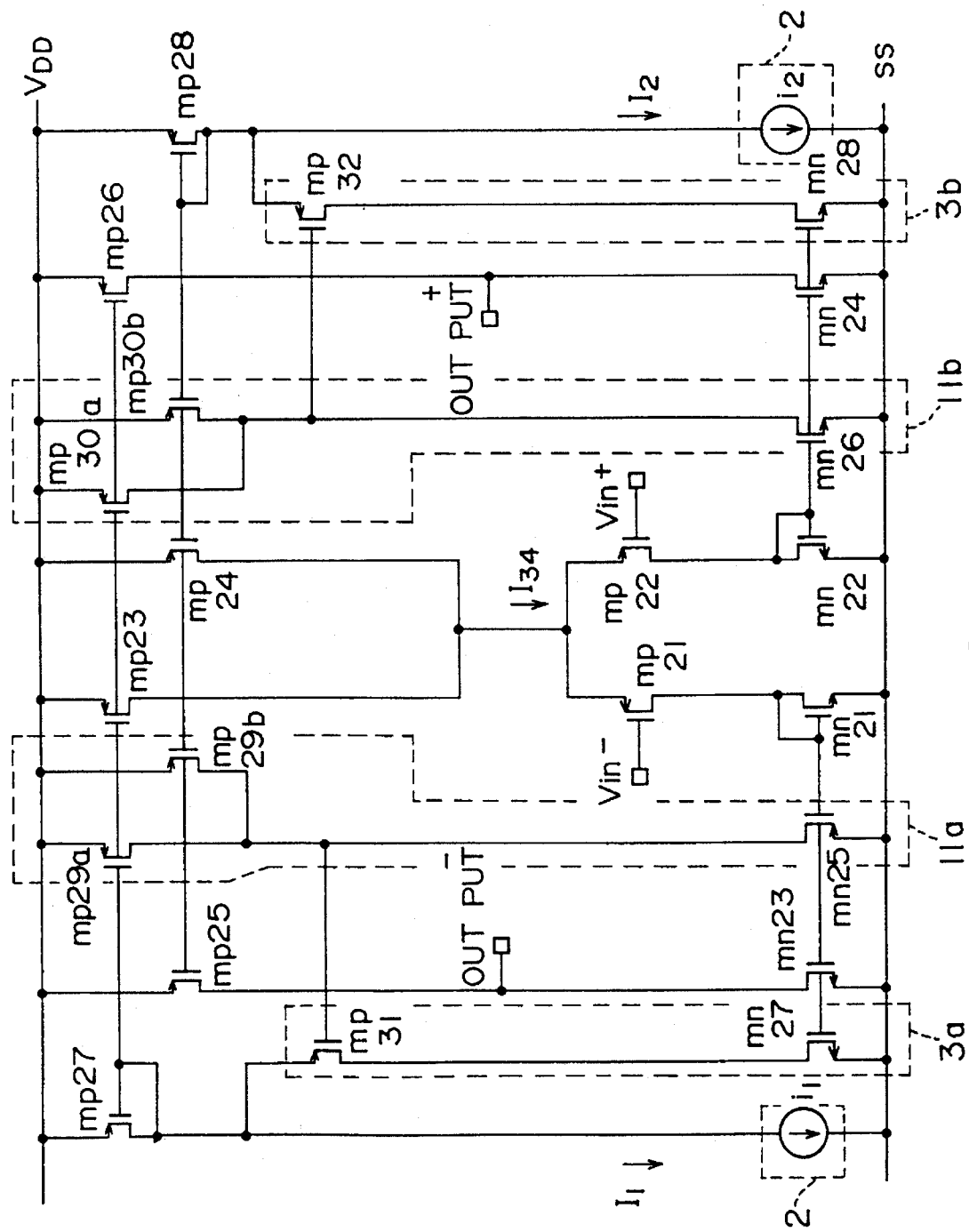
FIG. 35 is a circuit diagram showing a fourth example of the amplifier device according to the fifth embodiment of the present invention as shown in FIG. 31.

In FIG. 35, FETS mn27 and mn28 are connected to FETS mp31 and mp32 by a cascade connection, and gate electrodes of the FETS mn27 and mn28 are connected to gate electrodes of FETS mn23 and mn24, respectively. In this example, a current which is converted by the FETS mn27 and mn28 is controlled to be turned ON or OFF by the FETS mp31 and mp32, and is added to the current addition means when the FETS mp31 and mp32 are turned ON.

In the first to fourth example of the fifth embodiment shown in FIGS. 32–35, a current flowing to the output stage is lower when there is no input signal, and the current drive capability is caused to increase only when the input signal is supplied, thereby increasing the bias current of the output stage by connecting the switch means. In such a configuration, it is possible to increase the current drive capability only when the input signal is supplied, without the increase of the power consumption.

An amplifier device according to a sixth embodiment and its actual example will now be described in detail with reference to FIGS. 36 and 37.

Figure 36:
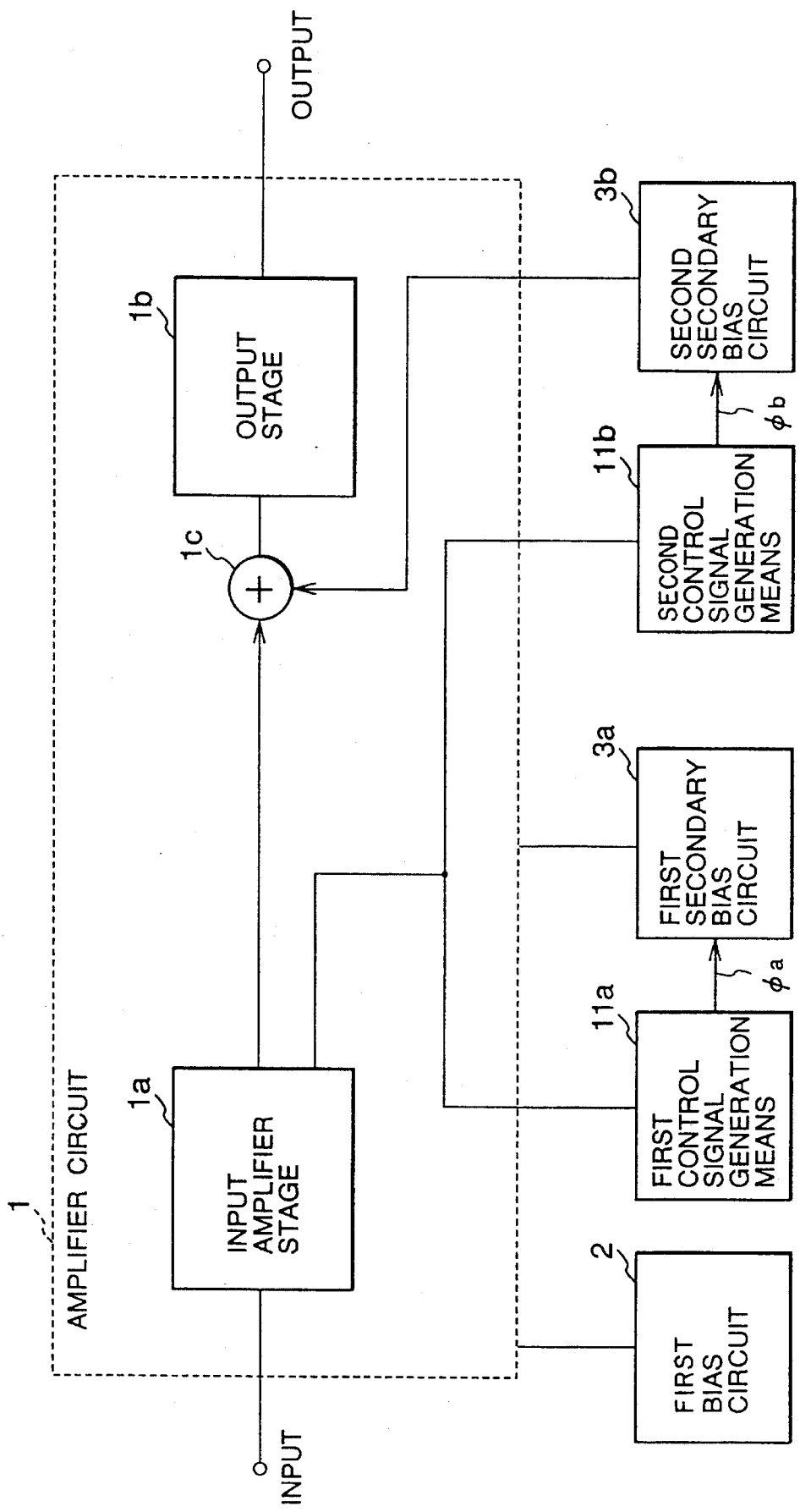
FIG. 36 is a block diagram showing a conceptional construction of an amplifier device according to a sixth embodiment of the present invention.

FIG. 36 is a block diagram of an amplifier device according to the sixth embodiment, which comprises an amplifier circuit 1 including an input amplifier stage 1a, an output stage and an addition means 1c, a first bias circuit 2 connected to the amplifier circuit 1, a first control signal generation means 11a connected to the input amplifier stage 1a, a first secondary bias circuit 3a connected to the first control signal generation means 11a and the amplifier circuit 1, a second control signal generation means 11b connected to the input amplifier stage 1a, and a second secondary bias circuit 3b connected to the second control signal generation means 11b and the addition means 1c.

In this configuration, since the function which improves the output drive capability is divided into two systems; one of them includes the first control signal generation means 11a and the first secondary bias circuit 3a, the other includes the second control signal generation means 11b and the second secondary bias circuit 3b.

Figure 37:
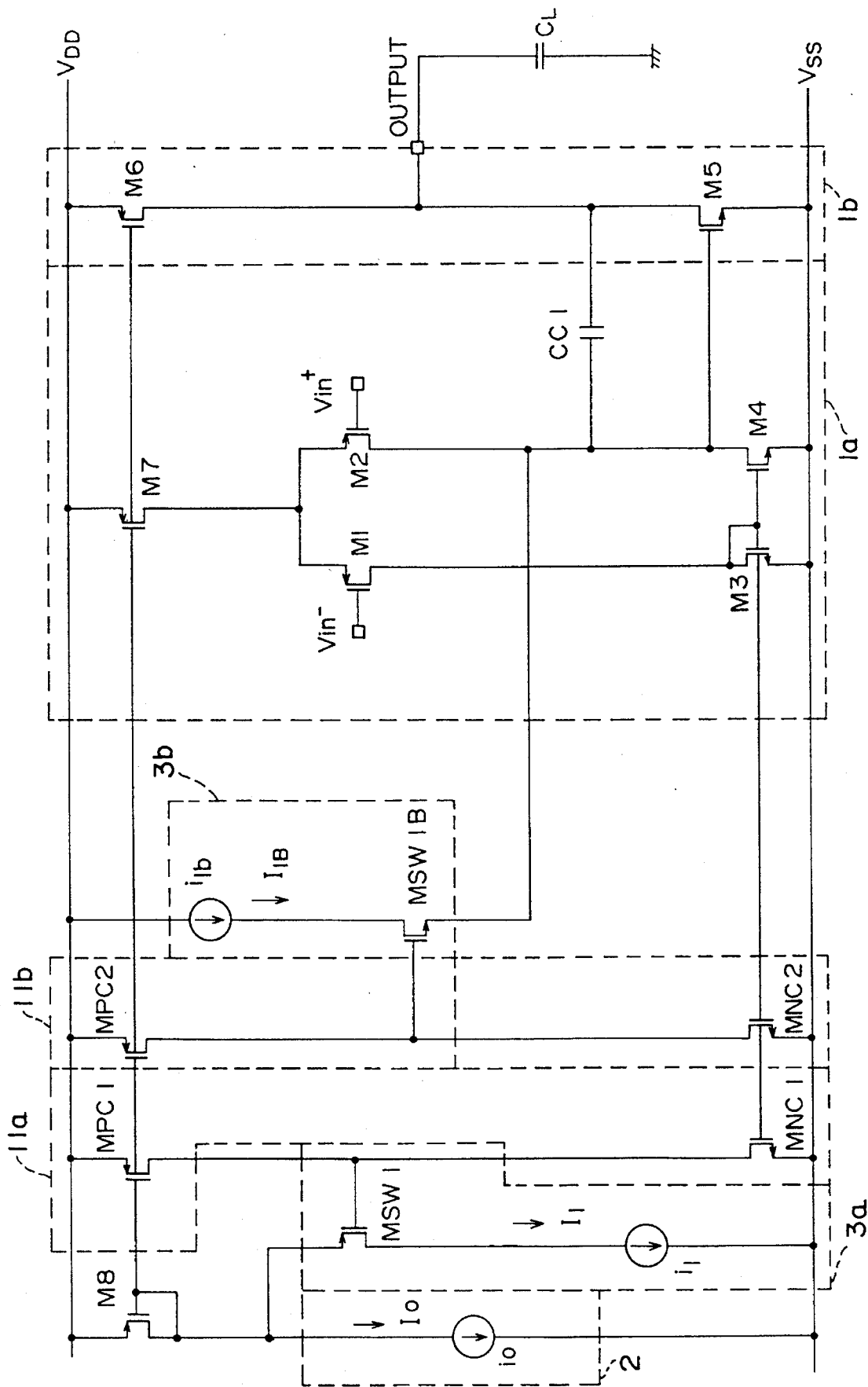
FIG. 37 is a circuit diagram showing an example of the amplifier device according to the sixth embodiment of the present invention as shown in FIG. 36.
Figure 38:
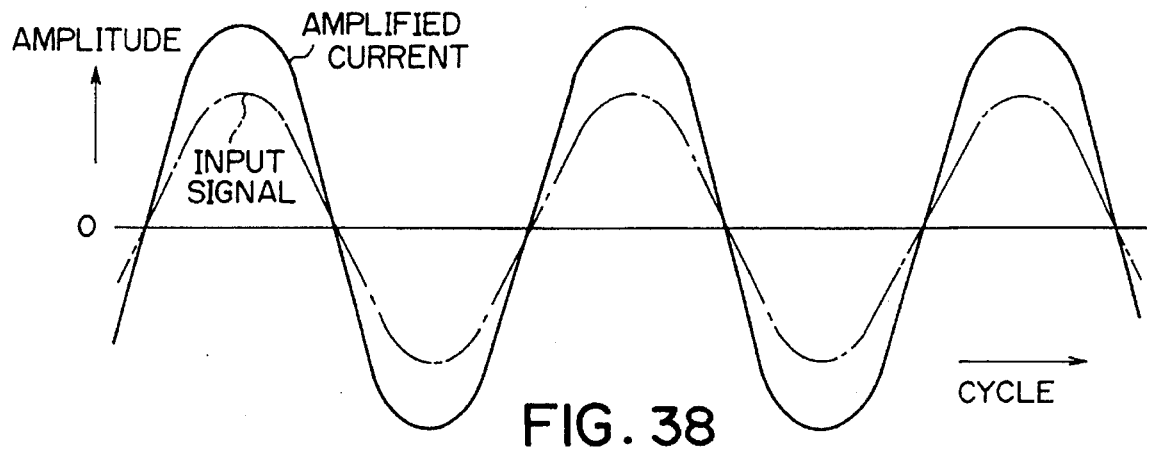
FIG. 38 is a characteristic diagram showing operation of a class-A amplifier.

FIG. 37 shows an amplifier device of an actual example of the sixth embodiment shown in FIG. 36.

In FIG. 37, the input amplifier stage 1a comprises transistors M1–M4 and M7, the output stage 1b comprises transistors M5 and M6, the first bias circuit 2 comprises a constant current source i0, the first control signal generation means 11a comprises transistors MPC1 and MNC1, the first secondary bias circuit 3a comprises a constant current source i1 and a transistor MSW1, the second control signal generation means 1ib comprises transistors MPC2 and MNC2, and the second secondary bias circuit 3b comprises a constant current source i1b and a transistor MSW1B.

The circuit shown in FIG. 37 can improve a slew rate when a voltage Vin+ becomes larger than Vin− to be more than a predetermined value.

Accordingly, the circuit shown in FIG. 37 improves the slew rate at a trailing edge when the difference between Vin− and Vin+ becomes larger because Vin− is larger than Vin+. As described above, the transistors MPC2 and MNC2 form the second control signal generation means 11b as the same as the transistors MPC1 and MNC1 forming the first control signal generation means 11a, and the current source i1b and transistor MSW1B form the second secondary bias means 3b (as the same as i1 and MSW1 forming the first bias circuit 3a). The transistors MPC2 and MNC2 has a (W/L) set to the following condition to be satisfied;

$$\{(W/L)_{MPC2}/(W/L)_{M2}\} < \tfrac{1}{2} \{(W/L)_{MNC1}/(W/L)_{M3}\}$$

When the difference between Vin− and Vin+ becomes more than the predetermined value, a current supplied from the transistor M7 flows almost to the side of the transistor M2 constructing a differential pair and little current flows to the transistor M1, thereby reducing a potential of the drain which is one of outputs of the input amplifier stage. By this, since the gate potential of the transistor MNC2 decreases so as to reduce the drain current of the transistor MNC2, the potential of the transistor MNC2, which forms the control signal generation means with the transistor MPC2, increases as an output of the control signal generation means, so that the MSW1B of the second secondary bias circuit is turned ON to thus add the bias current $I_{1B}$ with another output of the input amplifier stage. Because the slew rate at the trailing edge is determined by a phase compensation capacitance CC1 and the maximum output current from the input amplifier stage, the slew rate at the trailing edge is improved when the difference between Vin− and Vin+ becomes the value larger than the predetermined value. When the difference between Vin− and Vin+ is small, the substantially same current flows in the transistors M1 and M2, the drain current of the transistor MNC2, which forms the control signal generation means 11$b$ with the transistor MPC2, decreases to maintain the transistor MSW1B turned OFF. Accordingly, a current from the second secondary bias means 3$b$ is not added to the output of the input amplifier stage, thereby preventing unnecessary power consumption.

The amplifier device according to the above first to sixth embodiments, is applicable to any kind of amplifiers such as classes-A, -B and -C. However, in amplifier devices seventh to tenth embodiments which will be mentioned below, operational characteristics of the amplifier devices are limited in the class-C amplifier. Moreover, a disclosure with respect to the seventh to twelfth embodiment is new matter by the CIP application also including the disclosure with respect to FIGS. 3, 4 and 30–40.

Figure 39:
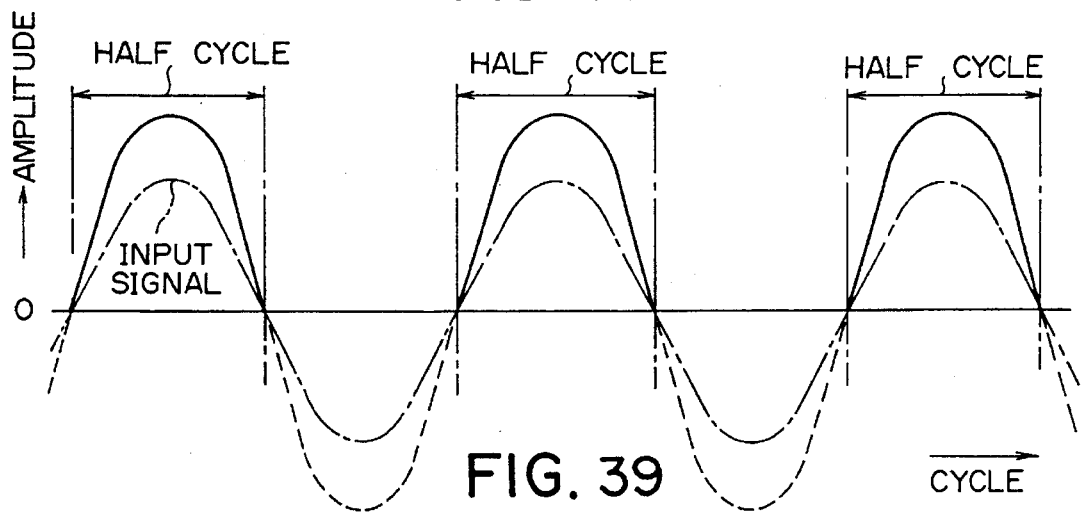
FIG. 39 is a characteristic diagram showing operation of a class-B amplifier.

Here, the above-mentioned terms will be defined to provide an interpretative guide. Class-A amplifiers are transistor amplifiers for operating at a linear portion of collector characteristics in the entire period of operation. In the case of extending a concept over electronic tube at large, the class-A amplifiers are amplifiers in which a plate current flows through the entire period of changes by an alternating current signal after properly selecting a grid bias. Accordingly, characteristics thereof are shown in FIG. 39.

Class-B amplifiers are amplifiers for operating in the manner that a collector current flows in a substantially half period of the input signal cycle by setting a bias nearly a cut-off period. Here, there may be called as class-B push-pull amplifier in which two amplifiers connected by a push-pull and performing class-B operation alternately supply a current to the load every half cycle of the input signal. Since the class-B push-pull amplifiers can obtain a large power with a distortion of operation the same as that of the class-A amplifiers, the class-B push-pull amplifiers are used in power amplifier stages of audio apparatus.

Figure 40:
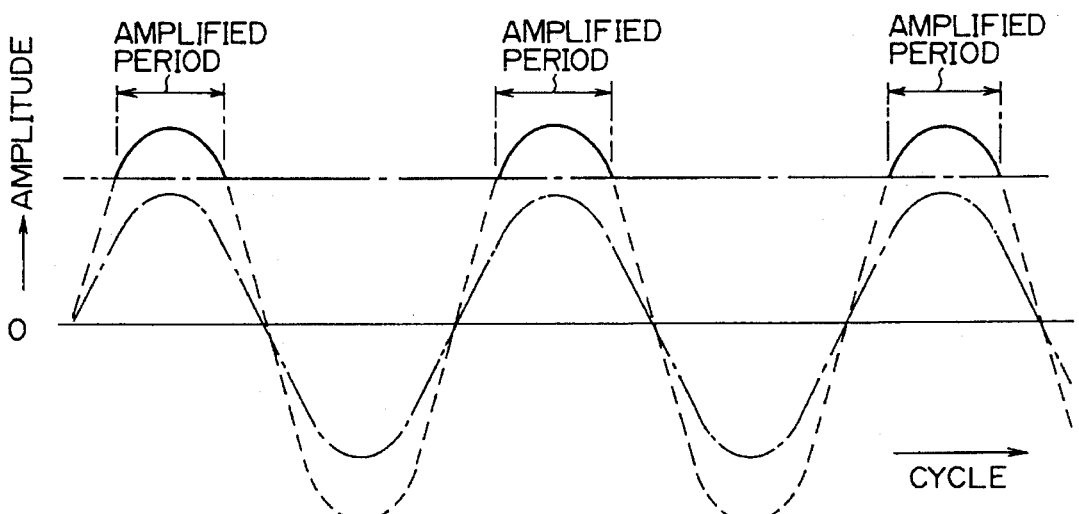
FIG. 40 is a characteristic diagram showing operation of a class-C amplifier.

Last, class-C amplifiers are those for operating in the manner that a positive current flows in a considerably smaller than a half cycle of each input cycle when a grid bias is extremely larger than a cut-off and an alternating input is supplied. In the case of the transistor amplifiers, as shown in FIG. 40, there may be called amplifiers in which a collector current does not flow in a period larger than a half cycle of the input signal cycle.

Figure 41:
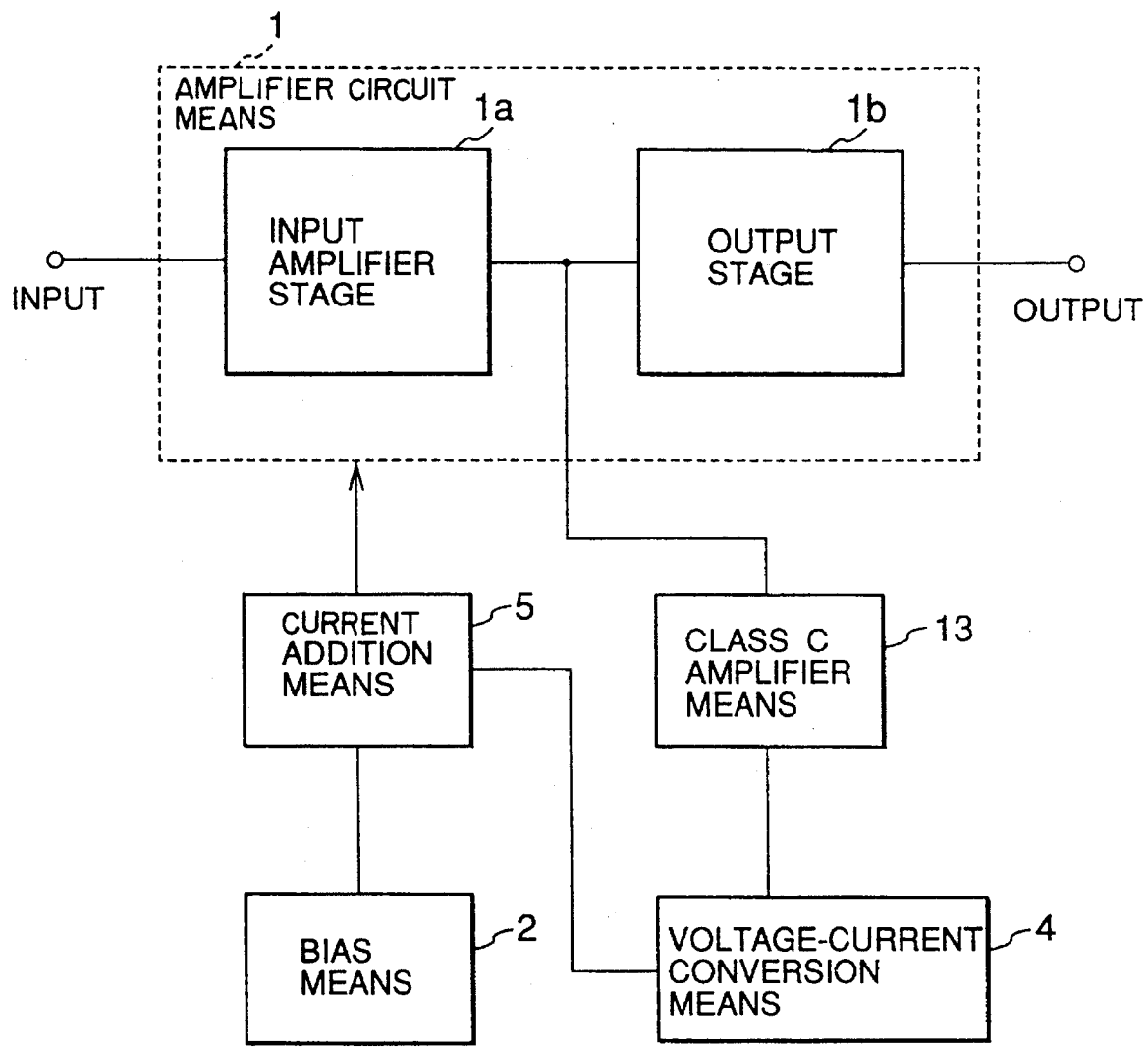
FIG. 41 is a block diagram showing a conceptional construction of an amplifier device according to a seventh embodiment of the present invention.

FIG. 41 is a block diagram of a basic configuration of an amplifier device according to a seventh embodiment of the present invention. An amplifier circuit means 1 has a function for amplifying an input signal to output, and can control a driving capability of an output current by a bias current. The amplifier circuit means 1 comprises an input amplifier stage 1$a$ and an output stage 1$b$. When a signal is input, the input amplifier stage amplifies level changes of the input signal to supply its output to class-C amplifier means 13. The class-C amplifier means 13 further amplifies the level changes of the input signal to supply an amplified voltage to voltage-current conversion means 4. The voltage-current conversion means 4 converts the voltage into a current. Namely, when the amplifier circuit means 1 receives the signal, the level changes of the input signal are converted into the voltage after performing the class-C amplification, and addition means 5 adds the voltage with an output from bias means 2 to supply an added output as a bias current to the amplifier circuit means 1.

Since the class-C amplifier means 13 performs a class-C amplification to the output of the input amplifier means 1$a$, when the signal is not supplied to the class-C amplifier means 1$a$ or the level changes of the input signal is extremely small, an output of the class-C amplifier means 13 is zero or substantially zero. Accordingly, the output current from the voltage-current conversion means 4 is zero, thereby supplying only the output from the bias means 2 as the bias current to the amplifier circuit means 1. As a result, when the input signal is fine, since the current from the voltage-current conversion means 4 is not supplied to the amplifier circuit means 1 as the bias current, it is possible to suppress the power consumption.

On the other hand, when there are the level changes of the input signal more than the predetermined value by the input signal, the class-C amplifier means 13 amplifies the output from the input amplifier stage 1$a$ and the output thereof is converted into the current by the voltage-current conversion means 4. The current is added with the output of the bias means 2 by the addition means 5 so as to supply to the amplifier circuit means 1 as the bias current. As a result, since the bias increases for the supply to the amplifier means 1 when the signal is input, the driving capability of the output current increases thus to obtain a high slew rate. Since there is a little bias amount which is supplied to the amplifier circuit means 1 when the level changes of the input signal become on or under the predetermined value, the power consumption can be reduced because the output of the class-C amplifier means 13 becomes zero again.

By the above-mentioned configuration, a constant bias which is supplied from the bias means determines the driving capability of the output current when the input signal is not supplied. When the signal is supplied and the level changes of the input signal is detected by a class-C amplification to the output of the input amplifier stage, it becomes possible to increase the driving capability of the output current corresponding to the level changes by adding the current converted from the voltage to the bias output. Therefore, such the seventh embodiment has a low power consumption because the driving capability of the output current does not increase only when the level changes of the input signal are more than the predetermined value.

Figure 42:
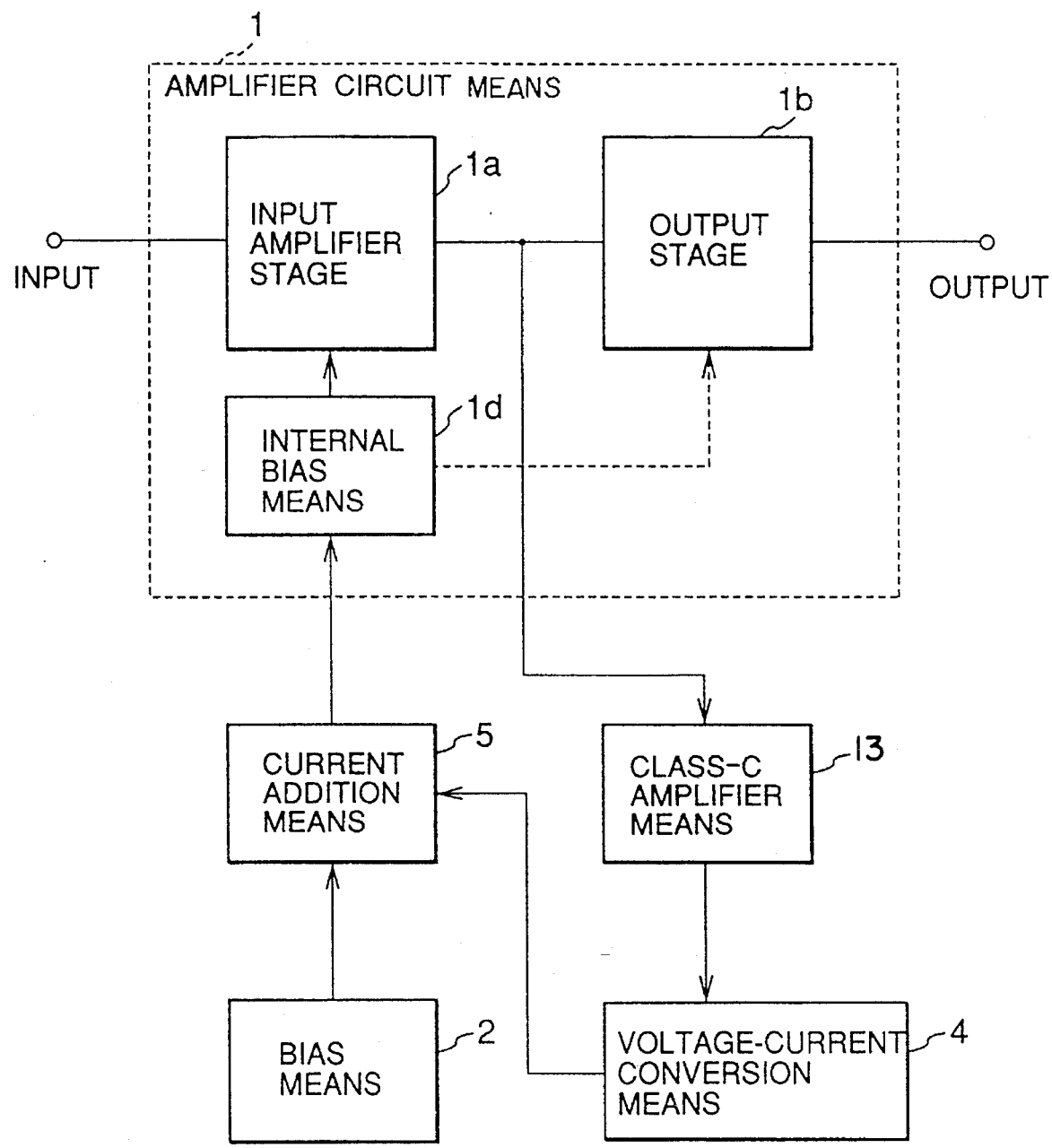
FIG. 42 is a block diagram showing a conceptional construction of an amplifier device according to an eighth embodiment of the present invention.

FIG. 42 shows a conceptional construction of an amplifier device according to an eighth embodiment.

In FIG. 42, an amplifier circuit means 1 comprises an input amplifier stage 1$a$, an output stage 1$b$, and an internal bias means 1$d$. A class-C amplifier means 3 performs a class-C amplification for an output from the amplifier means 1, and a voltage-current conversion means 4 converts an output from the class-C amplifier means 3 into a current. A current addition means 5 adds the current converted by the voltage-current conversion means 4 with a bias current output from a bias means 2 to thus supply an added current to the amplifier circuit means 1. The internal bias means 1d in the amplifier circuit means 1 receives the added current from the current addition means 5 and supplies the added current as a bias to the input amplifier stage 1a and/or the output stage 1b.

Even in this configuration, the output of the current addition means 5 increases only when the signal is input, and the bias current occurring in the internal bias means 1d also increases corresponding thereto. Since the bias current is supplied to the input amplifier stage 1a and/or the output stage 1b, the amplifier circuit means 1 has an increased driving capability of the output current. Accordingly, when the input signal level changes, it is possible to improve the driving capability of the output current, at the same time, it is possible to reduce the power consumption when the input signal level is zero or fine.

Figure 43:
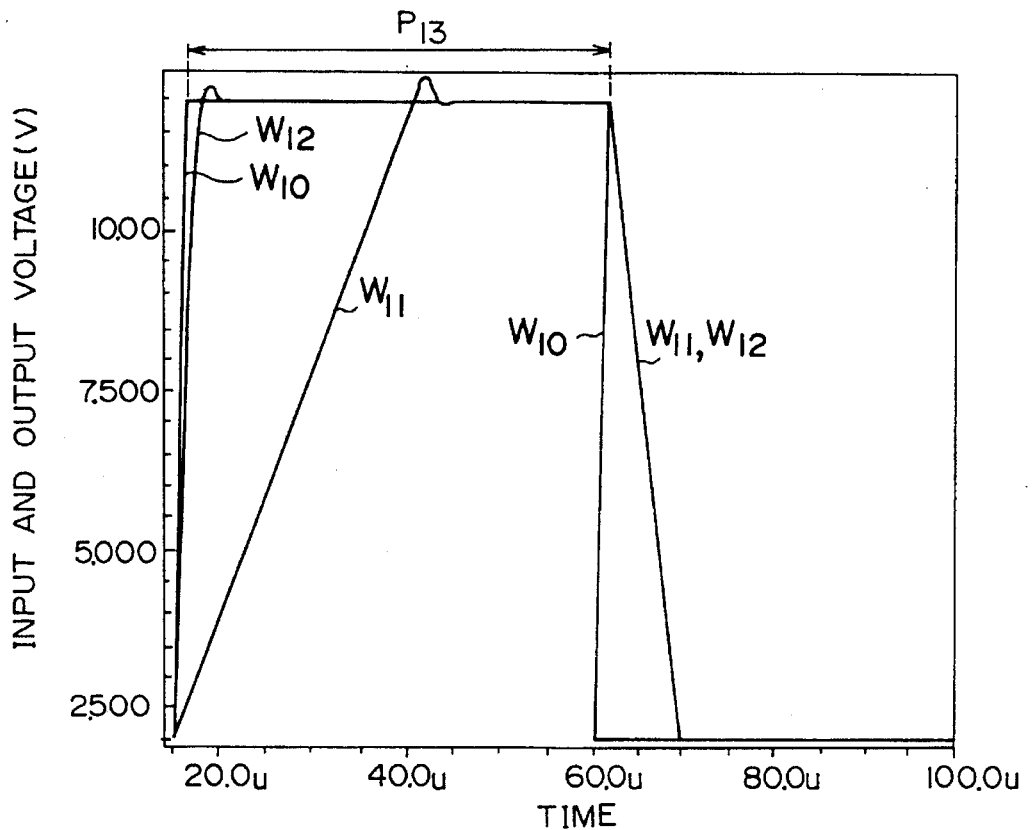
FIG. 43 is a characteristic diagram showing operation of the seventh and eighth embodiment of the present invention shown in FIGS. 41 and 42.

FIG. 43 shows a simulation result of a waveform of the input and output signals in the case where both the amplifier devices of the eighth embodiment shown in FIG. 42 and the prior art are formed by a voltage follower configuration. In this figure, a waveform $W_{11}$ of the prior art, which corresponds to an input waveform $W_{10}$, has a wrong reading edge. On the contrary, a waveform $W_{12}$ of the present invention, which also corresponds to the input waveform $W_{10}$, has a steep reading edge. By this fact, it is possible for the present invention to obtain an amplifier device having an improved driving capability of the output current.

Figure 44:
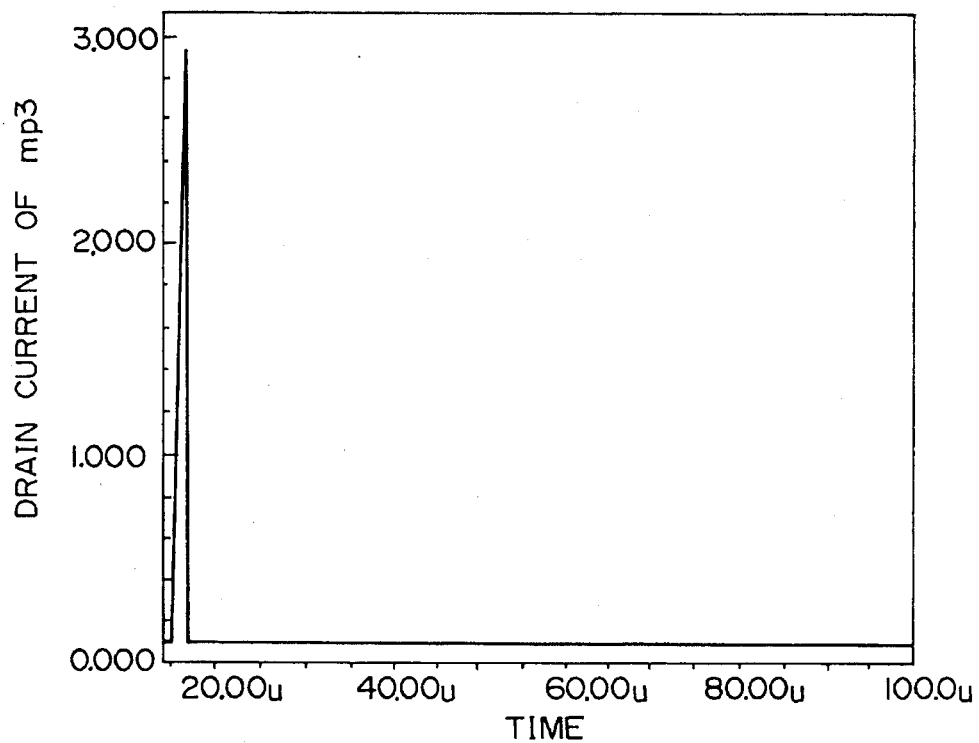
FIG. 44 is a characteristic diagram showing operation of the seventh and eighth embodiment of the present invention shown in FIGS. 41 and 42.

Furthermore, FIG. 44 shows a bias current waveform of the output stage 1b of the amplifier device according to the eighth embodiment when the input waveform $W_{10}$ shown in FIG. 43 is input. Particularly, FIG. 44 shows a waveform of a drain current of a field effect transistor (FET) mp3 of an output stage 1b shown in FIG. 47 described later (in a first example of the seventh and eighth embodiments). When a timing of the input waveform $W_{10}$ shown in FIG. 43 is compared with a timing of the FET mp3 drain current, it is understood that the FET mp3 has an impulse current flowing at the timing of the reading edge of the input rectangular waveform $W_{10}$. On the other hand, in a non-signal portion of the input waveform and a plane portion of the rectangular waveform (shown as a symbol $P_{13}$ in FIG. 43, a current does not occur as shown in FIG. 44. The bias current flows corresponding to the input level changes, and the bias current does not flow in the portion in which the input level does not change. Namely, since the bias current does not occur when the input level does not change, it is possible to reduce the power consumption in comparison with the amplifier circuit device of the prior art.

Next, an amplifier device of a ninth embodiment will be described in accordance with FIGS. 45 and 46.

Figure 45:
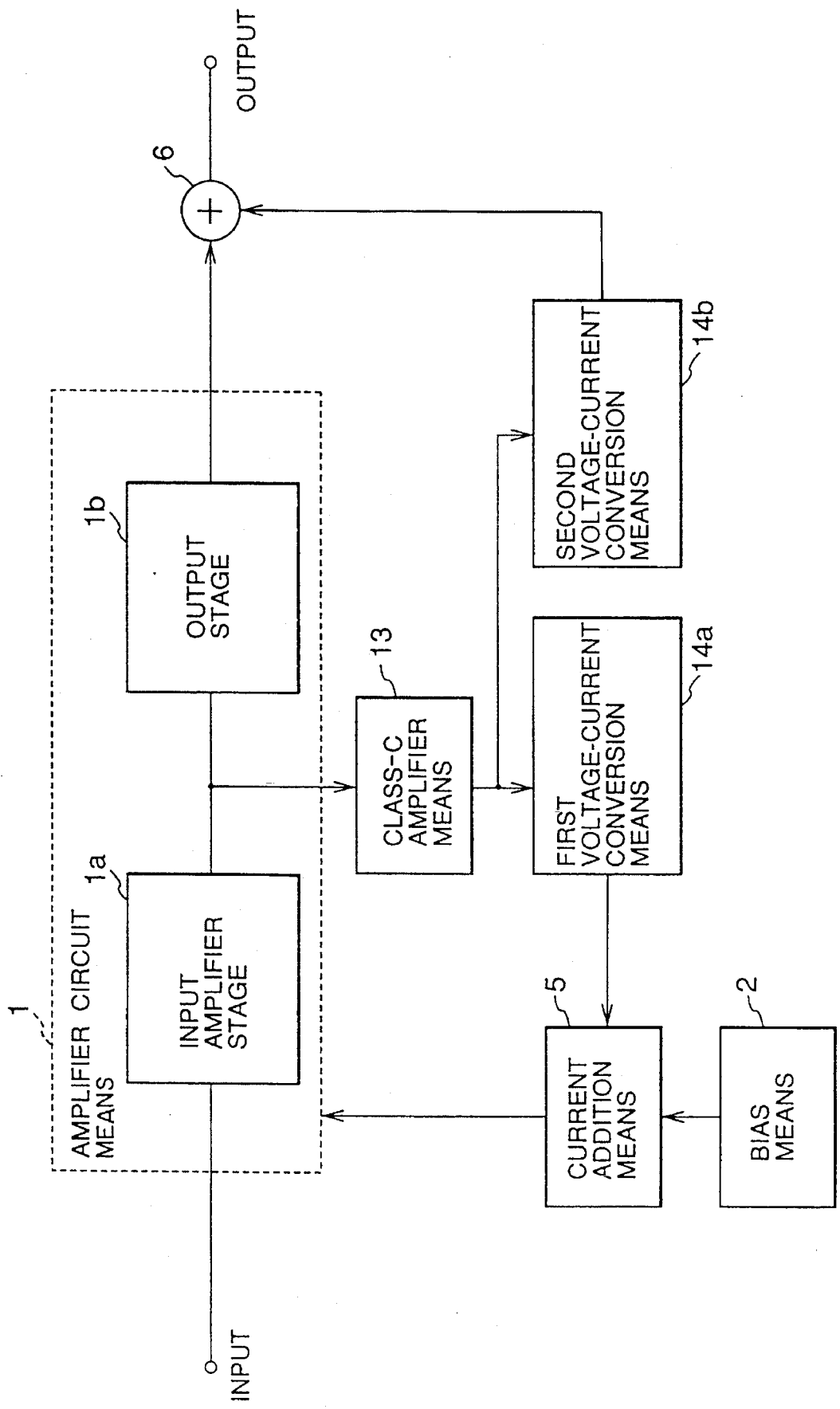
FIG. 45 is a block diagram showing a conceptional construction of an amplifier device according to a ninth embodiment of the present invention.

In FIG. 45, the device comprises amplifier circuit means 1 having an input amplifier stage 1a and an output stage 1b, bias means 2 for generating a bias, class-C amplifier means 13 for amplifying an output from the input amplifier stage 1a, first voltage-current conversion means 14a for converting an output voltage from the class-C amplifier means 13 to a current addition means 5, second voltage-current conversion means 14b for converting the output voltage from the class-C amplifier means 13 to an external adder 6, the current addition means 5 for adding a converted current from the first voltage-current conversion means 14a with the bias from the bias means 2 so as to supply an output to the amplifier circuit means 1, and the external adder 6 for adding the converted current of the second voltage-current conversion means 14b with an output from the amplifier circuit means 1. By this configuration, it is possible to further increase the driving capability of the amplifier device.

Figure 46:
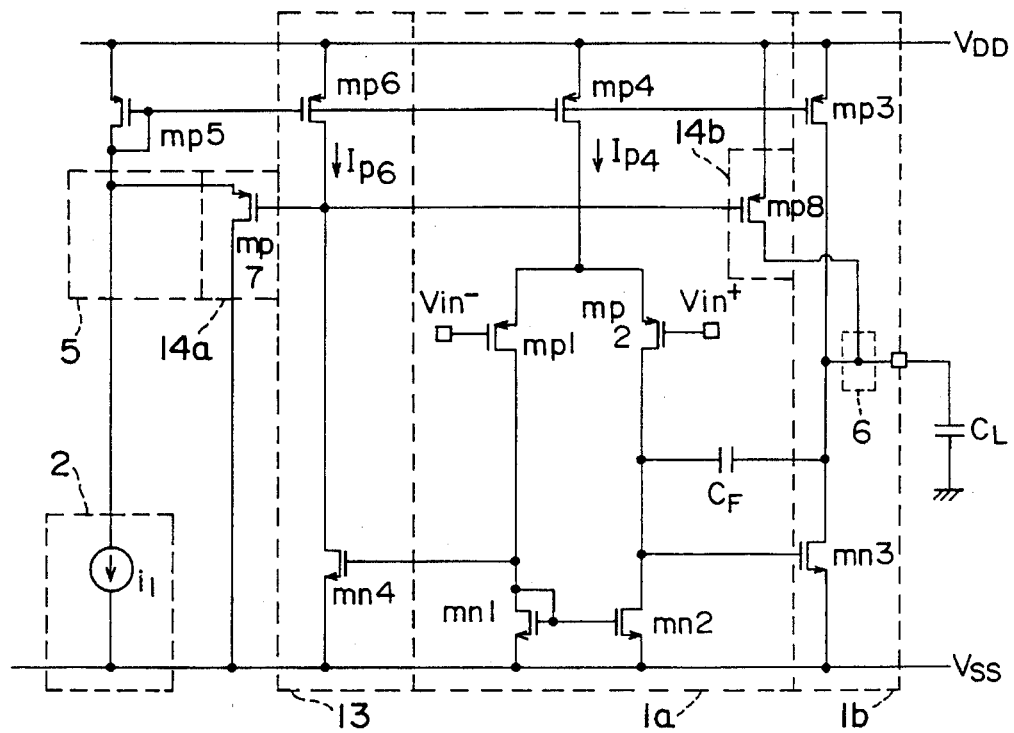
FIG. 46 is a circuit diagram showing an actual example of the amplifier device according to the ninth embodiment shown in FIG. 45.

FIG. 46 shows an actual example of the amplifier device according to the ninth embodiment of the present invention. In this figure, the class-C amplifier means 13 is configured from FETS mp6 and mn4, the first voltage-current conversion means 14a is configured from FET mp7, the second voltage-current conversion means 14b is configured from FET mp8, and the external adder 6 is configured from a connecting point of drains of FETS mp3 and mp8.

Figure 47:
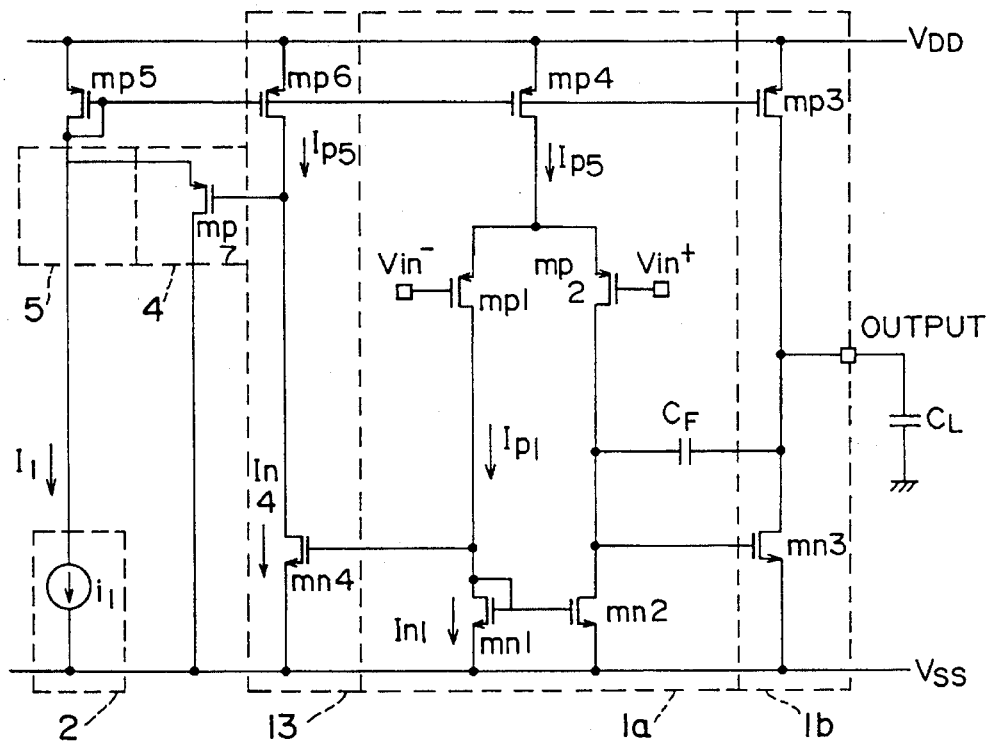
FIG. 47 is a circuit diagram showing a first example of the amplifier device according to the seventh and eighth embodiments of this invention as shown in FIGS. 41 and 42.

FIG. 47 shows a circuit of a first actual example of the amplifier device according to the seventh and eighth embodiments of the present invention shown in FIGS. 41 and 42.

In FIG. 47, FETS mp1–mp5 and mn1–mn3 and capacitor $C_F$ form a two stage operation amplifier as the same as the prior art and correspond to the amplifier circuit means 1. In the amplifier circuit means 1, the FETS mp1, mp2, mp5, mn1 and mn2 form a first amplifier stage (an input amplifier stage 1a) of a differential input. The FETS mp3, mp5 and mn3 and capacitor $C_F$ form a second amplifier stage (an output stage 1b) of a source grounded type. The capacitor $C_F$ is to compensate a phase and the capacitor $C_L$ is a load. A current source corresponds to the bias circuit 2. The FETS mp6 and mp4 form the class-C amplifier means 13, the FET mp7 forms the voltage-current conversion means 4, and numeral 5 in FIG. 47 corresponds to the current conversion means 5 in FIGS. 41 and 42.

The slew rate of the two stage operation amplifier (the input amplifier stage 1a and the output stage 1b) depends on a magnitude of the bias current which is supplied from the current source i1 as the bias circuit 2. Accordingly, when the increase of the bias current makes the driving capability of the output current improve, the slew rate increases but the power consumption also increases. Especially, when the device drives the capacitive load, the slew rate at trailing is determined by a time constant which is determined by (the input amplifier stage 1a) of the differential inputs. However, the slew rate at rising is determined by larger one of two time constants. One is determined by the phase compensation capacitance $C_F$ and an operation current of the first amplifier stage, and another is determined by the capacitive load $C_L$ and the operation current (which is supplied from the FET mp3) of the second amplifier stage (the output stage 1b) of the source grounded type.

When the capacitive load $C_L$ is large, it is necessary to set the operation current of the second amplifier stage to be larger, which is determined by the FET mp3, for realizing a high slew rate by improving the driving capability of the output current of the amplifier device. As a result, this large operation current is the cause of the increase of the power consumption.

On the contrary, in this invention, the class-C amplifier means 13 is configured by the FET mp6 and mn4 in which a drain electrode is an output terminal. An output voltage of the FET mn4 is converted into a current by the FET mp7 which constructs the voltage-current conversion means 4, thereby supplying to the amplifier circuit means 1 after adding the converted current with the bias current of the current source i1. Here, there are set a ratio of a channel width W and a channel length L (W/L) of the FET mp6 and a ratio of a channel width W and a channel length L (W/L) of the FET mp4 as follows:

$$\tfrac{1}{2}(W/L)mp4 < (W/L)mp6 < (W/L)mp4 \qquad (1)$$

$$(W/L)mn1 = (W/L)mn4 \qquad (2)$$

There will be described a circuit operation of the first example shown in FIG. 47 of the seventh and eighth embodiments shown in FIGS. 41 and 42.

When the difference between Vin+ and Vin− becomes larger than a predetermined value because Vin+ is larger than Vin− by changing the differential input signal level (for example, the relationship of "In>Ip6"), the majority of the current Ip4 supplied from the FET mp4 becomes a current Ip1 flowing to the side of FET mp1 of the differential pair constructing the input amplifier stage 1a (Ip1 to Ip4), thereby increasing a drain potential of FET mn1 which is the first output of the input amplifier stage 1a. Accordingly, a gate potential of the FET mn4 increases as the input of the class-C amplifier means 13, and since the drain current In4 of the FET mn4 becomes larger than the current Ip6 supplied from the FET mp6, the drain potential of the FET mn4 decreases as an output of the class-C amplifier means 13. Because there are "In4 >Ip6" and "In4=In1−Ip1" from the conditions of the equations (1) and (2).

As the output of the class-C amplifier means 13 becomes low, gate and source voltages of the FET mp7 of the voltage-current conversion means 4 become larger, so that a source current (converted from the voltage) of the FET mp7 becomes larger to be added with the bias current I1. By this, since the current flowing in the FET mp5 becomes larger, an operational current of the second amplifier stage supplied from the FET mp3 also becomes larger. Accordingly, since the differential input signal level changes, it is possible to improve the drive capability of the output current of the amplifier circuit means 1 and to obtain a high slew rate when the output rises.

Furthermore, when the difference between Vin+ and Vin− is smaller than the predetermined value even though Vin+ is larger than Vin− in the differential input signal level, a substantially half current of the current Ip4 supplied from the FET mp4 becomes the current Ip1 flowing into the FET mp1 {namely, Ip1=(½) Ip4+ΔI, where ΔI is very little current in comparison with the current Ip4}, so that the drain potential of the FET mn1 is fine to increase because of the current Ip1. Therefore, since the gate potential of the FET mn4 increases a little, the drain current In4 is "In4=In1−Ip1−(½)Ip4+ΔI" by the condition of the equation (2) and is "Ip6>In4" by the equation (1), so that the output of the class-C amplifier means 13 increases and the gate and source voltages of the FET mp7 decreases to be turned OFF, thereby causing the output current of the voltage-current conversion means 4 to be zero. Thus, the current flowing in the FET mp5 is only bias current I1 and the operation current of the second amplifier stage and supplied from the FET mp3 remains to be small, so that the power consumption does not increase.

Also, when Vin− is larger than Vin+ in the differential input signal level, the output current of the voltage-current conversion means 4 is zero by the relationship of "Ip6>In4". Accordingly, since only the bias current I1 is flowing in the FET mp5, the operation current of the second amplifier stage supplied from the FET mp3 keeps small, so that the power consumption does not increase. The trailing slew rate when Vin− is larger than Vin+, depends upon only the time constant which is determined by the operation current (supplied from the FET mp4) and the phase compensation capacitance $C_F$, and does not depend upon the operation current of the second amplifier stage, so that the slew rate does not decrease.

As described above, the amplifier device comprises the class-C amplifier means 13 for performing the class-C amplification with the output of the input amplifier stage 1a, the voltage-current conversion means 4 for converting the voltage output from the class-C amplifier means 13 into the current, and the addition means for adding the current from the voltage-current conversion means 4 with the output of the bias means 2, the bias current increases only when there is the level changes in the input signal more than the predetermined value, thereby increasing the driving capability of the output current of the amplifier circuit means. Accordingly, when the level changes do not occur in the input signal, especially when the input signal is not supplied, it is possible to reduce the power consumption, thereby realizing the amplifier circuit having a high slew rate.

Figure 48:
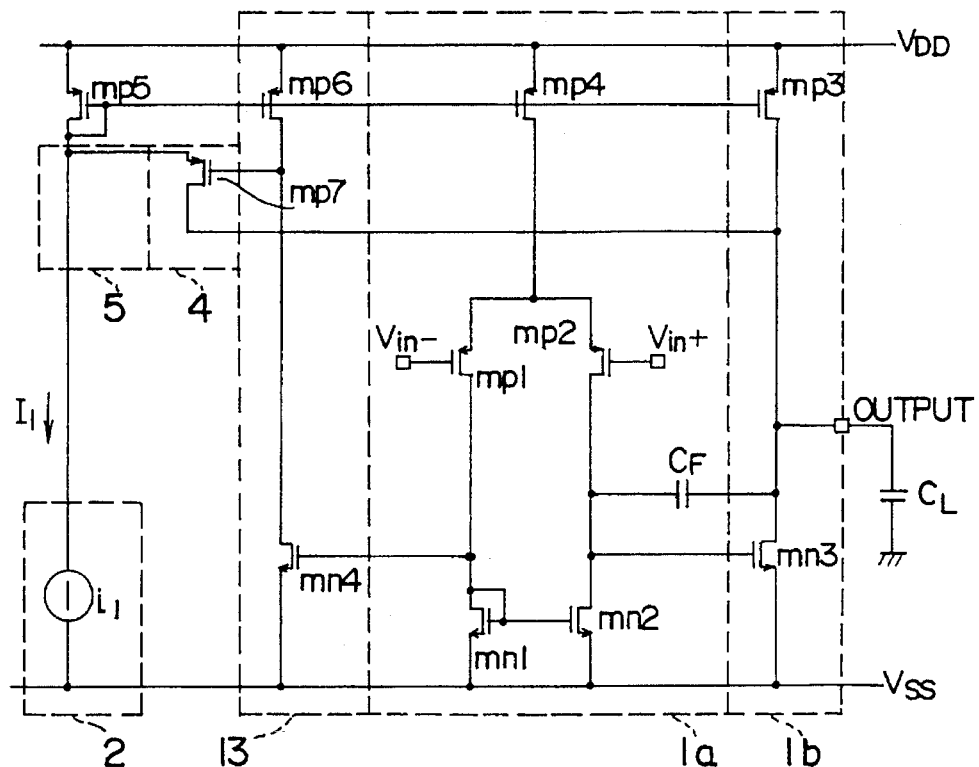
FIG. 48 is a circuit diagram showing a second example of the amplifier device according to the seventh and eighth embodiments of this invention as shown in FIGS. 41 and 42.

As shown in FIG. 48, the seventh and eight embodiments of the present invention may be configured as a second actual example, in the manner that a drain current of an FET mp7 in voltage-current conversion means is connected to be added with an operation current (a drain current of an FET mp3) of the second amplifier stage 1b, thereby increasing the driving capability of the output current.

Figure 49:
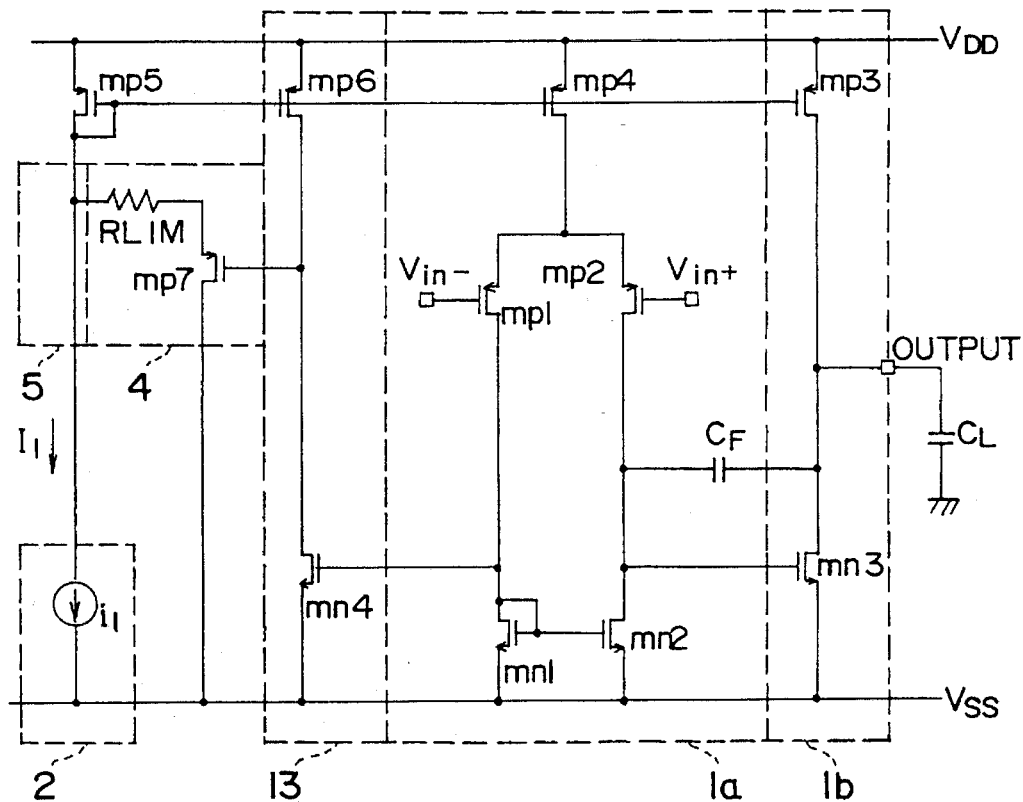
FIG. 49 is a circuit diagram showing a third example of the amplifier device according to the seventh and eighth embodiments of this invention as shown in FIGS. 41 and 42.

Furthermore, in the amplifier of the first example shown in FIG. 47, there occurs an element breakdown when an instantaneous current becomes too large in the FET mp3 of the output stage 1b. A third example of the seventh and eight embodiments is provided as a countermeasure for the element breakdown. FIG. 48 shows an amplifier device according to the third example of the seventh and eight embodiments. In FIG. 49, a current limit resistor $R_{LIM}$ is inserted into a source side of the FET mp7 of the output stage 1b to suppress the output current of the voltage-current conversion means 4, thereby enabling the limitation of the instantaneous current of the FET mp3.

Figure 50:
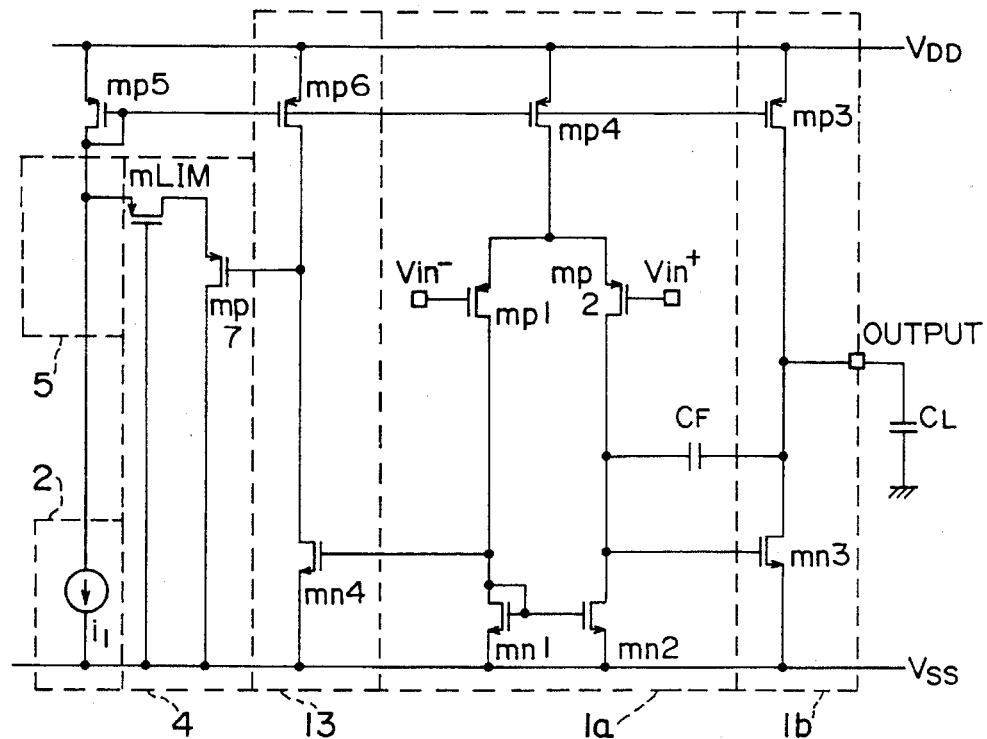
FIG. 50 is a circuit diagram showing a fourth example of the amplifier device according to the seventh and eighth embodiments of this invention as shown in FIGS. 41 and 42.

Still furthermore, the current limit resistor may be constructed by an FET $m_{LIM}$ in FIG. 50 which shows an amplifier device according to a fourth example of the seventh and eighth embodiments of the present invention.

Figure 51:
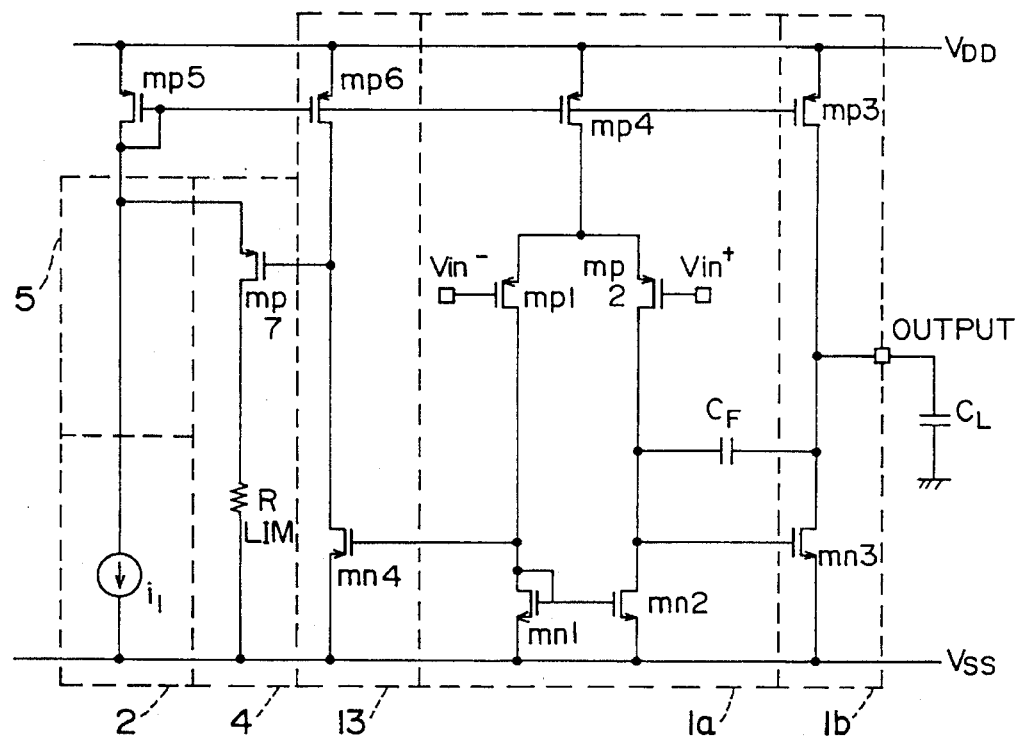
FIG. 51 is a circuit diagram showing a fifth example of the amplifier device according to the seventh and eighth embodiments of this invention as shown in FIGS. 41 and 42.

In FIG. 51, there is shown an amplifier device according to a fifth example of the seventh and eighth embodiments of this invention. This actual circuit of the fifth example has a current limit resistor $R_{LIM}$ which is provided to a drain side of the FET mp7 as a current limit resistor means, and other circuit components as the same as the fourth example shown in FIG. 50.

Figure 52:
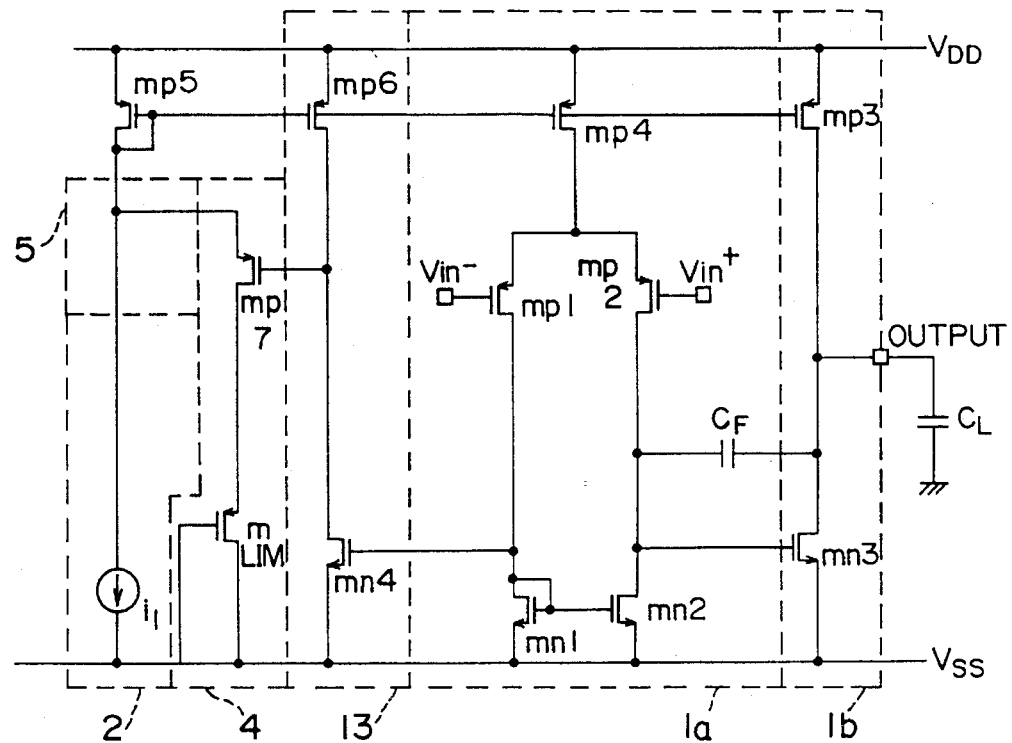
FIG. 52 is a circuit diagram showing a sixth example of the amplifier device according to the seventh and eighth embodiments of this invention as shown in FIGS. 41 and 42.

Furthermore, FIG. 52 shows an amplifier device according to a sixth example of the seventh and eighth embodiments of this invention. A circuit of the sixth example also has a current limit FET $m_{LIM}$ as the current limit resistor means which is connected to a drain side of the FET mp7 as the same as the fifth example shown in FIG. 51.

Figure 53:
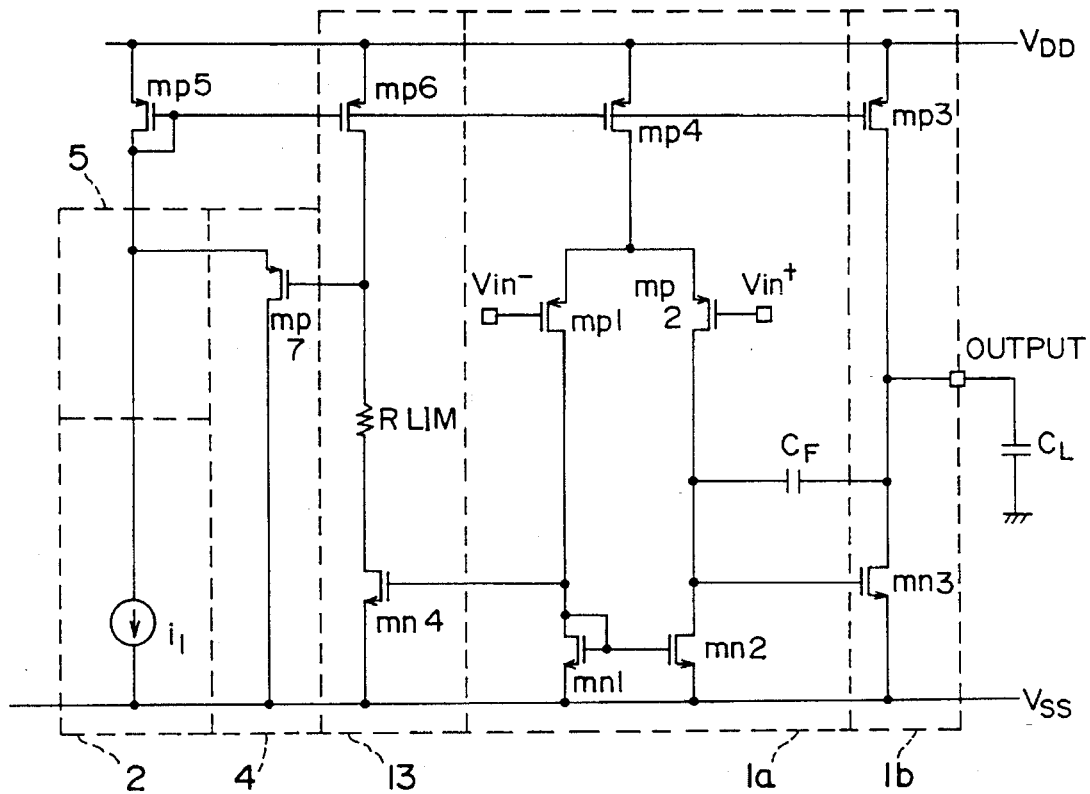
FIG. 53 is a circuit diagram showing a seventh example of the amplifier device according to the seventh and eighth embodiments of this invention as shown in FIGS. 41 and 42.
Figure 54:
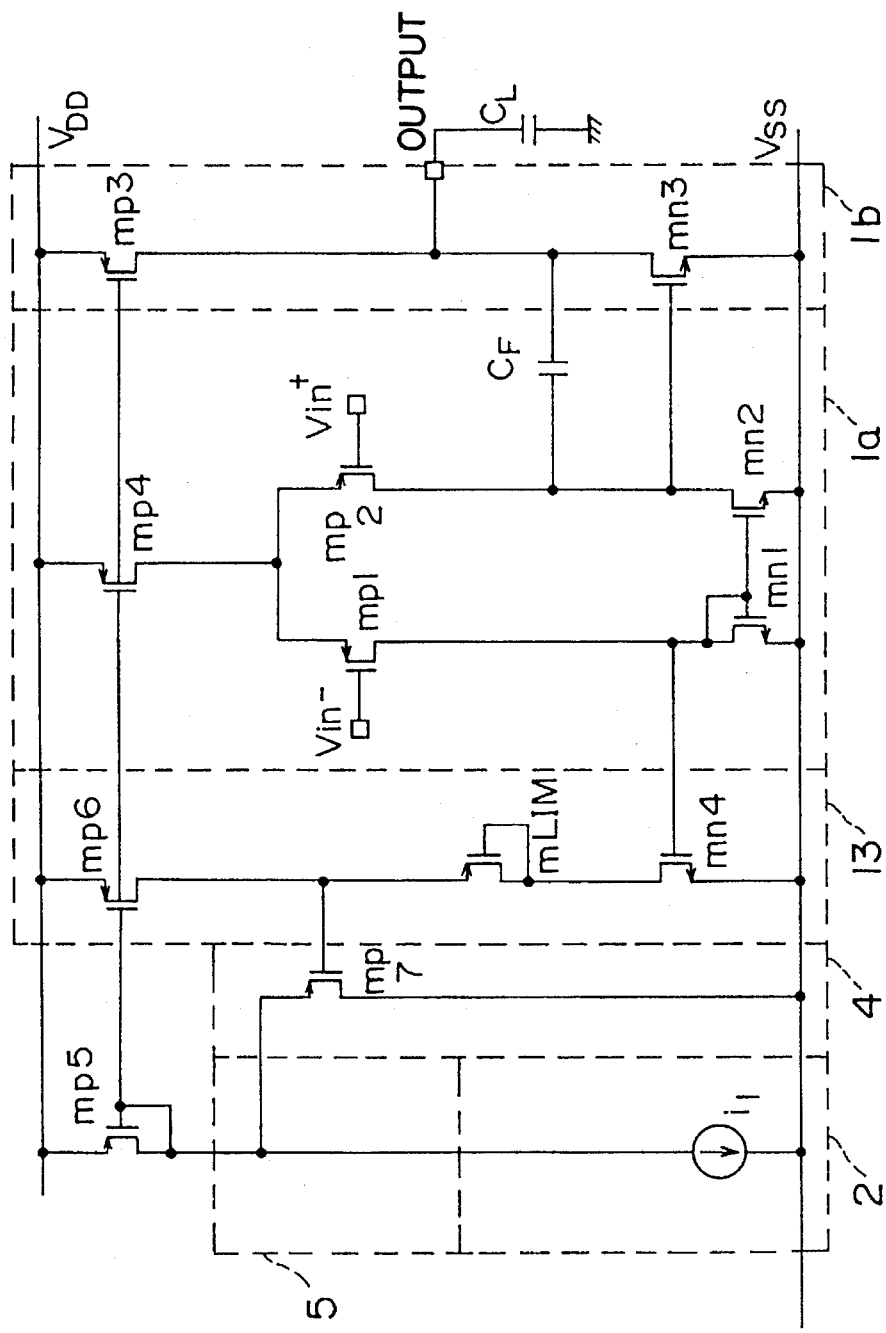
FIG. 54 is a circuit diagram showing an eighth example of the amplifier device according to the seventh and eighth embodiments of this invention as shown in FIGS. 41 and 42.

Next, there will be described examples for limiting an output current from the voltage-current conversion means 4. FIGS. 53 and 54 show circuits of seventh and eighth examples of the seventh and eighth embodiments, respectively. FIG. 53 shows an amplifier circuit of the seventh example, in which a resistor $R_{LIM}$ for limiting an amplitude is inserted between drain electrodes of FETS mp6 and mp4 constructing the class-C amplifier means 13. Furthermore, FIG. 54 shows an amplifier circuit of the eighth example, in which a FET $m_{LIM}$ for limiting an amplitude is provided in the place of the amplitude limit resistor $R_{LIM}$ shown in FIG. 53.

Such a limit for the output amplitude from the class-C amplifier means 13, can limit the output current from the voltage-current conversion means 4. Accordingly, even when the current drive capability of the amplifier device increases, it does not occur the fact that the instantaneous current of the FET mp3 increases without any restriction. Namely, by the third through eighth examples of the seventh and eighth embodiments shown in FIGS. 49 through 54, since such configurations can limit the maximum current value which is added with the bias current of the bias means when the input signal level changes, a danger of an element destruction by an excessive current becomes smaller.

Figure 55:
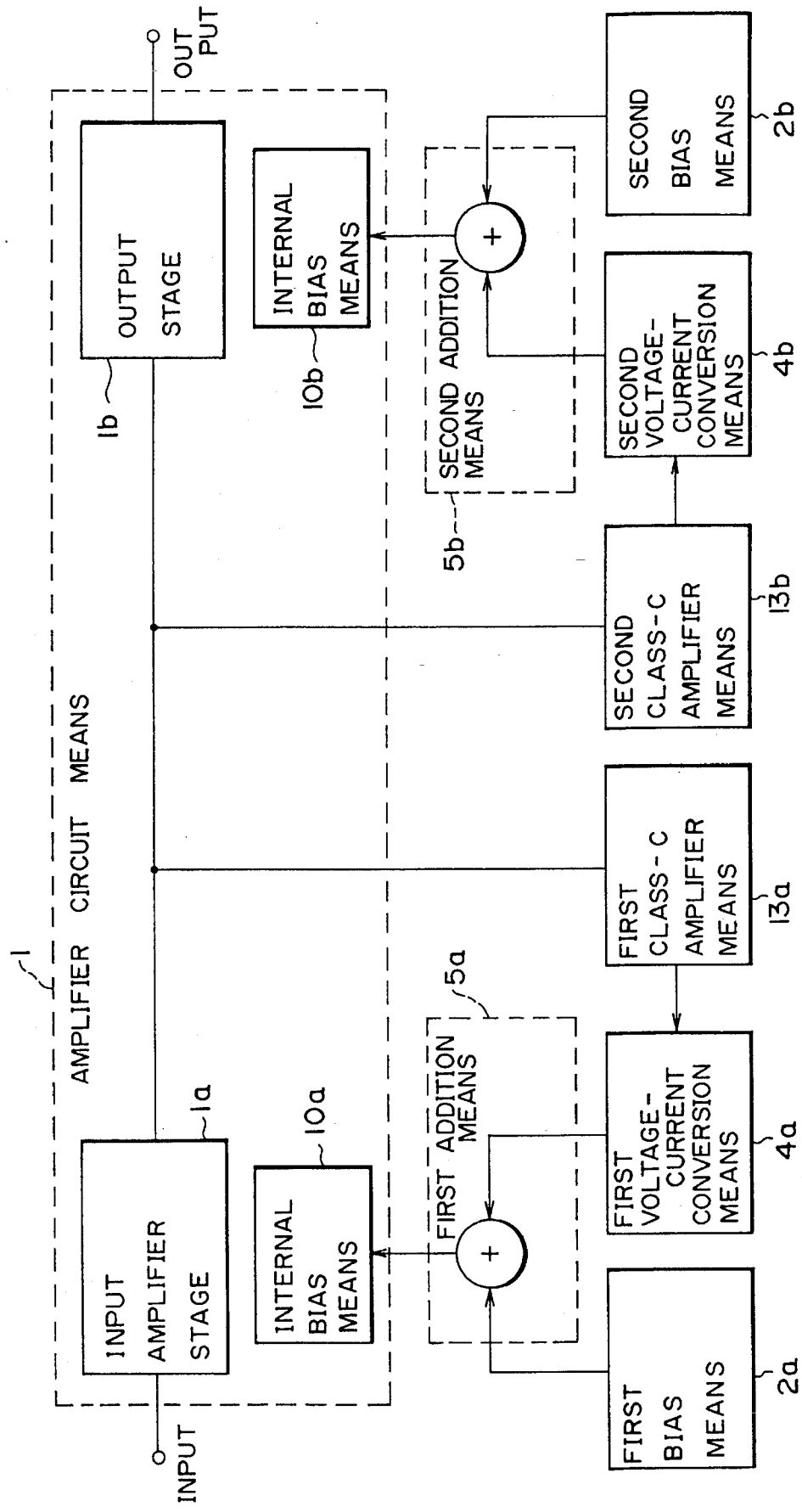
FIG. 55 is a block diagram showing a conceptional construction of an amplifier device according to a tenth embodiment of the present invention.

FIG. 55 shows a concept of an amplifier device according to a tenth embodiment of the present invention.

In FIG. 55, amplifier circuit means 1 includes an input amplifier stage 1a, an output stage 1b, a first internal bias means 10a, and a second internal bias means 10b. The amplifier device of the tenth embodiment further comprises a first class-C amplifier means 13a for amplifying an output of the input amplifier stage 1a, a first voltage-current conversion means 4a for converting an output voltage from the first class-C amplifier means 13a, a first bias means 2a for outputting one of bias current, and a first current addition means 5a for adding a converted current from the first voltage-current conversion means 4a with the one of the bias current and for supplying an added current to the first internal bias means 10a. The amplifier device of the tenth embodiment also comprises a second class-C amplifier means 13b for amplifying an output of the input amplifier stage 1a, a second voltage-current conversion means 4b for converting an output voltage from the first class-C amplifier means 13b, a second bias means 2b for outputting the other of bias current, and a second current addition means 5b for adding a converted current from the second voltage-current conversion means 4b with the other of the bias current and for supplying an added current to the second internal bias means 10a.

Figure 56:
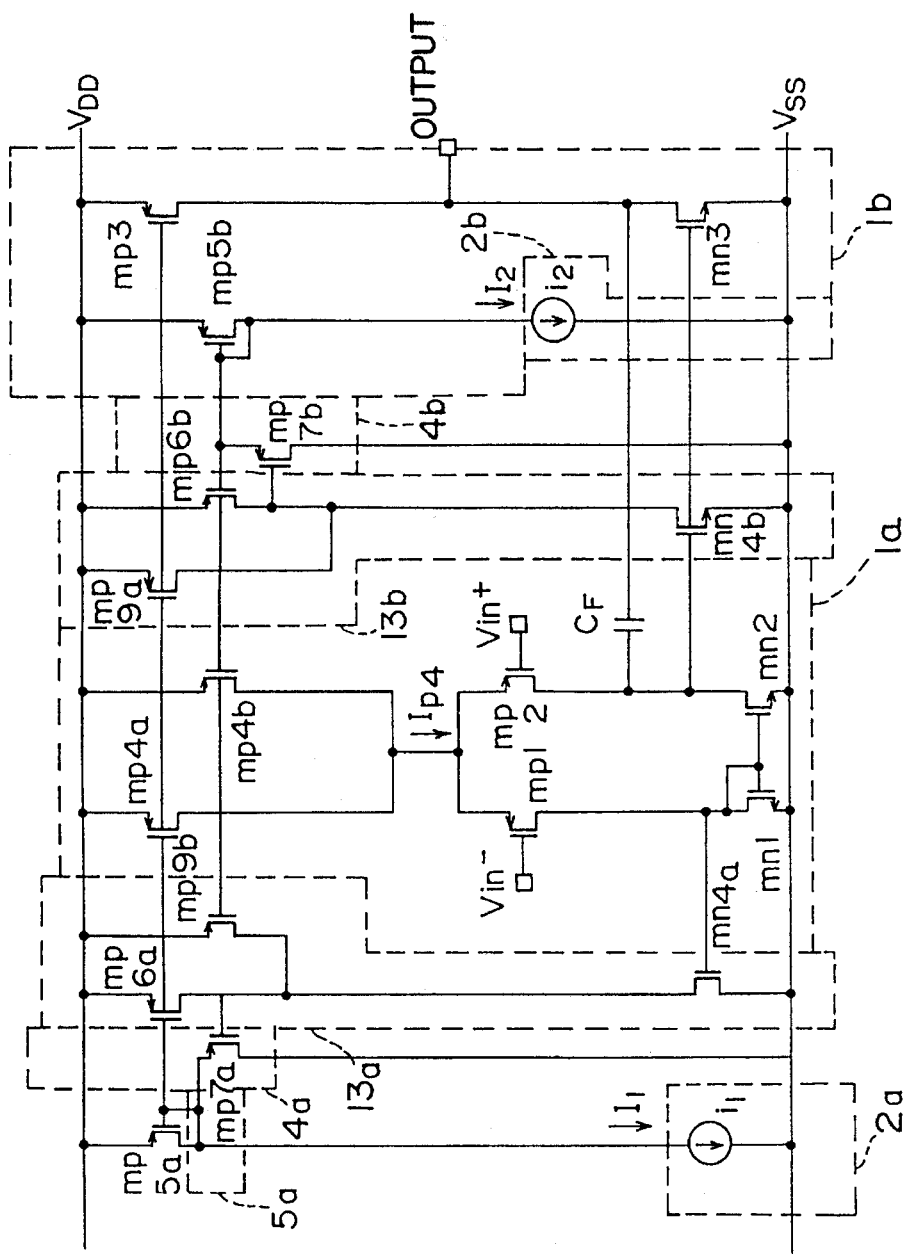
FIG. 56 is a circuit diagram showing a first actual example of the amplifier device according to the tenth embodiment shown in FIG. 55.

FIG. 56 shows a circuitry of a first example according to the tenth embodiment of the present invention shown in FIG. 55.

In FIG. 55, FETS mp1–mp5, mn1–mn3 and capacitor $C_F$ construct the amplifier circuit means 1 corresponding to the conventional two stage operation amplifier. In this amplifier circuit means 1, the FETS mp1, mp2, mp4a, mp4b, mp5a, mp5b mn1 and mn2 construct the first amplifier stage (the input amplifier stage 1a) of the differential inputs. The FETS mp3, mp5 and mn3 and the capacitor $C_F$ constitute the second amplifier stage (the output stage 1b) of the source grounded type. The capacitor $C_F$ is inserted for compensating a phase.

A current source i1 corresponds to the first bias circuit 2a, and a current source i2 corresponds to the second bias circuit 2b. The FETS mp6a, mp9b and mn4a correspond to the first class-C amplifier means 13a, and the FETS mp6b, mp9a and mn4b correspond to the second class-C amplifier means 13. An output voltage the first class-C amplifier means 13a is converted into a current by the FET mp7a as the first voltage-current conversion means 4a, and an output voltage the second class-C amplifier means 13b is converted into a current by the FET mp7b as the voltage-current conversion means 4b. The output currents of these FETS are respectively added to the bias current to supply to the amplifier circuit means 1. Here, ratios of the channel width to channel length of the FETS mp6a, mp6b, mp9a, mp9b, mn4a and mn4b are set in the manner of satisfying the following conditions, for example;

$$\text{(drain current of } mp6a) < \text{(drain current of } mp4a) \tag{3}$$

$$\text{(drain current of } mp6b) < \text{(drain current of } mp4b) \tag{4}$$

$$\text{(drain current of } mp4a + \text{drain current of } mp4b) > \tag{5}$$

$$\text{(drain current of } mp6a + \text{drain current of } mp9b) >$$

$$\tfrac{1}{2}(\text{drain current of } mp4a + \text{drain current of } mp4b)$$

-continued $$\text{(drain current of } mp4a + \text{drain current of } mp4b) > \tag{6}$$

$$\text{(drain current of } mp6b + \text{drain current of } mp9a) >$$

$$\tfrac{1}{2}(\text{drain current of } mp4a + \text{drain current of } mp4b)$$

$$(W/L)mn1 = (W/L)mn2 = (W/L)mn4a = (W/L)mn4b \tag{7}$$

There will be described a circuit operation of a first example shown in FIG. 56 according to the tenth embodiment shown in FIG. 55. When the changes of the differential input signal level causes Vin+ larger than Vin− and the difference therebetween larger than the predetermined value, a majority of the current Ip4 becomes the current Ip1 flowing to the side of the FET mp1 of the differential pair constituting the input amplifier stage 1a, thereby raising the drain potential of the FET mn1 as the first output of the input amplifier stage 1a. The current Ip4 is an additional current of the FETS mp4a and mp4b. Accordingly, a gate potential of the FET mn4a as an input of the first class-C amplifier means 3a, and the drain current In4a of the FET mn4a becomes larger than the current Ip6 which is an addition current of the FETS mp6a and mp9b, thereby decreasing the drain potential of the FET mn4a as an output of the first class-C amplifier means 3a.

This is the reason why there are "In4a>Ip6a", and "In4a=In1=Ip1" from the above conditions, respectively. Since the output of the first class-C amplifier means 3a is dropped, a voltage increases between the gate and source electrodes of the FET mp7a constituting the first voltage-current conversion means 4a, thereby increasing the source current (namely, the output current which is converted from the voltage) of the FET mp7a for adding with the bias current I1.

Therefore, since the current flowing in the FET mp5a becomes larger, there becomes larger an operation current of the first amplifier stage 1a which is supplied from the FET mp4a of the first class-C amplifier means 3a, and at the same time there also becomes an operation current of the second amplifier stage 1b which is supplied from the FET mp3. Accordingly, it is possible to obtain the high slew rate because of increasing the drive capability of the amplifier circuit means 1 when the differential input signal level changes to make Vin+ larger than Vin− at starting the output with the difference therebetween more than the predetermined value.

Furthermore, when the differential input signal level changes to cause Vin− to be larger than Vin+ and the difference therebetween to be more than the predetermined value, a majority of the current Ip4 becomes the current Ip2 flowing to the FET mp2 constituting the input amplifier stage 1a, thereby increasing the drain current of the FET mn2 as the second output of the input amplifier stage 1a.

Accordingly, since the gate potential of the FET mn4b of the second class-C amplifier means 13b increases its current In4b to be larger than the addition current Ip6b of the FETS mp6b and mp9a of the second class-C amplifier means 13b, there is reduced the drain potential of the FET mn4b as the output of the second class-C amplifier means 13b.

This is the reason why there are "In4b>Ip6b" and the majority of the current In4b is Ip2 from the above-mentioned conditions. Since the output of the second class-C amplifier means 13b is dropped, a voltage increases between the gate and source electrodes of the FET mp7b constituting the second voltage-current conversion means 4b, thereby increasing the source current (namely, the output current which is converted from the voltage) of the FET mp7b for adding with the bias current I2.

In this case, since the current flowing in the FET mp5b increases, only operation current of the first amplifier stage 1a supplied from the FET mp4b becomes larger. As has been mentioned in the description of the first example shown in FIG. 56 of the tenth embodiment shown in FIG. 55, the slew rate at trailing in the amplifier stage 1 depends upon only the time constant which is determined by the phase compensation capacitor $C_F$ and the operation current of the input amplifier stage 1a of the differential inputs. Accordingly, when the output trails and the difference between Vin− and Vin+ is larger than the predetermined value under the condition that Vin− is larger than Vin+ by changing the differential input signal level, the operation current of the second amplifier does not increase unnecessarily, thereby effectively realizing the high slew rate.

Furthermore, when an absolute value of the difference between Vin− and vin+ in the differential input signal level is smaller than the predetermined value, a half of the addition current Ip4 supplied from the FETS mp4a and mp4b becomes the current Ip1 and Ip2 flowing in the FETS mp1 and mp2 {where there is Ip1=(½)Ip4±ΔI, Ip2+Ip1=Ip4, where, ΔI is extremely small current in comparison with the current Ip4}. Therefore, there is a little change in the drain potential of the FETS mn1 and mn2. Accordingly, since the potential of the FETS mn4a and mn4b have a little change of the gate potential, the drain potential In4a of the FET mn4a is "In4a=(½)Ip4±ΔI" from the conditions (5)–(7), and drain potential In4b of the FET mn4b is substantially one as the same as the difference between Ip4 and ΔI (or the addition with ΔI). As a result, conditions are "Ip6a>In4a" and "Ip6b> In4b", the outputs of the first and second class-C amplifiers 13a and 13b respectively increase, and the voltage between gate and source electrodes of the FET mp7b decreases to be turned OFF. Accordingly, since both of the outputs are zero in the first and second voltage-current conversion means 4a and 4b, the current flowing in the FET mp5a is only the bias current I1 and the current flowing in the FET mp5b is only the bias current I2, so that the power consumption does not increase because the operation currents of the first and second amplifier stages do not increase unnecessarily.

Figure 57:
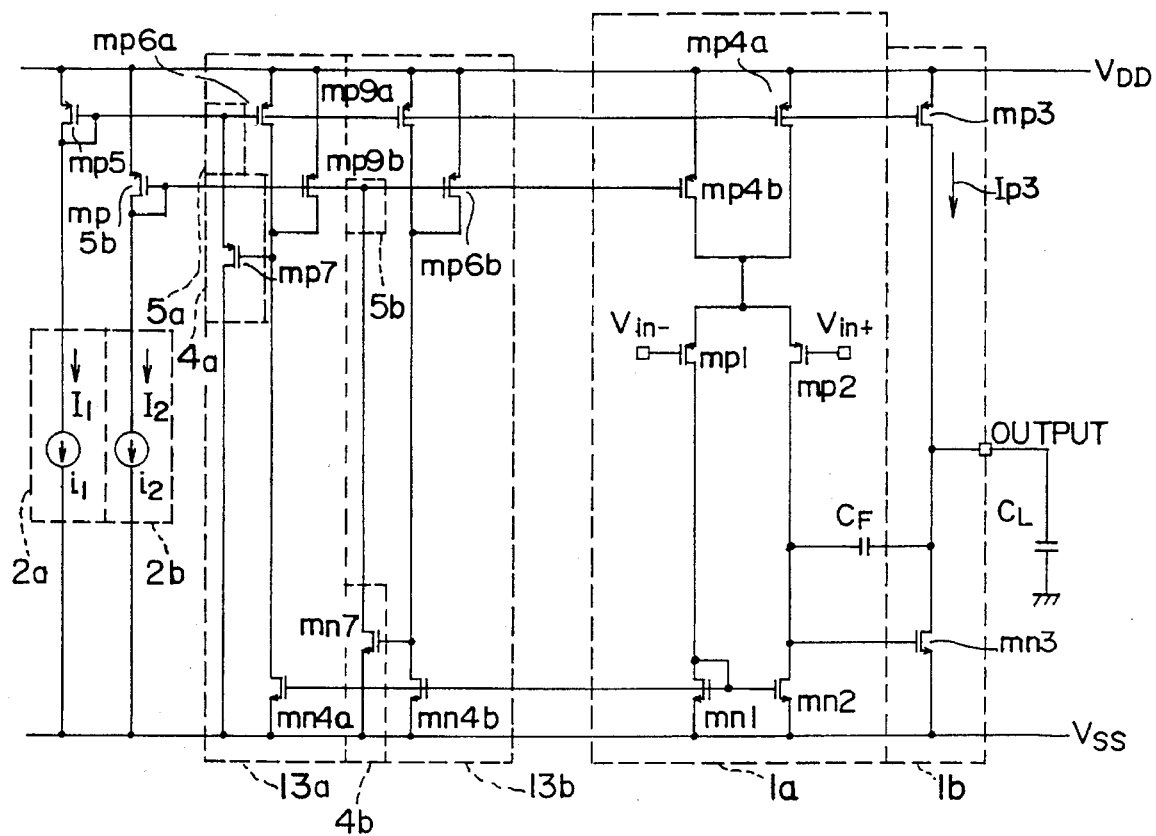
FIG. 57 is a circuit diagram showing a second example of the amplifier device according to the tenth embodiment of this invention as shown in FIG. 55.

There will be described a second example of the tenth embodiment in accordance with FIG. 57, which is a modified example of the first example as has been described by FIG. 56.

In FIG. 56, the ratio of the channel widths W and channel lengths L of the FETS mp6a, mp6b, mp9a, mp9b, mn4a and mn4b is set to satisfy the following conditions;

(drain current of *mp6a*) < (drain current of *mp4a*)

(drain current of *mp6b*) < ½(drain current of *mp4b*)

(drain current of *mp4a* + drain current of *mp4b*) >

(drain current of *mp6a* + drain current of *mp9b*) >

½(drain current of *mp4a* + drain current of *mp4b*)

½(drain current of *mp4a* + drain current of *mp4b*) >

(drain current of *mp6b* + drain current of *mp9a*)

(W/L)mn1 = (W/L)mn2 = (W/L)mn4a = (W/L)mn4b

Circuit operation is simply described below. When Vin+ is larger than Vin− by changing the differential input signal level, the circuit has the same operation as the circuit shown in FIG. 56. When Vin− becomes larger than Vin+ and the difference therebetween becomes larger than the predetermined value, a majority of the current Ip4 as the addition current of the FETS mp4a and mp4b flows into the FET mp2 of the differential pair constituting the input amplifier stage 1a, and does not flow to the FET mp1 at all. Accordingly, the drain current of the FET mn1 decreases to reduce the gate potential of the FET mn4b as the input of the second class-C amplifier means 13b, the drain current In4b of the FET mn4b becomes smaller than the addition current Ip6b of the FETS mp6b and mp9a, thereby increasing the drain potential of FET mn4b as the output of the second class-C amplifier means 13b. By this, the voltage between the gate and source electrodes of the FET mn7 constituting the second voltage-current conversion means 4b increases and causes the drain current of the FET mn7 for adding with the bias current I2 to be larger.

As a result, since the current flowing in the FET mp5b becomes larger, the operation current of the first amplifier stage supplied from the FET mn4b only increases in this case. As has been described in the first example of the seventh and eighth embodiments shown in FIG. 47, the amplifier circuit means 1 has the slew rate depending upon only the time constant which is determined by an operation current of the first amplifier stage and a capacitance $C_F$ for compensating a phase. Accordingly, when the output rises under the condition that the differential input signal level changes and causes Vin− to be larger than Vin+ and the difference therebetween becomes larger than the predetermined value, the operation current Ip3 of the second amplifier stage does not increase unnecessarily, thereby effectively realizing the high slew rate.

Furthermore, when the difference between Vin+ and Vin− is smaller than the predetermined value in the differential input signal level, the currents Ip1 and Ip2 as a half current of the addition current Ip4 supplied from the FETS mp4a and mp4b, flow to the sides of FETS mp1 and mp2, respectively. The currents Ip1 and Ip2 are defined by the following equation:

$$Ip1=½Ip4±ΔI, Ip2+Ip1=Ip4$$

where ΔI is an extremely fine current in comparison with Ip4. Since the drain current of the FET mn1 changes small, it is a vary small change of the gate potential of the FETS mn4a and mn4b, thereby resulting the drain current thereof to be small. Accordingly, the above-mentioned condition causes the drain potential of the FET mn4a as the output of the first class-C amplifier means 13a to be high, the gate drain voltage of the FET mp7 is small, and the FET is turned OFF.

Furthermore, the drain potential of the FET mn4b as the output of the second class-C amplifier means 13b is low, the gate drain voltage of the FET mn7 is small, and the FET is turned OFF. According to this manner, since the FETS mp7 and mn7 constituting the first and second voltage-current conversion means 4a and 4b are turned OFF, both of the output currents of the first and second voltage-current conversion means 4a and 4b become zero. Therefore, since the bias current I1 only flows in the FET mp5a and the bias current I2 only flows in the FET mp5b, the operation currents of the first and second amplifier stages 1a and 1b do not unnecessarily increase, so that the power consumption does not increase.

Figure 58:
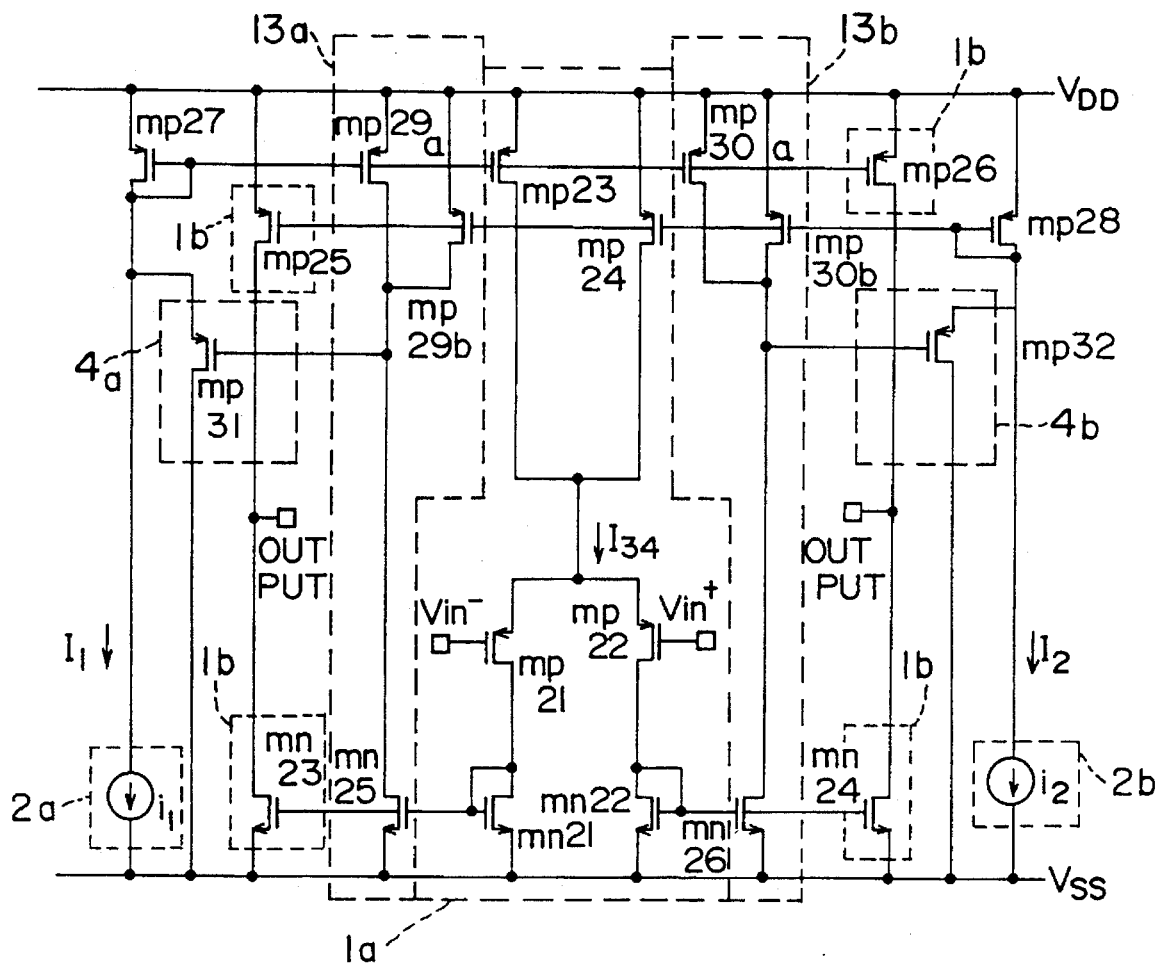
FIG. 58 is a circuit diagram showing a third example of the amplifier device according to the tenth embodiment of this invention as shown in FIG. 55.

FIG. 58 shows a circuitry of a third example of the tenth embodiment shown in FIG. 55.

In FIG. 58, FETS mp21–mp28 and mn21–mn24 correspond to the conventional amplifier circuit means 1 of the positive feedback type. In this amplifier circuit means 1, the FETS mp21–mp24, and mn21–22 constitute the input amplifier stage 1a of the differential input, and the FETS mp25, mp26 and mn23 and mn24 constitute an output stage 1b. A current source i1 corresponds to the first bias means 2a, and a source i2 corresponds to the bias circuit 2b. The FETS mp29a, mp29b and mn25 correspond to the first class-C amplifier means 13a, and the FETS mp30a, mp30b and mn26 correspond to the second class-C amplifier means 13b. Also, the FET mp31 constitutes the first voltage-current conversion means 4a, and the FET mp32 constitutes the second voltage-current conversion means 4b.

A slew rate of the amplifier constituted by only conventional circuit is determined by the capacitive load and the maximum output current. The maximum output current at rising the output is determined by the operation current supplied from the FETS mp25 and mp26, while the maximum output current at trailing the output is determined by the bias currents I1 and I2 supplied from the current sources i1 and i2 constituting the first and second bias means 2a and 2b, respectively.

The FETS mp29a, mp29b, mn25 and the FETS mp30a, mp30b and mn26 correspond to the first and second class-C amplifier means 13a and 13b, respectively, in which output voltages are converted into currents by the FETS mp31 and mp32 respectively constituting the first and second voltage-current conversion means 4a and 4b, thus to supply them to the amplifier circuit means 1 after adding with the bias currents I1 and I2 supplied from the current sources i1 and i2, respectively. Here, the ratio of the channel width and the channel length of the FETS mp23, mp24, mp29a, mp29b, mn30a, mn30b mn25 and mn26 are respectively set to satisfy the following conditions:

(drain current of *mp23*) > (drain current of *mp29a*)     (8)

(drain current of *mp24*) > (drain current of *mp30a*)     (9)

(drain current of *mp23* + drain current of *mp24*) >

(drain current of *mp29a* + drain current of *mp29b*) >

½(drain current of *mp23* + drain current of *mp24*)

(drain current of *mp23* + drain current of *mp24*) >     (11)

(drain current of *mp30a* + drain current of *mp30b*) >

½(drain current of *mp23* + drain current of *mp24*)

$(W/L)mn21 = (W/L)mn22 = (W/L)mn25 = (W/L)mn26.$     (12)

A circuit operation is described below with respect to the fourteenth example shown in FIG. 58.

When the difference between Vin+ and Vin− becomes larger than the predetermined value by changing the differential input signal level to cause Vin+ to be larger than Vin−, a majority of the addition current I34 supplied from FETS mp23 and mp24 becomes a current Ip21 flowing to the side of the FET mp21 of the differential pair constituting the input amplifier stage 1a, thereby raising the drain potential of the FET mn21 as the first output of the input amplifier stage 1a. Accordingly, since the gate potential of the FET mn25 as an input of the first class-C amplifier means 13a increases and the drain current In25 of the FET becomes larger than the addition current Ip29 supplied from the FETS mp29a and mp29b, the drain potential of the FET mn25 as the output of the first class-C amplifier means 13a is reduced according to the above-mentioned conditions (9) and (11). 35 Since the output of the first class-C amplifier means 13a increases, a voltage between the gate and source electrodes of the FET mp31 constituting the first voltage-current conversion means 4a increases and the source current (which is converted from the voltage) of the FET mp31 increases to add with the bias current i1. Therefore, since the current flowing in the FET mp27 increases to raise the operation current supplied from the FET mp26, it is possible to improve the output current drive capability of the output OUTPUT+, thereby obtaining a high slew rate. At the same time, since the current drive capability of the output OUTPUT− increases by rising the operation current supplied from the FET mp23, it is possible to obtain a high slew rate at trailing.

When the difference between Vin− and Vin+ becomes larger than the predetermined value by changing the differential input signal level to cause Vin− to be larger than Vin+, the circuit performs the same operation as above. Namely, since the current flowing in the FET mp27 increases and the operation current supplied from the FET mp25 also increases, it is possible to obtain a high slew rate at rising. At the same time, since the operation current supplied from the FET mp24 increases to improve the output current drive capability of the output OUTPUT+, it is possible to obtain a high slew rate at trailing.

Furthermore, when the absolute value of the difference between Vin− and Vin+ is smaller than the predetermined value because the difference input signal level changes are small, substantially halves of the addition current I34 supplied from the FETS mp23 and mp24 become the currents Ip21 and Ip22 flowing in the FETS mp21 and mp22, respectively, which are obtained by the conditions below:

$Ip21 = (½)I34 ± ΔI$, and

Ip22 is the difference or addition of "(½)I34" and "ΔI", where ΔI is an extremely small current in comparison with I34. A change of the gate potential of the FETS mn21 and mn22 is fine by ΔI. Accordingly, since the changes of the gate potential of the FETS mn25 and mn26 are fine, the drain currents In25 and In26 of the FETS mn25 and mn26 are obtained by the following in modify of the conditions (9) and (11):

$In25 = (½)I34 ± ΔI$, and

In26 is the difference or addition of "(½)I34" and "ΔI". Furthermore, since there are "Ip29>In25" and "Ip30>In26", the outputs of the first and second class-C amplifier means 3a and 3b (the drain potentials of the FETS mn25 and mn26) increase and the voltages between gates and sources of the FETS mp31 and mp32 decrease. Under this conditions, since the FETS are turned OFF, the output current of the first and second voltage-current conversion means 4a and 4b are zero. Accordingly, the current flowing in the FETS mp27 and mp28 are only the bias currents I1 and I2, so that the power consumption does not increase because the output current drive capability does not increase unnecessarily. Even though the constitution is not shown in the figure, it is possible to modify to the amplifier circuit into type of the positive feedback.

Figure 59:
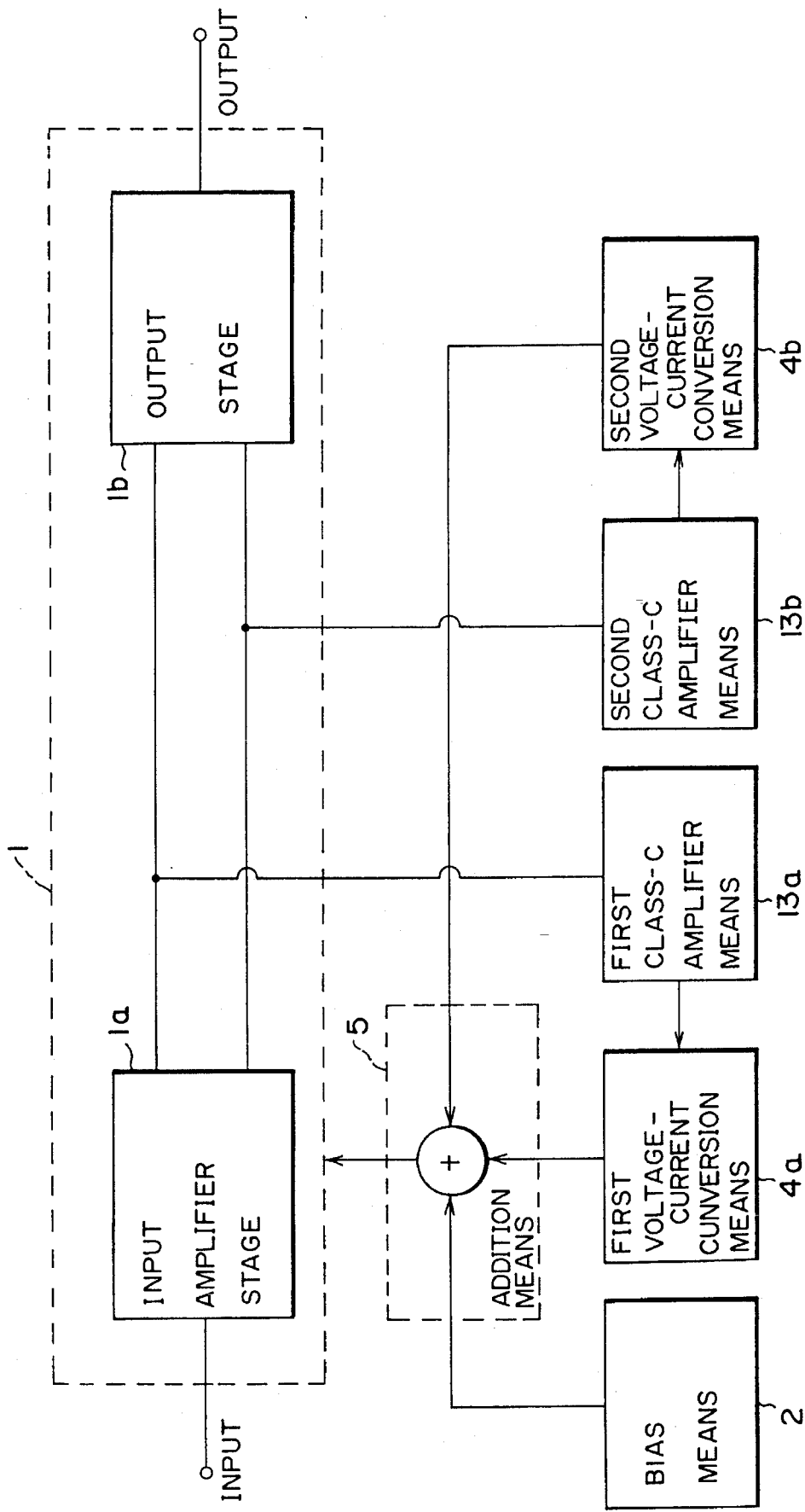
FIG. 59 is a block diagram showing a conceptional construction of an amplifier device according to an eleventh embodiment of the present invention.

FIG. 59 shows a block diagram of a conceptual construction of an eleventh embodiment of the present invention.

As shown in FIG. 59, an amplifier device according to the eleventh embodiment comprises first class-C amplifier means 13a for amplifying one of the differential inputs, first voltage-current conversion means 4a for converting an amplified voltage output from the first class-C amplifier means 13a into a first converted current, second class-C amplifier means 13b for amplifying the other differential input, second voltage-current conversion means 4b for converting an amplified voltage from the second class-C amplifier means into a second converted current, first bias means for outputting a bias current, and current addition means for adding three current one another of the first and second converted currents and the bias current which are output from the first and second voltage-current conversion means 4a and 4b and the first bias means 2.

Figure 60:
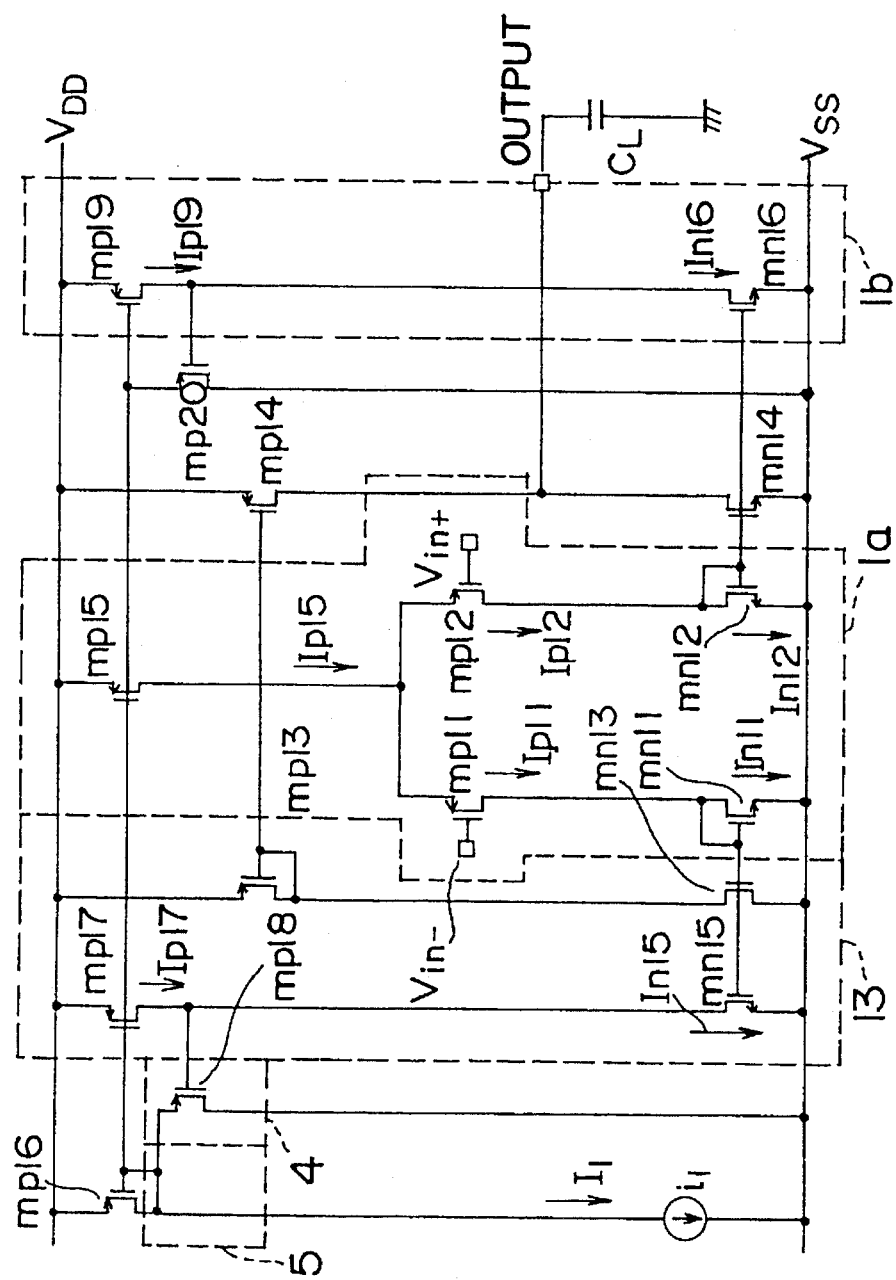
FIG. 60 is a circuit diagram showing a first example of the amplifier device according to the eleventh embodiment of this invention as shown in FIG. 59.

FIG. 60 shows a circuitry of a first example of the eleventh embodiment shown in FIG. 59.

In FIG. 60, FETS mp11–mp16 and mn11–mn14 correspond to an amplifier circuit means 1 as the conventional circuit. In this amplifier circuit means 1, the FETS mp11, mp12, mp15, mp16, mn11 and mn12 constitute an input amplifier stage 1a of the differential inputs, while the FETS mp13, mp14, mn13 and mn14 constitute an output stage 1b. A current source i1 corresponds to a bias circuit 2. A slew rate constituted by only the conventional circuit is determined by the capacitive load and maximum output current which is determined by the bias current I1 supplied from the current source i1 constituting the bias circuit 2.

In the first example, the FETS mp17 and mn15 correspond to the first class-C amplifier means 13 and the output voltage of which is converted into the current by the FET mp18 constituting the first voltage-current conversion means 4a to supply to the current addition means 5. The FETS mp19 and mn16 correspond to the second class-C amplifier means 13b which amplifies the other differential input to supply to the second conversion means 4b comprised of the FET mp20. Here, the ratio of the channel width and channel length of the FETS mp15, mp17, mp19, mn11, mn12, mn15 and mn16 is set to satisfy the following conditions:

(drain current of mp15)>(drain current of mp17) >½(drain current of mp15)   (13)

(drain current of mp15)>(drain current of mp19) >½(drain current of mp15)   (14)

(W/L)mn11=(W/L)mn12=(W/L)mn15=(W/L)mn16   (15)

There will be described a circuit operation of a first example shown in FIG. 60 of the eleventh embodiment of FIG. 59.

When the difference between Vin+ and Vin− becomes larger than the predetermined value because the level change of the input differential signal causes Vin+ to be larger than Vin−, the majority of the current Ip15 supplied from the FET mp15 becomes the current Ip12 flowing in the FET mp12 of the differential pair constituting the input amplifier stage 1a, thereby raising the drain potential of the FET mn12 as the output of the first amplifier stage 1a. Accordingly, since the gate potential of the FET mn16 as the first class-C amplifier means 13a increases and the drain current of the FET mn16 becomes larger than the current Ip19 supplied from FET mp19, the drain potential of the FET mn15 as the output of the first class-C amplifier means 13a falls down because of the above-mentioned conditions (14) and (15).

Since the output of the first class-C amplifier means 13a decreases, the gate-source voltage of the FET mp20 constituting the first voltage current conversion means 4a becomes larger, and source current of the FET mp20 (an output current converted from the voltage) which is to add with the bias current i1 becomes larger. By this, since the increase of the current flowing in the FET mp16 makes the output drive capability higher, thereby obtaining a high slew rate.

When the difference between Vin− and Vin+ becomes larger than the predetermined value because the input signal level change makes Vin− larger than Vin+, the current flowing in the FET mp16 also becomes larger to raise the output current drive capability to obtain the high slew rate.

Furthermore, when the an absolute value of the difference between Vin− and Vin+ is smaller than the predetermined value because the differential input signal level change is small, substantial halves of the current supplied from the FET mp15 become the currents Ip11 and Ip12 flowing in the FETS mp11 and mp12. Namely, $$Ip11 = (½)Ip15 \pm \Delta I$$

where Ip12 is the difference between (½)Ip15 and ΔI (or the addition thereof), and ΔI is very small current in comparison with Ip15. The change of the drain potentials of the FETS mn11 and mn12 is fine. Accordingly, since the gate potentials of the FETS mn15 and mn18 change fine, the drain currents In15 and In18 of the FETS mn15 and mn18 are obtained by the above-mentioned conditions (12) to (15) as follows:

$$In15 = (½)Ip15 \pm \Delta I$$

where the current In16 is the difference between (½)Ip15 and ΔI (or the addition thereof). Furthermore, since there are "Ip17>In15" and "Ip19>In15", the outputs of the first and second class-C amplifier means 13a and 13b (the drain potentials of the FET mn16 and mn15) increase, thereby decreasing the voltage between the gate and source electrodes of the FETS mp18 and mp20. Since the FETS are turned OFF, the output currents of the first and second voltage-current conversion means 4a and 4b are zero. Accordingly, only the bias current I1 flows in the FET mp16, so that the output current drive capability is not unnecessarily increased and the power consumption does not increase.

As has been described in the first example by using FIG. 47, the circuit shown in FIG. 60 may also be modified to a circuit of a second example shown in FIG. 61. The relationship of FIGS. 60 and 61 corresponds to that of FIGS. 47 and 48. In FIG. 61, the circuit is configured in that the drain current of the FET mp18 constituting the first voltage-current conversion means 4a is added with the output of the amplifier circuit means 1.

The eleventh embodiment may comprise a circuit of a third example as shown in FIG. 62 for increasing a circuit gain. In FIG. 62, the FETS mn17 and mn18 and the phase compensation capacitance $C_F$ are added to form the well-known and conventional positive feedback amplifier. The third example has the same effect as the first and second examples of the eleventh embodiment.

Figure 63:
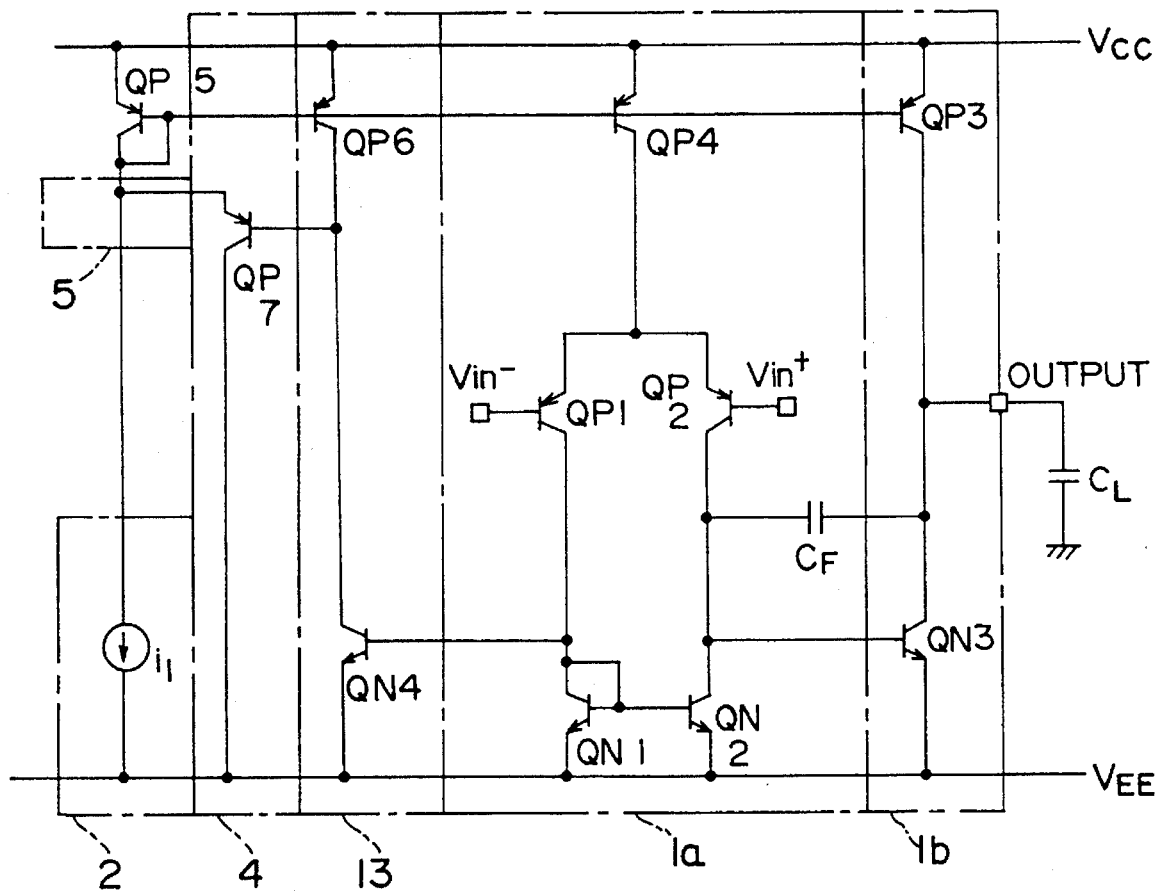
FIG. 63 is a circuit diagram showing a ninth example of the amplifier device according to the seventh and eighth embodiments of this invention as shown in FIGS. 41 and 42.

As has been described by using the FETS, the present invention is not limited in the FET and it possible to realize the present invention by using a bipolar transistor. For example, FIG. 63 shows an example in which a circuit is constituted from the bipolar transistors having the substantially the same configuration as the first example of the seventh and eighth embodiments shown in FIG. 47. The above-mentioned other circuitries shown in FIGS. 48–62 may be modified by the use of the bipolar transistors in place of the FETS.

Next, there will be described an amplifier device according to a twelfth embodiment and its actual example of the present invention with reference to FIGS. 64 and 65.

Figure 64:
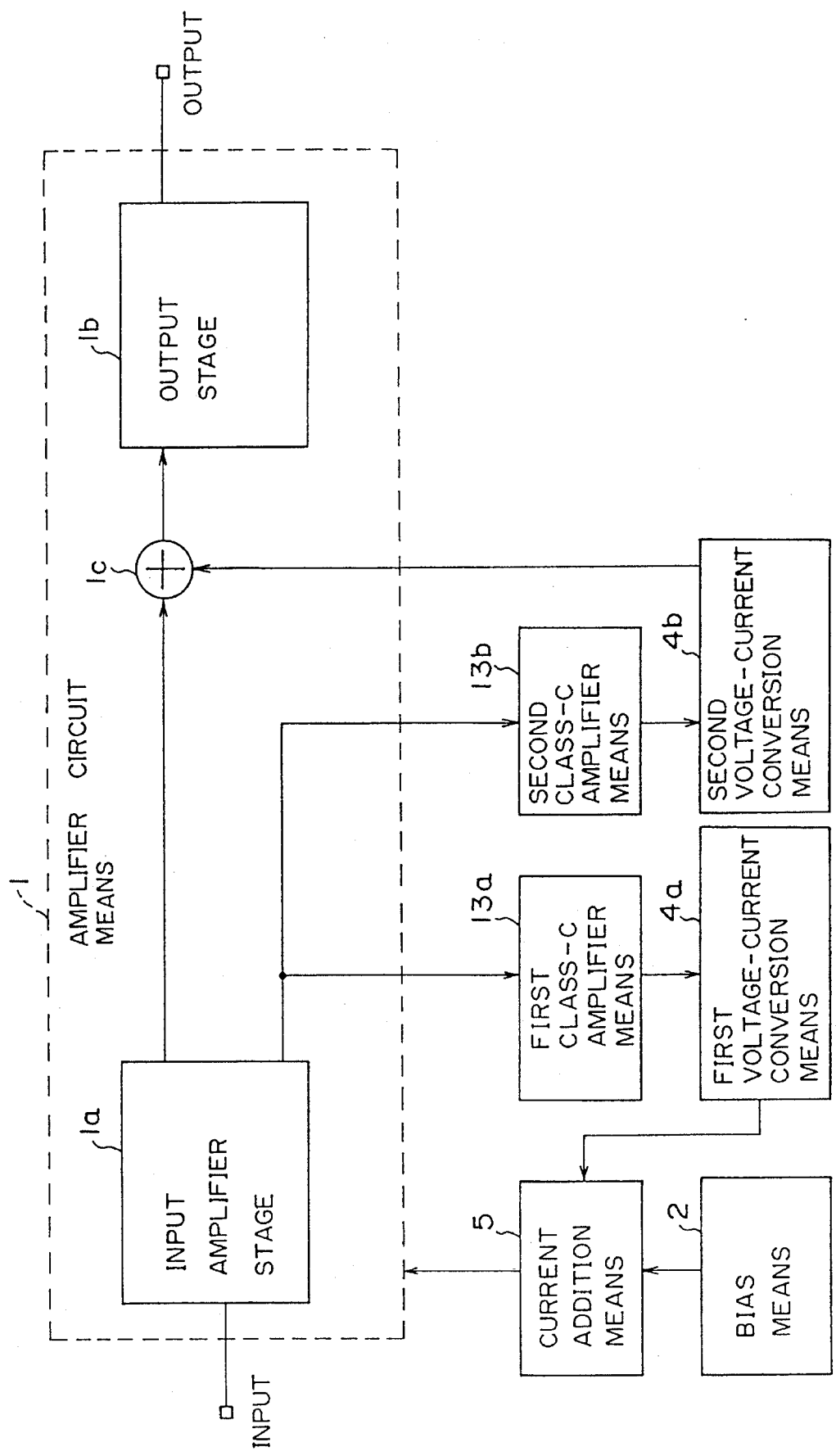
FIG. 64 is a block diagram showing a conceptional construction of an amplifier device according to a twelfth embodiments of the present invention.

FIG. 64 is a block diagram showing a basic conception of the tenth embodiment. In FIG. 64, an amplifier circuit means 1 comprises an input amplifier stage 1a having differential outputs, an output stage 1b, and a second and internal addition means 1c which is provided at the output side of the input amplifier stage 1a. The device comprises first class-C amplifier means 13a for performing the class-C amplification for one of the differential outputs to output a voltage, first voltage-current conversion means 4a for converting the voltage output from the first class-C amplifier means 13a into a first converted current, first and external current addition means 5 for adding the first converted current output from the first voltage-current conversion means 4a with a bias current from the bias means 2, second class-C amplifier means 13b for performing the class-C amplification for the one of the differential outputs to output a voltage, and second voltage-current conversion means 4b for converting the voltage output from the second voltage-current conversion means 4b into a second converted current to output it to the second addition means 1c in the amplifier circuit means 1. The second addition means 1c adds the second converted current output from the second voltage-current conversion means 4b with a current of the other differential current from the input amplifier stage 1a to output the addition current to the output stage 1b.

In this construction, the output current signal drive capability is divided into two systems which are for a rising output signal and a trailing output signal, for example, the first class-C amplifier means 13a, the first voltage-current conversion means 4a, and the first current addition means 5 are provided for the rising output signal, and the second class-C amplifier means 13b, the second voltage-current conversion means 4b, and the second and internal addition means 1c are provided for the trailing output signal. Therefore, it is possible to improve the unnecessary power consumption when the output current drive capability is improved.

Figure 65:
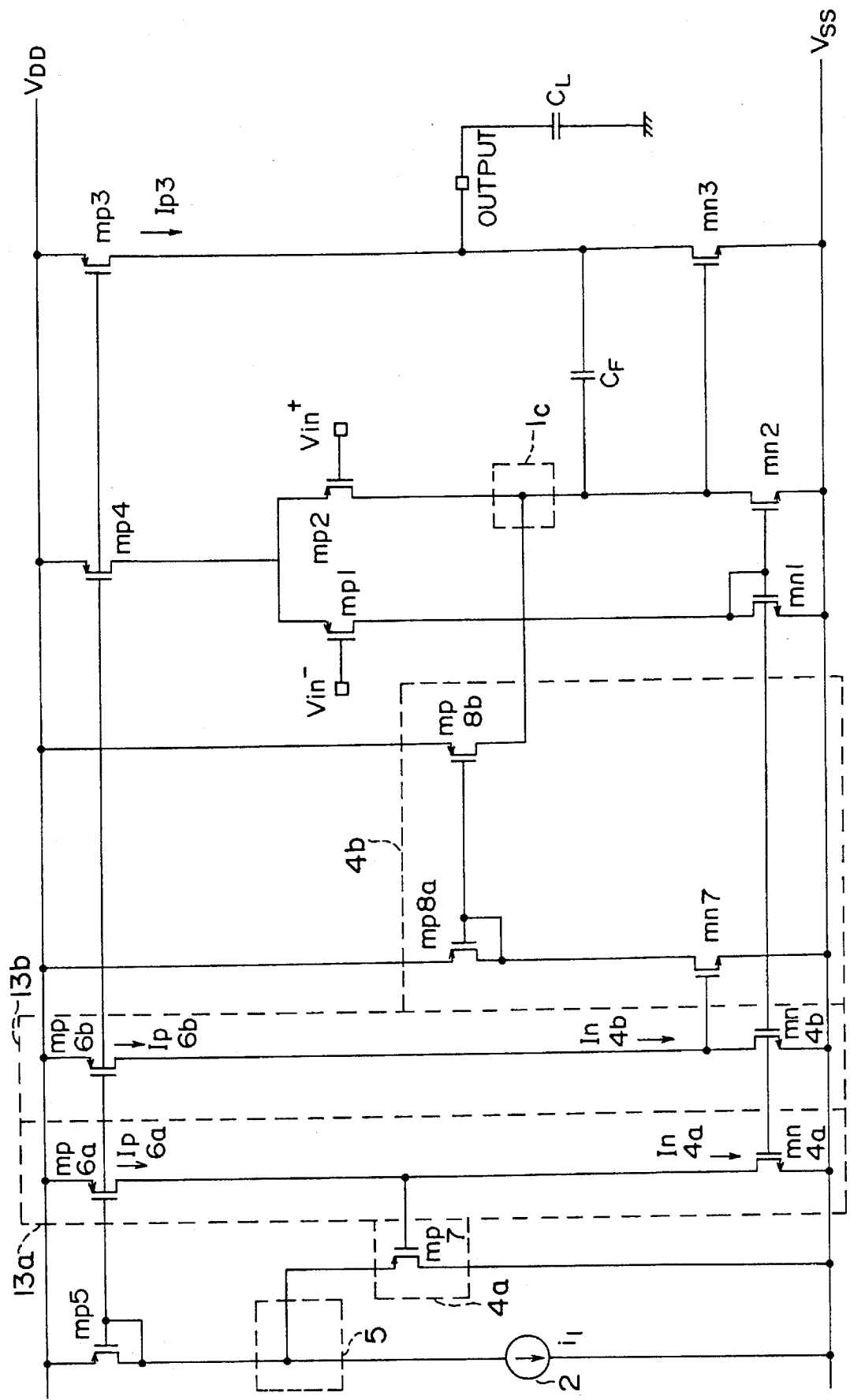
FIG. 65 is a circuit diagram showing an actual example of the amplifier device according to the twelfth embodiment of the present invention as shown in FIGS. 64.

FIG. 65 shows a circuitry according to an actual example of the twelfth embodiment shown in FIG. 64.

In FIG. 65, the FETS mp1–mp5 and mn1–mn3 and the capacitor $C_F$ correspond to the amplifier circuit means 1 which is the conventional two stage operation amplifier. In the amplifier circuit means 1, the FETS mp1, mp2, mp5, mn1 and mn2 constitute the first amplifier stage (the first input amplifier stage 1a) of the differential inputs, the FETS mp3, mp5 and mn3 and the capacitor $C_F$ constitute the second amplifier stage (output stage 1b) of the source grounded type. Here, the capacitor $C_F$ is a phase compensation capacitance and the capacitor $C_L$ is a capacitive load. The current source i1 corresponds to the bias circuit 2. The FETS mp6a and mn4a constitute the first class-C amplifier means 13a, the FET mp7 constitutes the first voltage-current conversion means 4a, and a connection point 5 corresponds to the first current addition means.

Furthermore, the FETS mp6b and mn4b constitute the second class-C amplifier means 13b, the FETS mn7, mp8a and mp8b constitute the second voltage-current conversion means 4b, and a connection point 1c corresponds to the second addition means 1c.

In FIG. 65, the FETS mp6a and mn4a perform the class-C amplification as the means 13a to use the drain electrode of the FET mn4a as the output terminal to output a drain voltage to the FET mp7. The FET mp7 as the first voltage-current conversion means 4a converts the drain voltage of the FET mn4a into a current to output it to the amplifier circuit means 1 after adding the bias current of the first current source i1.

Furthermore, the FETS mp6b and mn4b perform the class-C amplification as the means 13b to use the drain electrode of the FET mn4b as the output terminal to output a drain voltage to the FETS mn7, mp8a and mp8b. The FET mn7, mp8a and mp8b as the second voltage-current conversion means 4b converts the drain voltage of the FET mn4b into a current to supply it to drain electrode of the FET mn2 as the output of the first amplifier stage 1a.

Here, the ratio of the channel width and channel length of the FETS mp6a, mp6b, mn4a, mn4b and mp4 are respectively set to satisfy the following conditions:

(drain current of mp4)>(drain current of mp6a)> ½(drain current of mp4)

(drain current of mp6b)<½(drain current of mp4)

(W/L)mn1=(W/L)mn2=(W/L)mn4a=(W/L)mn4b

When the difference between Vin+ and Vin− becomes larger than the predetermined value by changing the differential input signal level to cause Vin+ to be larger than Vin− (for example, the relationship under In4a> Ip6a), a majority of the current Ip4 supplied from the FET mp4 becomes the current Ip1 flowing toward the FET mp1 side of the differential pair constituting the input amplifier stage 1a (Ip1≐Ip4), thereby increasing the drain potential of the FET mn1 as the first output of the input amplifier stage 1a. Accordingly, since the gate potential of the FET mn4a increases as the input of the first class-C amplifier means 13a and the drain current In4a of the FET mn4a becomes larger than the current Ip6a supplied from the FET mp6a, the drain potential of the FET mn4a as the output of the first class-C amplifier means 13a decreases. Because there are "In4a>Ip6a" and "In4a=In1=Ip1" from the above conditions.

Since the output of the first class-C amplifier means 13a decreases, the voltage between the gate and source of the FET mp7 constituting the first voltage-current conversion means 4a becomes larger, the source current of the FET mp7 which is converted from the voltage into the current and added to the bias current I1 becomes larger. By this, since the current flowing in the FE T mp5 becomes larger, the operation current of the second amplifier stage supplied from the FET mp3 becomes larger. Accordingly, the differential input signal level changes, and it is possible to improve the output current drive capability of the amplifier means 1 and to obtain a high slew rate at rising the output.

Furthermore, when the difference between Vin− and Vin+ becomes larger than the predetermined value by changing the differential input signal level to cause Vin− to be larger than Vin+ (for example, there is the relationship of "In4b<ip6b"), a majority of the current Ip4 supplied from the FET mp4 becomes the current Ip2 flowing toward the FET mp2 side (Ip2≐Ip4) of the differential pair constituting the input amplifier stage 1a, thereby decreasing the drain voltage of the FET mn1 as the first output of the input amplifier stage 1a. Accordingly, the gate potential of the FET mn4b as the input of the second class-C amplifier means 13b also decreases and the drain current of the FET mn4b becomes smaller than the current Ip6b supplied from the FET mp6b, thereby increasing the drain potential of the FET mn4b as the output of the second class-C amplifier means 13b. Because there are conditions of "In4b<Ip6a" and "In4b≐0" from the above-mentioned conditions.

Since the output of the second class-C amplifier means 13b increases, the voltage between the gate and source of the FET mn7 constituting the second voltage-current conversion means 4b also increases, so that the converted current becomes larger. The current is added with the output current supplied from the second output of the first amplifier stage through the current mirror of the FETS mp8a and mp8b.

As has been described in the first example shown in FIG. 46 of the seventh embodiment, in this amplifier circuit means 1, the slew rate at trailing depends upon only the time constant which is determined by the maximum output current (namely, the operation current) of the first amplifier stage and the phase compensation capacitor $C_F$. Accordingly, when the output trails under the condition the difference between Vin− and Vin+ becomes larger than the predetermined value by changing the differential input signal level to cause Vin− to be larger than Vin+, the operation current (Ip3) of the second amplifier stage does not increase unnecessarily, thereby realizing a high slew rate effectively.

Furthermore, when the difference between Vin+ and Vin− in the differential input signal level is smaller than the predetermined value, a substantial half of the current Ip4 supplied from the FET mp4 becomes the current Ip1 flowing toward the FET mp1 side {Ip1≈(½)Ip4}, thereby resulting that the drain potential of the FET mn1 is fine to be increased. Accordingly, since the gate potentials of the FETS mn4a and mn4b change little, the drain current In4a of the FET mn4a is "In4a=In4b=In1≈Ip1−(½)Ip4", and the there are "Ip6a>In4a" and "ip6b<In4b" from the above-mentioned conditions, the output of the first class-C amplifier means 13a increases, and the gate and source voltages of the FET mp7 become smaller. Since the FET mp7 is turned OFF and the output of the second class-C amplifier means 13b decreases to turn OFF the FET mn7, both the output currents of the first and second voltage-current conversion means 4a and 4b become zero. Accordingly, since the current flowing in the FET mp5 is only the bias current I1 and the current from the second voltage-current conversion means 4b does not added with the output of the first amplifier stage, the operation current of the second amplifier stage supplied from the FET mp3 maintains to be small, so that the power consumption does not increase.

What is claimed is:

1. An amplifier device capable of performing an efficient amplifying operation with a low power consumption, comprising:

amplifier circuit means at least having an input amplifier stage which amplifies a level change of an input signal, and an output stage which outputs an amplified current as a driving output to a capacitive load;

primary bias means for ordinarily supplying a main fixed bias current to said amplifier circuit means;

determination means for determining a change condition of said level change of the input signal, which is supplied from said input amplifier stage, so as to generate a control signal corresponding to said change condition; and driving capability increase means as secondary bias means for increasing a total bias current at least by supplying said total bias current to said input amplifier stage thereby changing an output issued from said input amplifier stage in order to increase said driving output supplied to said capacitive load when said control signal is input.

2. The amplifier device according to claim 1, wherein said primary bias means is comprised of a first bias circuit which is connected in parallel to said amplifier circuit means and ordinarily supplies said main fixed bias current to said amplifier circuit means; and said driving capability increase means is comprised of a second bias circuit which is connected in parallel to said first bias circuit and supplies a second bias current by an ON/OFF operation in order to change said total bias current as a whole.

3. The amplifier device according to claim 2, wherein said determination means includes an internal control signal generation means for detecting said level change of the output of said input amplifier stage and outputting an internal control signal has said control signal which causes said second bias circuit to output said second bias current only when said level change of the output of said input amplifier stage is determined to be large on the basis of a detection.

4. The amplifier device according to claim 3, wherein said second bias circuit controls an output value of the second bias current on the basis of not only said internal control signal output from said control signal generation means but also said change condition of the output from said input amplifier stage.

5. The amplifier device according to claim 3, wherein said internal control signal generation means includes a first control signal generation circuit connected to one output of said input amplifier stage and a second control signal generation circuit connected to another output of said input amplifier stage and said second bias circuit includes a first secondary bias circuit connected to said first control signal generation circuit and a second secondary bias circuit connected to said second control signal generation circuit for controlling at rising and trailing of said input signal.

6. The amplifier device according to claim 5, wherein an addition means is further included inside said amplifier circuit means and on an output side of said input amplifier stage in addition to said two sets of said internal control signal generation means and said second bias circuit, thereby adding an output of one of said second bias circuit with an output from said input amplifier stage.

7. The amplifier device according to claim 1, wherein said determination means comprises class-C amplifier means for performing a class-C amplification with respect to the output of said input amplifier stage and for amplifying said level change of the input signal to output an amplified voltage and said driving capability increase means comprises voltage-current conversion means for converting said amplified voltage into a converted current to be output; and current addition means for adding said converted current to said primary bias current, thereby to supply an added current to said amplifier circuit means.

8. The amplifier device according to claim 7, wherein said amplifier circuit means further comprises internal bias means which receives said added current from said current addition means and supplies said added current as a whole bias.

9. The amplifier device according to claim 8, wherein said internal bias means is comprised of a first internal bias means and a second internal bias means; and said primary bias means includes a first bias means connected to said first internal bias means and a second bias means connected to said second internal bias means, said class-C amplifier means includes a first and a second class-C amplifier means both connected to said output of said input amplifier stage, and said voltage-current conversion means includes a first voltage-current conversion means connected between said first class-C amplifier means and said first internal bias means and a second voltage-current conversion means connected between said second class-C amplifier means and said second internal bias means for controlling said input signal at rising and trailing.

10. The amplifier device according to claim 7, wherein said voltage-current conversion means is comprised of a first and a second voltage-current conversion means;

said first voltage-current conversion means has a function the same as said voltage-current conversion means;

said second voltage-current conversion means converts said amplified voltage from said class-C amplifier means into current and supplies it to external adder means; and said external adder means adds said converted current output from said second voltage-current conversion means with said amplified current output from said amplifier circuit means to supply to said capacitive load.

11. The amplifier device according to claim 7, further comprising a limit circuit for limiting a maximum current output from said voltage-current conversion for suppressing a maximum instantaneous current.

12. The amplifier device according to claim 7, further comprising an amplitude of a maximum output voltage from said class-C amplifier means for suppressing a maximum instantaneous current as a result, 13. The amplifier device according to claim 7, wherein the class-C amplifier means comprises a first class-C amplifier means for performing a class-C amplification with respect to one differential output of said input amplifier stage to generate a first amplified voltage and a second class-C amplifier means for performing a class-C amplification with respect to another differential output of said input amplifier stage to generate a second amplified voltage;

wherein the voltage-current conversion means comprises a first voltage-current conversion means for converting said first amplified voltage into a first converted current and a second voltage-current conversion means for converting said second amplified voltage into a second converted current; and wherein the amplifier device further comprises current addition means for adding said main fixed bias current and said first and second converted currents to one another, which are respectively output from said primary bias means and said first and second voltage-current conversion means, thereby supplying the total bias current.

14. The amplifier device according to claim 7, further comprising another class-C amplifier means for amplifying one of differential outputs from said input amplifier stage to output another amplified voltage, and another voltage-current conversion means for converting said another amplified voltage into another converted current; and wherein said amplifier circuit means further comprises internal adder means which receives another one of differential outputs from said input amplifier stage and said another converted current from said another voltage-current conversion means and adds both to output to said output stage.

* * * * *